US 11,764,541 B2

(12) United States Patent
Miura et al.

(10) Patent No.: US 11,764,541 B2
(45) Date of Patent: Sep. 19, 2023

(54) LASER SYSTEM AND METHOD FOR MANUFACTURING ELECTRONIC DEVICE

(71) Applicant: Gigaphoton Inc., Tochigi (JP)

(72) Inventors: Taisuke Miura, Oyama (JP); Osamu Wakabayashi, Oyama (JP); Hironori Igarashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 364 days.

(21) Appl. No.: 17/220,270

(22) Filed: Apr. 1, 2021

(65) Prior Publication Data

US 2021/0226414 A1      Jul. 22, 2021

Related U.S. Application Data

(63) Continuation of application No. PCT/JP2018/041530, filed on Nov. 8, 2018.

(51) Int. Cl.
*H01S 3/23* (2006.01)
*H01S 5/00* (2006.01)
(Continued)

(52) U.S. Cl.
CPC ........ *H01S 5/0428* (2013.01); *G03F 7/70041* (2013.01); *G03F 7/70575* (2013.01);
(Continued)

(58) Field of Classification Search
CPC .... H01S 3/2308; H01S 3/2375; H01S 5/0092; H01S 5/0687; H01S 5/12; H01S 5/509;
(Continued)

(56) References Cited

U.S. PATENT DOCUMENTS

| 9,929,529 B2 * | 3/2018 | Onose ................. H01S 3/10015 |
| 2004/0012844 A1 | 1/2004 | Ohtsuki et al. |

(Continued)

FOREIGN PATENT DOCUMENTS

| CN | 108028506 A | 5/2018 |
| CN | 108352673 A | 7/2018 |

(Continued)

OTHER PUBLICATIONS

An Office Action mailed by China National Intellectual Property Administration dated Apr. 6, 2023, which corresponds to Chinese Patent Application No. 201880098238.9 and is related to U.S. Appl. No. 17/220,270; with English language translation.

(Continued)

*Primary Examiner* — Michael Carter
(74) *Attorney, Agent, or Firm* — Studebaker & Brackett PC

(57) ABSTRACT

In a laser system according to a viewpoint of the present disclosure, a first amplifier amplifies first pulsed laser light outputted from a first semiconductor laser system into second pulsed laser light, a wavelength conversion system converts the second pulsed laser light in terms of wavelength into third pulsed laser light, and an excimer amplifier amplifies the third pulsed laser light. The first semiconductor laser system includes a first current controller that controls current flowing through a first semiconductor laser in such a way that first laser light outputted from the first semiconductor laser is caused to undergo chirping and a first semiconductor optical amplifier that amplifies the first laser light into pulsed light. The laser system includes a control section that controls the amount of chirping performed on the first pulsed laser light in such a way that excimer laser light having a target spectral linewidth is achieved.

20 Claims, 62 Drawing Sheets

(51) Int. Cl.
  *H01S 5/042* (2006.01)
  *H01S 5/068* (2006.01)
  *H01S 5/50* (2006.01)
  *H01S 5/0687* (2006.01)
  *G03F 7/00* (2006.01)
  *H01S 5/12* (2021.01)

(52) U.S. Cl.
  CPC .......... *H01S 3/2308* (2013.01); *H01S 3/2375* (2013.01); *H01S 5/0092* (2013.01); *H01S 5/0687* (2013.01); *H01S 5/06808* (2013.01); *H01S 5/509* (2013.01); *H01S 5/12* (2013.01); *H01S 2301/163* (2013.01)

(58) Field of Classification Search
  CPC .......... H01S 2301/163; G03F 7/70041; G03F 7/70575
  See application file for complete search history.

(56) References Cited

U.S. PATENT DOCUMENTS

| | | |
|---|---|---|
| 2008/0181262 A1 | 7/2008 | Wakabayashi et al. |
| 2008/0285602 A1 | 11/2008 | Nagai et al. |
| 2013/0230064 A1 | 9/2013 | Tanaka et al. |
| 2017/0338617 A1 | 11/2017 | Zhao et al. |
| 2017/0373461 A1 | 12/2017 | Nogiwa et al. |
| 2018/0196330 A1* | 7/2018 | Kobayashi .............. H01S 3/067 |
| 2018/0196347 A1* | 7/2018 | Minegishi ........... G03F 7/70483 |
| 2018/0254600 A1* | 9/2018 | Kumazaki ............... H01S 3/034 |
| 2019/0006817 A1* | 1/2019 | Onose .................. H01S 3/0085 |

FOREIGN PATENT DOCUMENTS

| | | |
|---|---|---|
| JP | H08-006078 A | 1/1996 |
| JP | 2008-016544 A | 1/2008 |
| JP | 2011-171521 A | 9/2011 |
| JP | 2011-249399 A | 12/2011 |
| JP | 2013-179247 A | 9/2013 |
| WO | 2006006499 A1 | 1/2006 |
| WO | 2017064789 A1 | 4/2017 |
| WO | 2017068619 A1 | 4/2017 |
| WO | 2017098625 A1 | 6/2017 |
| WO | 2017175561 A1 | 10/2017 |

OTHER PUBLICATIONS

International Search Report issued in PCT/JP2018/041530; dated Jan. 29, 2019.

International Preliminary Report on Patentability and Written Opinion issued in PCT/JP2018/041530; dated May 11, 2021.

* cited by examiner

LASER SYSTEM AND METHOD FOR MANUFACTURING ELECTRONIC DEVICE

CROSS-REFERENCE TO RELATED APPLICATIONS

The present application is a continuation application of International Application No. PCT/JP2018/041530, filed on Nov. 8, 2018, the entire contents of which are hereby incorporated by reference.

BACKGROUND

1. Technical Field

The present disclosure relates to a laser system and a method for manufacturing an electronic device.

2. Related Art

Improvement in resolution of semiconductor exposure apparatuses has been desired due to miniaturization and high integration of semiconductor integrated circuits. The semiconductor exposure apparatus is hereinafter referred simply to as an "exposure apparatus." To this end, reduction in the wavelength of the light outputted from a light source for exposure is underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193 nm, are used as the gas laser apparatus for exposure.

As a current exposure technology, liquid-immersion exposure, in which the gap between a projection lens of the exposure apparatus and a wafer is filled with a liquid, has been put into use. In the liquid-immersion exposure, since the refractive index of the gap between the projection lens and the wafer changes, the apparent wavelength of the light from the light source for exposure shortens. In the liquid-immersion exposure with an ArF excimer laser apparatus as the light source for exposure, the wafer is irradiated with ultraviolet light having an in-water wavelength of 134 nm. The technology described above is called ArF liquid-immersion exposure. The ArF liquid-immersion exposure is also called ArF liquid-immersion lithography.

Since the KrF and ArF excimer laser apparatuses each have a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light outputted from the gas laser apparatus needs to be narrow enough to make the chromatic aberrations negligible. The spectral linewidth is also called a spectral width. To this end, a line narrow module including a line narrowing element is provided in a laser resonator of the gas laser apparatus, and the line narrowing module narrows the spectral width. The line narrowing element may, for example, be an etalon or a grating. A laser apparatus having a narrowed spectral width described above is called a narrowed-line laser apparatus.

CITATION LIST

Patent Literature

[PTL 1] US Patent Application Publication No. 2017/0338617
[PTL 2] JP-A-8-6078
[PTL 3] US Patent Application Publication No. 2004/0012844
[PTL 4] US Patent Application Publication No. 2017/0037346
[PTL 5] WO 2017/175561
[PTL 6] JP-A-2011-249399

SUMMARY

A laser system according to a viewpoint of the present disclosure includes a first semiconductor laser system configured to output first pulsed laser light and including a first semiconductor laser configured to oscillate in a single longitudinal mode, a first current controller configured to control current caused to flow through the first semiconductor laser in such a way that first laser light outputted from the first semiconductor laser is caused to undergo chirping, and a first semiconductor optical amplifier configured to amplify the first laser light into first pulsed laser light; a first amplifier configured to amplify the first pulsed laser light amplified by the first semiconductor optical amplifier and outputted from the first semiconductor laser system; a wavelength conversion system configured to convert in terms of a wavelength second pulsed laser light amplified by the first amplifier into third pulsed laser light of ultraviolet light; an excimer amplifier configured to amplify the third pulsed laser light; and a control section configured to control an amount of chirping performed on the first pulsed laser light outputted from the first semiconductor laser system in such a way that excimer laser light having a target spectral linewidth instructed by an external apparatus is achieved.

A method for manufacturing an electronic device according to another viewpoint of the present disclosure includes causing a laser system to generate excimer laser light, the laser system including a first semiconductor laser system including a first semiconductor laser configured to oscillate in a single longitudinal mode, a first current controller configured to control current caused to flow through the first semiconductor laser in such a way that first laser light outputted from the first semiconductor laser is caused to undergo chirping, and a first semiconductor optical amplifier configured to amplify the first laser light into first pulsed laser light, a first amplifier configured to amplify the first pulsed laser light amplified by the first semiconductor optical amplifier and outputted from the first semiconductor laser system, a wavelength conversion system configured to convert in terms of a wavelength second pulsed laser light amplified by the first amplifier into third pulsed laser light of ultraviolet light, an excimer amplifier configured to amplify the third pulsed laser light, and a control section configured to control an amount of chirping performed on the first pulsed laser light outputted from the first semiconductor laser system in such a way that excimer laser light having a target spectral linewidth instructed by an external apparatus is achieved; outputting the excimer laser light to an exposure apparatus; and exposing a light sensitive substrate to the excimer laser light in the exposure apparatus to manufacture the electronic device.

BRIEF DESCRIPTION OF THE DRAWINGS

Embodiments of the present disclosure will be described below only by way of example with reference to the accompanying drawings.

DETAILED DESCRIPTION

Figure 1:
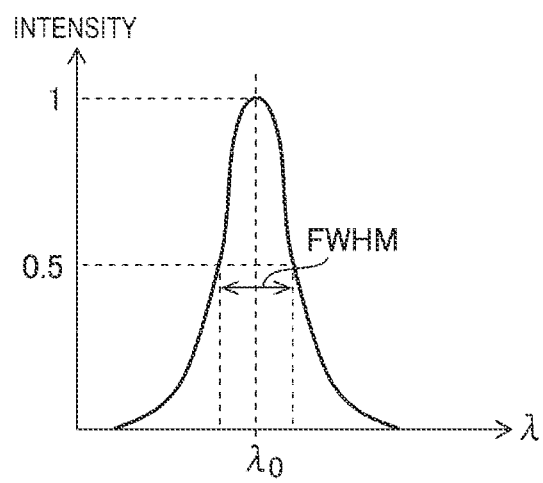
FIG. 1 shows the spectrum shape of typical laser light.

<Contents>
1. Description of terms
1.1 Definition of spectral linewidth $\Delta\lambda$ of excimer laser light
1.2 Definition of amount of chirping
2. Overview of laser system
2.1 Configuration
2.2 Operation
2.3 Example of processes carried out by laser control section
2.4 Example of processes carried out by solid-state laser system control section
2.5 Example of semiconductor laser system
2.5.1 Configuration
2.5.2 Operation
2.6 Example of processes carried out by first semiconductor laser control section
3. Problems
4. First Embodiment
4.1 Configuration
4.2 Operation
4.3 Operation of first semiconductor laser system
4.3.1 Others
4.4 Example of processes carried out by laser control section
4.5 Example of processes carried out by solid-state laser system control section
4.6 Example of processes carried out by first semiconductor laser control section
4.7 Effects and advantages
4.8 Variation 1
4.9 Variation 2
4.9.1 Configuration
4.9.2 Operation
5. Second Embodiment
5.1 Configuration
5.2 Operation
5.2.1 Example of processes carried out by solid-state laser system control section
5.2.2 Example of processes carried out by first semiconductor laser control section
5.2.3 Example 1 of control subroutine (3) of controlling first semiconductor laser
5.3 Effects and advantages
5.4 Variations
5.4.1 Example 2 of control subroutine (3) of controlling first semiconductor laser
5.4.2 Example 3 of control subroutine (3) of controlling first semiconductor laser
5.4.3 Example 4 of control subroutine (3) of controlling first semiconductor laser
6. Third Embodiment
6.1 Configuration
6.2 Operation
6.3 Effects and advantages
6.4 Variations
6.4.1 Use of semiconductor laser configured to oscillate in multiple longitudinal modes
6.4.2 Combination with configuration described in second embodiment 6.4.3 Chirping control using second solid-state laser apparatus
7. Specific example of spectrum monitors
7.1 Example of spectrum monitor using spectrometer and reference laser light source
7.1.1 Configuration
7.1.2 Operation
7.2 Example of spectrum monitor using heterodyne interferometer
7.2.1 Configuration
7.2.2 Operation
8. Example of excimer amplifier
8.1 Multi-path amplification form
8.2 Ring resonator amplification form
9. Example of spectrum monitor using etalon spectrometer
10. Example of CW oscillation reference laser light source
10.1 CW oscillation reference laser light source configured to emit light that belongs to 1547.2-nm wavelength region or 1554-nm wavelength region
10.2 CW oscillation reference laser light source configured to emit light that belongs to 1030-nm wavelength region
11. Example of semiconductor optical amplifiers
11.1 Configuration
11.2 Operation
12. Fourth Embodiment
12.1 Configuration
12.2 Operation
13. Fifth Embodiment
13.1 Configuration
13.2 Operation
13.3 Effects and advantages
14. Method for manufacturing electronic device
15. Other examples of external apparatus
16. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Terms 1.1 Definition of Spectral Linewidth $\Delta\lambda$ of Excimer Laser Light In the present specification, the linewidth corresponding to 95% of the overall area of the spectral width of excimer laser light is defined as the spectral linewidth $\Delta\lambda$ of the excimer laser light. In general, the spectral linewidth is the full width of the spectrum waveform of laser light at a light quantity threshold, as shown in FIG. 1. For example, one half of the peak value is called a linewidth threshold of 0.5. The full width W1/2 of the spectrum waveform at the linewidth threshold 0.5 is particularly called a full width at half maximum (FWHM). It is, however, difficult to reflect the resolution of a projection lens by using only the full width at half maximum of the spectrum of excimer laser light.

Figure 2:
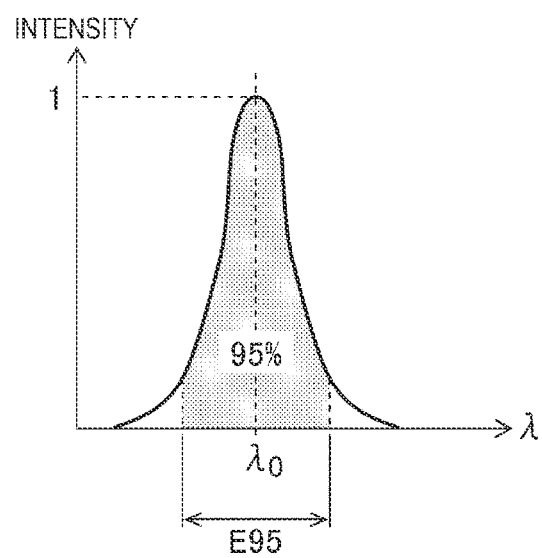
FIG. 2 describes the definition of a spectral linewidth of excimer laser light.

In view of the fact described above, the spectral linewidth $\Delta\lambda$ that reflects the resolution of the projection lens is a full width W 95%, which accounts for 95% of the overall spectral energy around a wavelength $\lambda 0$, for example, as shown in FIG. 2, and Expression (1) below is satisfied.

[Expression 1]

$$\frac{\int_{-\frac{\Delta\lambda}{2}}^{\frac{\Delta\lambda}{2}} g(\lambda + \lambda_0) d\lambda}{\int_{-\infty}^{\infty} g(\lambda + \lambda_0) d\lambda} = 0.95 \qquad (1)$$

In the present specification, the spectral linewidth $\Delta\lambda$ of excimer laser light may not only be the linewidth that accounts for 95% of the entire area of the spectral width but be a spectral linewidth that reflects the resolution of the projection lens. For example, the spectral linewidth may be evaluated by resolution calculated by inputting the wavelength and the optical intensity distribution based on data on a projection lens to be used and the spectrum waveform of the excimer laser light. In the present specification, the excimer laser light is called "excimer light" in some cases.

1.2 Definition of Amount of Chirping

Figure 3:
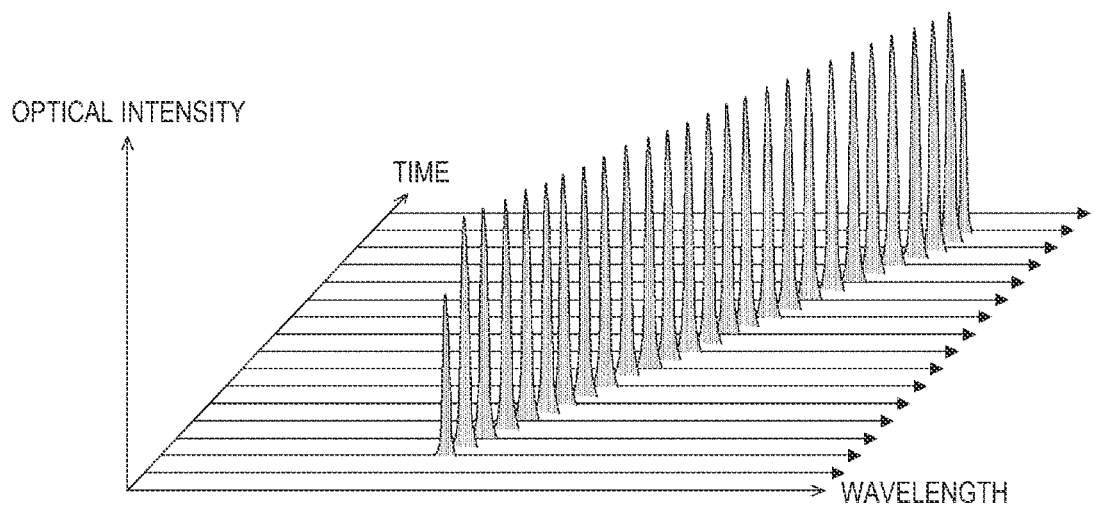
FIG. 3 shows an example of a spectrum waveform of pulsed laser light at each point of time.
Figure 4:
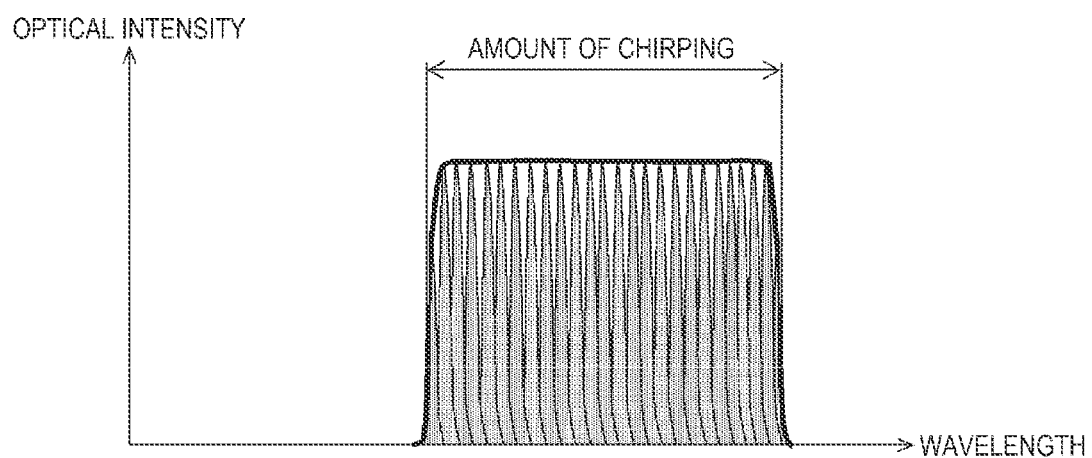
FIG. 4 describes the definition of the amount of chirping.

FIG. 3 shows an example of a spectrum waveform of pulsed laser light at each point of time. In the example, the spectral wavelength at each point of time chirps toward the longer wavelength over time. The term "chirping" is also called "wavelength chirping." FIG. 4 shows a spectrum waveform produced when each spectrum is integrated over a pulse period. The amount of chirping is defined in the description as a spectral linewidth calculated from the spectrum waveform having been integrated over the period. The amount of chirping is called "spectral linewidth resulting from chirping" in some cases.

2. Overview of Laser System 2.1 Configuration

Figure 5:
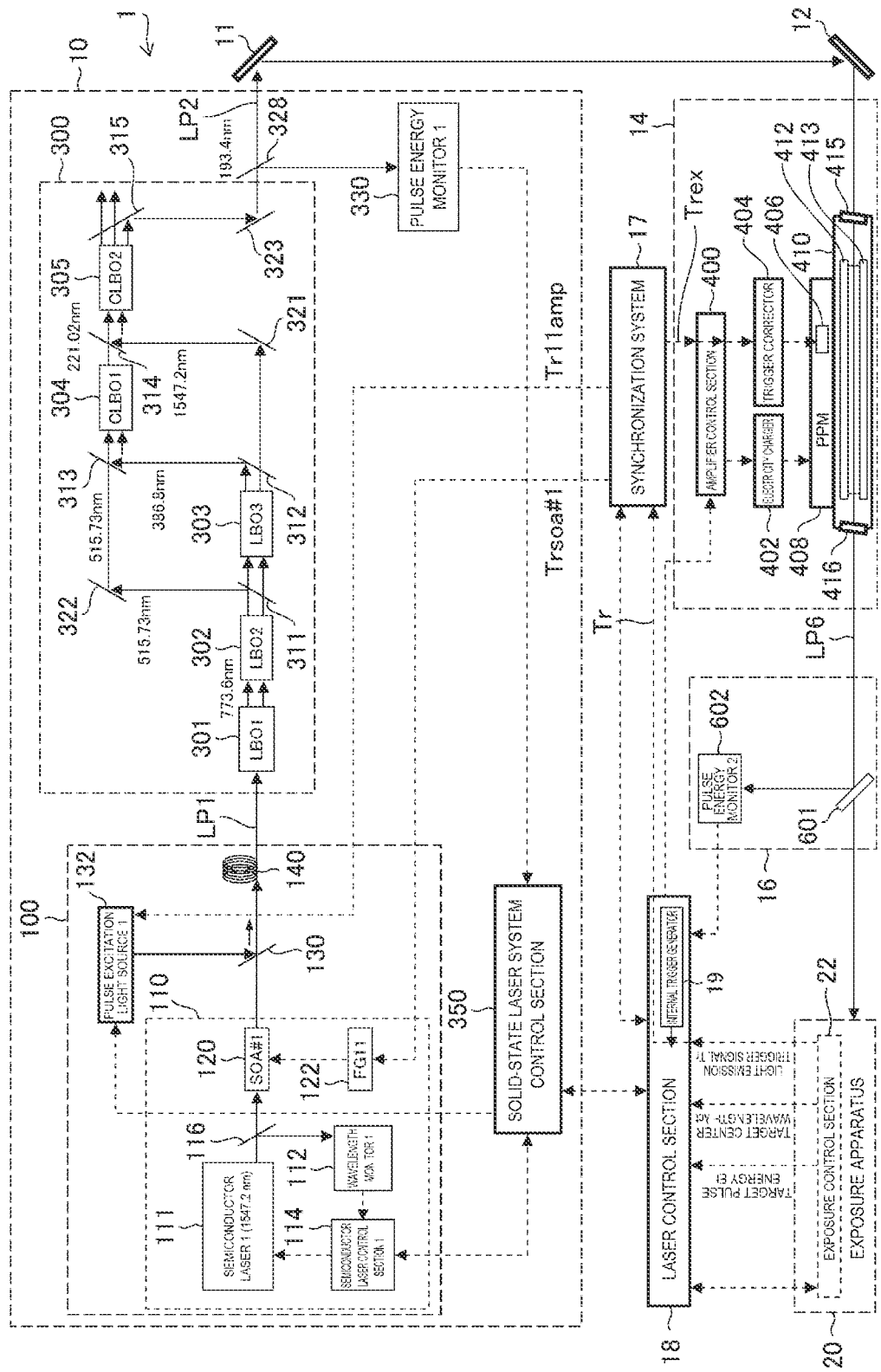
FIG. 5 schematically shows an example of the configuration of a laser system.

FIG. 5 schematically shows an example of the configuration of a laser system 1. The laser system 1 includes a solid-state laser system 10, a first high reflectance mirror 11, a second high reflectance mirror 12, an excimer amplifier 14, a monitor module 16, a synchronization system 17, and a laser control section 18.

The solid-state laser system 10 includes a first solid-state laser apparatus 100, a wavelength conversion system 300, a beam splitter 328, a first pulse energy monitor 330, and a solid-state laser system control section 350.

The first solid-state laser apparatus 100 includes a first semiconductor laser system 110, which outputs laser light having a wavelength of about 1547.2 nm, a first dichroic mirror 130, a first pulse excitation light source 132, and an Er fiber amplifier 140.

The first semiconductor laser system 110 includes a first semiconductor laser 111, a first wavelength monitor 112, a first semiconductor laser control section 114, a first beam splitter 116, a first semiconductor optical amplifier 120, and a function generator (FG) 122. FIG. 5 and the following figures show notations with numerals, for example, a "semiconductor laser 1" and an "SOA #1," which represent the first semiconductor laser and the first semiconductor optical amplifier (SOA), respectively. "SOA" is an abbreviated notation of a "semiconductor optical amplifier."

The first semiconductor laser 111 is configured to operate in continuous wave (CW) oscillation at about the wavelength of 1547.2 nm and oscillate in a single longitudinal mode. The term "CW" stands for a continuous wave, and the CW oscillation stands for continuous wave oscillation. The first semiconductor laser 111 may be a distributed feedback (DFB) semiconductor laser. A distributed feedback semiconductor laser is called a "DFB laser". A DFB laser is configured to be capable of changing the oscillation wavelength under current control and/or temperature control.

The first beam splitter 116 is so disposed as to reflect part of the laser light outputted from the first semiconductor laser 111 in such a way that the reflected laser light enters the first wavelength monitor 112. The first wavelength monitor 112 is configured to monitor the spectrum of the incident laser light and detect the oscillation wavelength at which the first semiconductor laser 111 oscillates.

The first semiconductor laser control section 114 is connected to the first wavelength monitor 112 and the solid-state laser system control section 350 and is configured to control the operation of the first semiconductor laser 111.

The first semiconductor optical amplifier 120 is disposed in the optical path of the laser light having passed through the first beam splitter 116. The first semiconductor optical amplifier 120 is configured to amplify the laser light outputted from the first semiconductor laser 111 into pulsed laser light.

The first dichroic mirror 130 is a mirror coated with a film configured to transmit at high transmittance the laser light outputted from the first semiconductor optical amplifier 120 and reflect at high reflectance excitation light outputted from the first pulse excitation light source 132. The first dichroic mirror 130 is so disposed that the pulsed laser light outputted from the first semiconductor optical amplifier 120 and the excitation light outputted from the first pulse excitation light source 132 enter the Er fiber amplifier 140.

The Er fiber amplifier 140 is an optical fiber amplifier using an optical fiber to which Er (erbium) has been doped.

The first pulse excitation light source 132 may be a semiconductor laser having a wavelength of about 980 nm, which the Er fiber amplifier 140 can excite. The pulsed laser light amplified by the Er fiber amplifier 140 enters the wavelength conversion system 300.

The wavelength conversion system 300 is configured to include a plurality of nonlinear crystals and convert in terms of wavelength fundamental wave light outputted from the first solid-state laser apparatus 100 and having the wavelength of about 1547.2 nm into an eightfold wave (eighth harmonic) light by using the plurality of nonlinear crystals to generate ultraviolet light having a wavelength of about 193.4 nm.

The wavelength conversion system 300 includes a first LBO crystal 301, a second LBO crystal 302, a third LBO crystal 303, a first CLBO crystal 304, a second CLBO crystal 305, dichroic mirrors 311, 312, 313, 314, and 315, and high reflectance mirrors 321, 322, and 323. The term "LBO" is expressed by a chemical formula $LiB_3O_5$. The term "CLBO" is expressed by a chemical formula $CsLiB_6O_{10}$. The optical elements in the wavelength conversion system 300 are arranged as shown in FIG. 5.

The first LBO crystal 301, the second LBO crystal 302, the dichroic mirror 311, the third LBO crystal 303, the dichroic mirror 312, and the high reflectance mirror 321 are arranged in this order along the optical path of pulsed laser light LP outputted from the first solid-state laser apparatus 100 and having the wavelength of about 1547.2 nm.

The first LBO crystal 301 is so disposed as to convert the pulsed laser light LP1 in terms of wavelength into second harmonic light (having wavelength of about 773.6 nm).

The second LBO crystal 302 is so disposed as to generate third harmonic light (having wavelength of about 515.73 nm) corresponding to the sum frequency of the second harmonic light generated by the first LBO crystal 301 and the fundamental wave light (pulsed laser light LP1) having passed through the first LBO crystal 301.

The dichroic mirror 311 is disposed in the optical path between the second LBO crystal 302 and the third LBO crystal 303. The dichroic mirror 311 is coated with a film configured to reflect at high reflectance the third harmonic light (having wavelength of about 515.73 nm) generated by the second LBO crystal 302 and transmit at high transmittance the fundamental wave light (having wavelength of about 1547.2 nm) and the second harmonic light (having wavelength of about 773.6 nm) having passed through the second LBO crystal 302.

The third LBO crystal 303 is so disposed as to convert the second harmonic light in terms of wavelength into fourth harmonic light (having wavelength of about 386.8 nm).

The dichroic mirror 312 is coated with a film configured to reflect at high reflectance the fourth harmonic light (having wavelength of about 386.8 nm) generated by the third LBO crystal 303 and transmit at high transmittance the fundamental wave light (having wavelength of about 1547.2 nm) having passed through the third LBO crystal 303.

The high reflectance mirror 321 is so disposed as to reflect at high reflectance the fundamental wave light having passed through the dichroic mirror 312 and cause the reflected fundamental wave light to be incident on the dichroic mirror 314.

The high reflectance mirror 322 is so disposed as to reflect at high reflectance the third harmonic light reflected off the dichroic mirror 311 and cause the reflected third harmonic light to enter the first CLBO crystal 304 via the dichroic mirror 313.

The dichroic mirror 313 is coated with a film configured to transmit at high transmittance the third harmonic light reflected off the high reflectance mirror 322 and reflect at high reflectance the fourth harmonic light reflected off the dichroic mirror 312. The dichroic mirror 313 is so disposed as to cause the optical path axis of the third harmonic light to coincide with the optical path axis of the fourth harmonic light and cause the third harmonic light and fourth harmonic light to enter the first CLBO crystal 304.

The first CLBO crystal 304 is so disposed as to generate seventh harmonic light (having wavelength of about 221.02 nm) corresponding to the sum frequency of the third harmonic light (having wavelength of about 515.73 nm) and the fourth harmonic light (having wavelength of about 386.8 nm).

The dichroic mirror 314 is coated with a film configured to transmit at high transmittance the seventh harmonic light outputted from the first CLBO crystal 304 and reflect at high reflectance the fundamental wave light reflected off the high reflectance mirror 321. The dichroic mirror 314 is so disposed as to cause the optical path axis of the fundamental wave light to coincide with the optical path axis of the seventh harmonic light and cause the fundamental wave light and the seventh harmonic light to enter the second CLBO crystal 305.

The second LBO crystal 302 is so disposed as to generate eighth harmonic light (having wavelength of about 193.4 nm) corresponding to the sum frequency of the basic wave light and the seventh harmonic light. The pulsed laser light outputted from the third CLBO crystal 320 and having the wavelength of about 193.4 nm forms pulsed laser light LP2.

The dichroic mirror 315 is coated with a film configured to transmit at high transmittance the fundamental wave light (having wavelength of about 1547.2 nm) and the seventh harmonic light (having wavelength of about 221.02 nm) having passed through the second CLBO crystal 305 and reflect at high reflectance the pulsed laser light having the wavelength of about 193.4 nm (pulsed laser light LP2).

The high reflectance mirror 323 is so disposed as to reflect at high reflectance the eight harmonic light reflected off the dichroic mirror 315 and cause the reflected eight harmonic light to be incident on the beam splitter 328. The pulsed laser light reflected off the high reflectance mirror 323 and having the wavelength of about 193.4 nm is outputted from the wavelength conversion system 300.

The beam splitter 328 is so disposed in the optical path of the light reflected off the high reflectance mirror 323 that part of the reflected laser light enters the first pulse energy monitor 330.

The first pulse energy monitor 330 is a detector configured to detect the pulse energy of ultraviolet light and is, for example, a pulse energy sensor including a photodiode or a pyroelectric element.

The solid-state laser system control section 350 is connected to the first semiconductor laser control section 114, the first pulse excitation light source 132, and the first pulse energy monitor 330.

The excimer amplifier 14 includes an amplifier control section 400, an electricity charger 402, a trigger corrector 404, a pulse power module (PPM) 408 including a switch 406, and a chamber 410.

The chamber 410 accommodates, for example, an ArF laser gas containing an Ar gas, an $F_2$ gas, and an Ne gas. A pair of discharge electrodes 412 and 413 are disposed in the chamber 410. The pair of discharge electrodes 412 and 413 are connected to an output terminal of the PPM 408.

The chamber 410 is provided with two windows 415 and 416, which are configured to transmit laser light having the wavelength of 193.4 nm and wavelengths therearound.

The PPM 408 includes the switch 406, a pulse transformer that is not shown, and a magnetic switch that is not shown.

The monitor module 16 includes a beam splitter 601 and a second pulse energy monitor 602. The beam splitter 601 is so disposed in the optical path of the pulsed laser light outputted from the excimer amplifier 14 (excimer laser light) that the pulsed laser light reflected off the beam splitter 601 enters the second pulse energy monitor 602.

The second pulse energy monitor 602 is a detector configured to detect the pulse energy of ultraviolet light and is, for example, a pulse energy sensor including a photodiode or a pyroelectric device. Information detected with the second pulse energy monitor 602 is transmitted to the laser control section 18.

The laser control section 18 is connected to the solid-state laser system control section 350, the synchronization system 17, the amplifier control section 400, and an exposure control section 22 of an exposure apparatus 20. The laser control section 18 includes an internal trigger generator 19.

Figure 6:
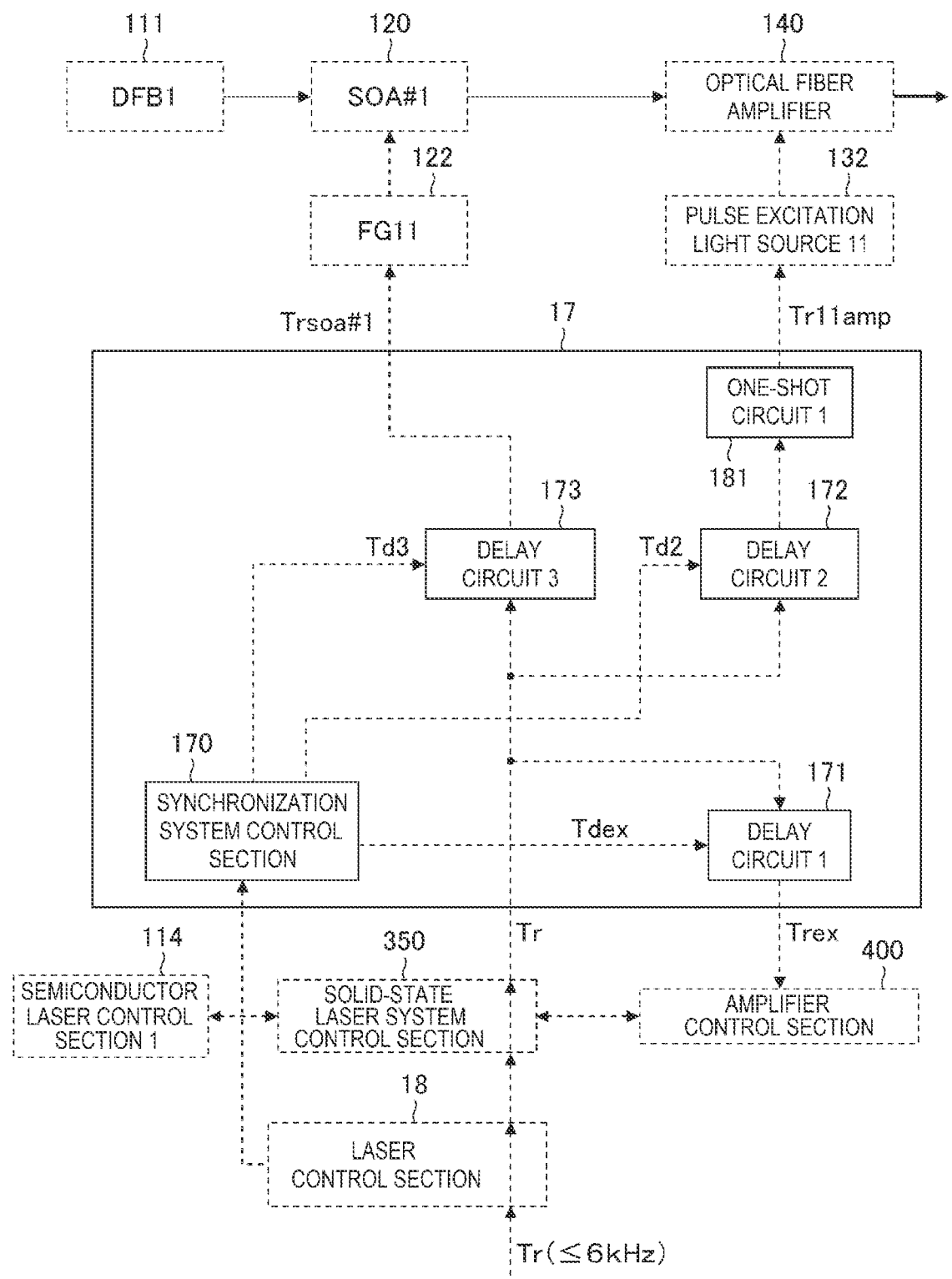
FIG. 6 is a block diagram showing an example of the configuration of a synchronization system.

FIG. 6 is a block diagram showing an example of the configuration of the synchronization system 17. The synchronization system 17 includes a synchronization system control section 170, a first delay circuit 171, a second delay circuit 172, a third delay circuit 173, and a first one-shot circuit 181.

In the present disclosure, a control apparatus configured to function as the first semiconductor laser control section 114, the solid-state laser system control section 350, the amplifier control section 400, the synchronization system control section 170, the laser control section 18, the exposure control section 22, and other control sections can be achieved by the combination of hardware and software of one or more computers. The software is synonymous with a program. A programmable controller is encompassed in the concept of a computer. The computer can be configured to include a CPU (central processing unit) and a memory. The CPU provided in the computer is an example of a processor.

Part or entirety of the processing functions of the control apparatus may be achieved by using an integrated circuit represented by an FPGA (field programmable gate array) and an ASIC (application specific integrated circuit).

The functions of a plurality of control apparatuses can be achieved also by a single control apparatus. Further, in the present disclosure, the control apparatuses may be connected to each other via a communication network, such as a local area network and the Internet. In a distributed computing environment, a program unit may be saved both in local and remote memory storage devices.

2.2 Operation

The laser control section 18 is configured to receive a light emission trigger signal Tr and data on target pulse energy Et and a target center wavelength λct and from the exposure control section 22 of the exposure apparatus 20. The laser control section 18 is configured to transmit and receive data to and from the exposure control section 22 as required and notify the exposure control section 22 of an exposure NG signal or an exposure OK signal.

The light emission trigger signal Tr is inputted to the synchronization system 17 via the laser control section 18. The synchronization system 17 is configured to output in synchronization with the light emission trigger signal Tr outputted from the exposure control section 22 a trigger signal Tr11amp to the first pulse excitation light source 132 in the solid-state laser system 10, a trigger signal Trsoa #1 to the function generator 122 connected to the first semiconductor optical amplifier 120 (SOA #1), and a trigger signal Trex for discharge in synchronization with the excimer amplifier 14.

Figure 7:
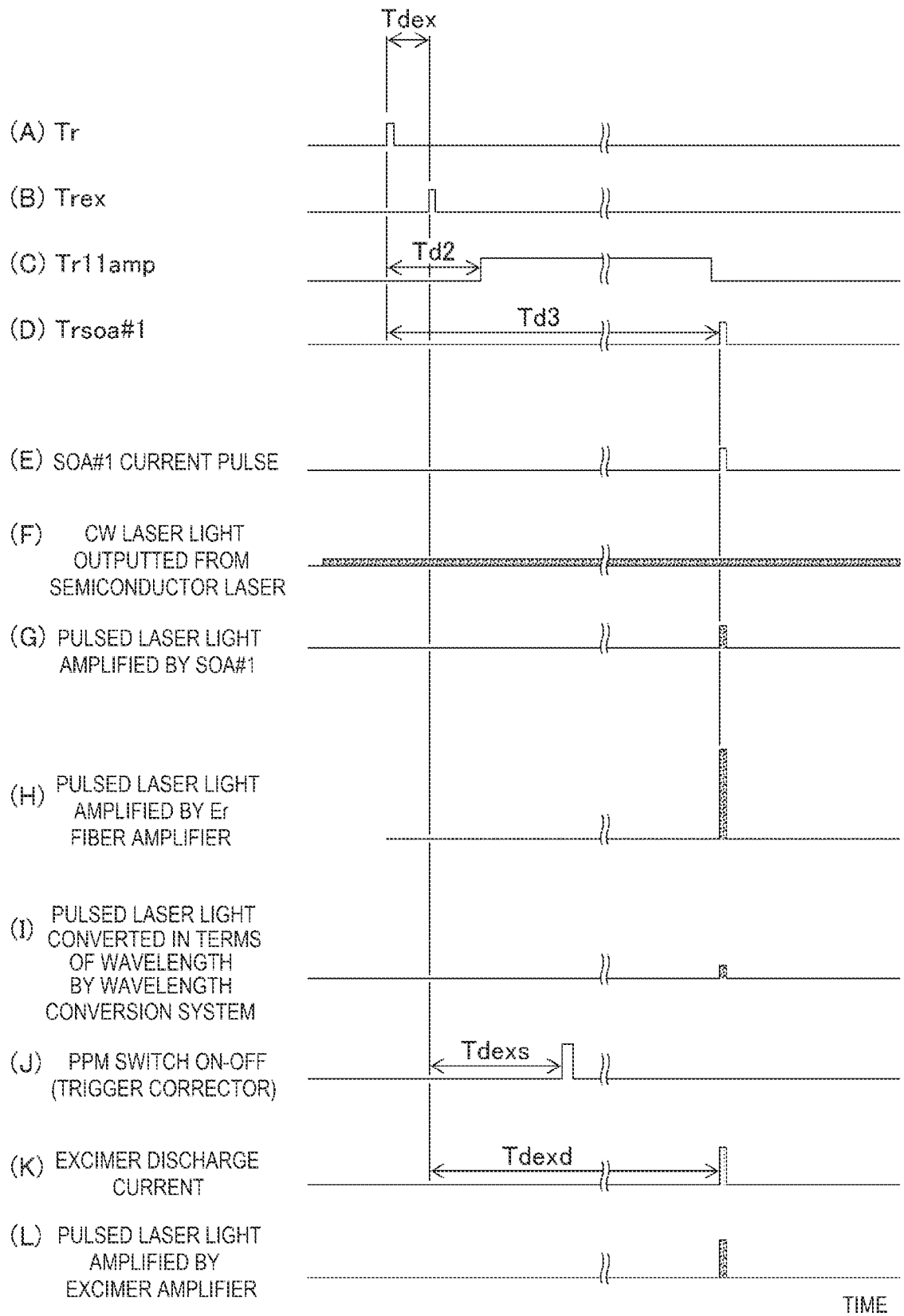
FIG. 7 shows an example of a timing chart in accordance with which the laser system operates.

FIG. 7 shows an example of a timing chart in accordance with which the laser system 1 operates. The synchronization system control section 170 is configured to set delay periods Tdex, Td2, and Td3 in the first delay circuit 171, the second delay circuit 172, and the third delay circuit 173, respectively, as shown in FIGS. 6 and 7. The delay periods Tdex, Td2, and Td3 are so set that the first semiconductor optical amplifier 120 amplifies the laser light outputted from the first semiconductor laser 111 into pulsed laser light, the Er fiber amplifier 140 further amplifies the amplified pulsed laser light, and discharge occurs in the excimer amplifier 14 in synchronization with the point of time when the pulsed laser light having the wavelength of 193.4 nm as a result of the conversion performed by the wavelength conversion system 300 enters the excimer amplifier 14.

The first delay circuit 171 is configured to generate the trigger signal Trex, which is delayed by the delay period Tdex with respect to the light emission trigger signal Tr. The trigger signal Trex generated by the first delay circuit 171 is inputted to the amplifier control section 400 of the excimer amplifier 14.

The second delay circuit 172 is configured to generate a timing signal that is delayed by the delay period Td2 with respect to the light emission trigger signal Tr. The timing signal generated by the second delay circuit 172 is inputted to the first one-shot circuit 181. The first one-shot circuit 181 is configured to output the trigger signal Tr11amp, which synchronizes with the timing signal from the second delay circuit 172.

The trigger signal Tr11amp outputted from the first one-shot circuit 181 is inputted to the first pulse excitation light source 132. The pulse period width of the trigger signal Tr11amp outputted from the first one-shot circuit 181 is set at a period width that allows the Er fiber amplifier 140 to be sufficiently excited.

The third delay circuit 173 is configured to generate the trigger signal Trsoa #1, which is delayed by the delay period Td3 with respect to the light emission trigger signal Tr. The trigger signal Trsoa #1 generated by the third delay circuit 173 is inputted to the function generator 122.

The trigger signal Trex is inputted to the trigger corrector 404 via the amplifier control section 400, and an output from the trigger corrector 404 is inputted to the switch 406 of the PPM 408. The trigger corrector 404 is configured to control the timing of a delay period Tdexs, by which the operation of turning on and off the switch 406 in the PPM 408 is delayed, in accordance with charge voltage charged in the PPM 408, so that discharge occurs at the timing of a fixed delay period Tdexd after the trigger signal Trex is inputted.

The solid-state laser system control section 350 is configured to receive data on the target center wavelength $\lambda ct$ from the exposure control section 22 via the laser control section 18 and calculate a target center wavelength $\lambda 1ct = 8 \cdot \lambda act$ of the light from the first semiconductor laser 111.

The solid-state laser system control section 350 is configured to cause the first semiconductor laser 111 to operate in the CW oscillation in the single longitudinal mode and transmit data on the target center wavelength $\lambda 1ct$ to the first semiconductor laser control section 114.

The first semiconductor laser control section 114 is configured to control a current value A1 and/or a temperature T1 of the first semiconductor laser 111 in such a way that a difference $\delta\lambda 1c$ between a center wavelength $\lambda 1c$ measured by the first wavelength monitor 112 and the target center wavelength $\lambda 1ct$ approaches zero.

The first semiconductor laser control section 114 is configured to evaluate whether the difference $\delta\lambda 1c$ between the center wavelength measured by the first wavelength monitor 112 and the target center wavelength falls within an acceptable range and notify the solid-state laser system control section 350 of a wavelength OK signal when the difference $\delta\lambda 1c$ falls within the acceptable range.

The laser control section 18 then causes the internal trigger generator 19 to generate an internal trigger signal having a predetermined repetitive frequency (100 Hz to 6 kHz, for example). The internal trigger signal is a trigger signal corresponding to the light emission trigger signal Tr and created by the laser control section 18 in place of the light emission trigger signal Tr from the exposure control section 22. The internal trigger signal outputted from the internal trigger generator 19 is called an "internal light emission trigger signal." The internal light emission trigger signal is included in the concept of the "light emission trigger signal Tr." The internal light emission trigger signal is also expressed by using the symbol "Tr." The laser control section 18 is configured to be capable of generating the internal light emission trigger signal Tr in a period for which the laser control section 18 does not receive the light emission trigger signal Tr from the exposure control section 22. The light emission trigger signal Tr outputted from the laser control section 18 is inputted to the synchronization system 17.

The pulsed laser light LP1 amplified by the Er fiber amplifier 140 enters the wavelength conversion system 300. In the wavelength conversion system 300, the pulsed laser light LP1 is converted into the eighth harmonic lights, and the pulsed laser light LP2 having the wavelength of about 193.4 nm is outputted.

The wavelength conversion in the wavelength conversion system 300 will be generally described. The pulsed laser light LP1 (having wavelength of about 1547.2 nm) outputted from the first solid-state laser apparatus 100 is converted in terms of wavelength by the first LBO crystal 301 into the second harmonic lights (having wavelength of about 773.6 nm).

The second LBO crystal 302 is configured to generate the third harmonic light (having wavelength of about 515.78 nm) corresponding to the sum frequency of the second harmonic light (having wavelength of about 776.7 nm) and the fundamental wave light (having wavelength of about 1547.2 nm). The third harmonic light is divided by the dichroic mirror 311 into two light fluxes, one of the light fluxes entering the third LBO crystal 303 and the other entering the first CLBO crystal 304 via the high reflectance mirror 322 and the dichroic mirror 313.

The third LBO crystal 303 is configured to convert the light incident thereon in terms of wavelength into the fourth harmonic light (having wavelength of about 386.8 nm). The fourth harmonic light outputted from the third LBO crystal 303 enters the first CLBO crystal 304 and the second CLBO crystal 305 via the dichroic mirror 312.

The first CLBO crystal 304 is configured to convert the light incident thereon in terms of wavelength into the seventh harmonic light (having wavelength of about 221.01 nm) corresponding to the sum frequency of the fourth harmonic light (having wavelength of about 386.8 nm) and the third harmonic light (having wavelength of about 515.78 nm).

The second CLBO crystal 305 is configured to convert the light incident thereon in terms of wavelength into the eighth harmonic light (having wavelength of about 193.4 nm) corresponding to the sum frequency of the seventh harmonic light (having wavelength of about 221.01 nm) and the fundamental wave light (having wavelength of about 1547.2 nm).

In a further detailed description of the operation of the wavelength conversion system 300, the fundamental wave light outputted from the first solid-state laser apparatus 100 and having the wavelength of about 1547.2 nm (frequency $\omega$) generates, when passing through the first LBO crystal 301, double wave light having a frequency $2\omega$ (wavelength of about 773.6 nm) based on second harmonics generation. A non-critical phase matching (NCPM) method based on adjustment of the temperature of an LBO crystal is used to achieve phase matching for converting the fundamental wave light into the double wave light.

The fundamental wave light passed through the first LBO crystal 301 and the double wave light generated by the wavelength conversion in the first LBO crystal 301 enter the second LBO crystal 302. The second LBO crystal 302 uses NCPM performed at a temperature different from the temperature in the first LBO crystal 301.

The second LBO crystal 302 is configured to generate the triple wave light (having wavelength of about 515.73 nm) based on the sum frequency generation involving the fundamental wave light and the double wave light.

The triple wave light generated by the second LBO crystal 302 and the fundamental wave light and the double wave light having passed through the second LBO crystal 302 are separated by the dichroic mirror 311. The triple wave light (having wavelength of about 515.73 nm) reflected off the dichroic mirror 311 enters the first CLBO crystal 304 via the high reflectance mirror 322 and the dichroic mirror 313.

On the other hand, the fundamental wave light and the double wave light having passed through the dichroic mirror 311 enters the third LBO crystal 303. In the third LBO crystal 303, the fundamental wave light is not converted in terms of wavelength but passes through the third LBO crystal 303, and the double wave light is converted by second harmonic generation into fourfold wave light (having wavelength of about 386.8 nm). The fourfold wave light generated by the third LBO crystal 303 and the fundamental wave light having passed through the third LBO crystal 303 are separated by the dichroic mirror 312.

The fourfold wave light reflected off the dichroic mirror 312 is coaxially combined by the dichroic mirror 313 with the triple wave light, and the combined light enters the first CLBO crystal 304.

On the other hand, the fundamental wave light having passed through the dichroic mirror 312 is reflected off the high reflectance mirror 321 and enters the second CLBO crystal 305 via the dichroic mirror 314.

The first CLBO crystal 304 is configured to generate sevenfold wave light (having wavelength of about 221.02 nm) based on the sum frequency generation involving the triple wave light and the fourfold wave light. The sevenfold wave light generated by the first CLBO crystal 304 is coaxially combined by the dichroic mirror 314 with the fundamental wave light, and the combined light enters the second CLBO crystal 305.

The second CLBO crystal 305 is configured to generate the eightfold wave light (having wavelength of about 193.4 nm) based on the sum frequency generation involving the fundamental wave light and the sevenfold wave light.

The eightfold wave light generated by the second CLBO crystal 305 and the fundamental wave light and the sevenfold wave light having passed through the second CLBO crystal 305 are separated by the dichroic mirror 315.

The eightfold wave light (having wavelength of about 193.4 nm) reflected off the dichroic mirror 315 is outputted from the wavelength conversion system 300 via the high reflectance mirror 323. Part of the eightfold wave light thus outputted from the wavelength conversion system 300 passes through the beam splitter 328 and is incident on the first high reflectance mirror 11. The pulsed laser light having passed through the beam splitter 328 may be the pulsed laser light LP2 outputted from the solid-state laser system 10.

The pulsed laser light reflected off the beam splitter 328 enters the first pulse energy monitor 330. The first pulse energy monitor 330 is configured to measure pulse energy Es of the pulsed laser light reflected off the beam splitter 328. Information provided by the first pulse energy monitor 330 is transmitted to the solid-state laser system control section 350.

The solid-state laser system control section 350 is configured to detect the pulse energy Es of the pulsed laser light LP2 via the first pulse energy monitor 330. The solid-state laser system control section 350 is configured to calculate a difference $\Delta Es$ between the pulse energy Es after the wavelength conversion and target pulse energy Est.

The solid-state laser system control section 350 is configured to control the output from the first pulse excitation light source 132 in such a way that $\Delta Es$ approaches zero.

The solid-state laser system control section 350 is configured to evaluate whether $\Delta Es$ falls within an acceptable range and notify the laser control section 18 of a solid-state laser system control OK signal when $\Delta Es$ falls within the acceptable range.

As a result, the pulsed laser light LP2 outputted from the solid-state laser system 10 and having the center wavelength of about 193.4 nm enters the excimer amplifier 14 via the first high reflectance mirror 11 and the second high reflectance mirror 12.

The excimer amplifier 14 is configured to discharge in synchronization with the incidence of the pulsed laser light LP2 having the wavelength of 193.4 nm to generate an inverted population. The trigger corrector 404 is configured to adjust the timing of the switch 406 of the PPM 408 in such a way that the pulsed laser light LP2 is efficiently amplified by the excimer amplifier 14. The excimer amplifier 14 thus outputs amplified pulsed laser light LP6.

The pulsed laser light LP6 amplified by the excimer amplifier 14 enters the monitor module 16, and the beam splitter 601 causes part of the pulsed laser light to enter the second pulse energy monitor 602, which measures pulse energy E of the pulsed laser light LP6.

The laser control section 18 is configured to acquire information on the pulse energy E from the second pulse energy monitor 602. The laser control section 18 is configured to calculate a difference $\Delta E$ between the pulse energy E measured by the second pulse energy monitor 602 and the target pulse energy Et.

The laser control section 18 is configured to control charge voltage Vhv in the electricity charger 402 via the amplifier control section 400 in such a way that $\Delta E$ approaches zero.

The laser control section 18 is configured to evaluate whether $\Delta E$ falls within an acceptable range and stop outputting the internal light emission trigger signal Tr when $\Delta E$ falls within the acceptable range and notify the exposure control section 22 of a laser system OK signal (exposure OK signal). Upon reception of the laser system OK signal, the exposure control section 22 transmits the light emission trigger signal Tr to the laser control section 18.

As a result, the laser system 1 outputs pulsed laser light having a wavelength that falls within the acceptable range around the target center wavelength $\lambda t=193.4$ nm and pulse energy that falls within the acceptable range around the target pulse energy Et. The pulsed laser light (excimer light) outputted from the laser system 1 enters the exposure apparatus 20, where an exposure process is carried out.

When the laser control section 18 receives data on a new target center wavelength $\lambda t$ from the exposure control section 22, the laser control section 18 sends the data to the solid-state laser system control section 350.

Even when the solid-state laser system control section 350 does not receive the light emission trigger signal Tr, the solid-state laser system control section 350 controls the first semiconductor laser system 110 in such a way that the target center wavelength $\lambda t$ is achieved.

2.3 Example of Processes Carried Out by Laser Control Section

Figure 8:
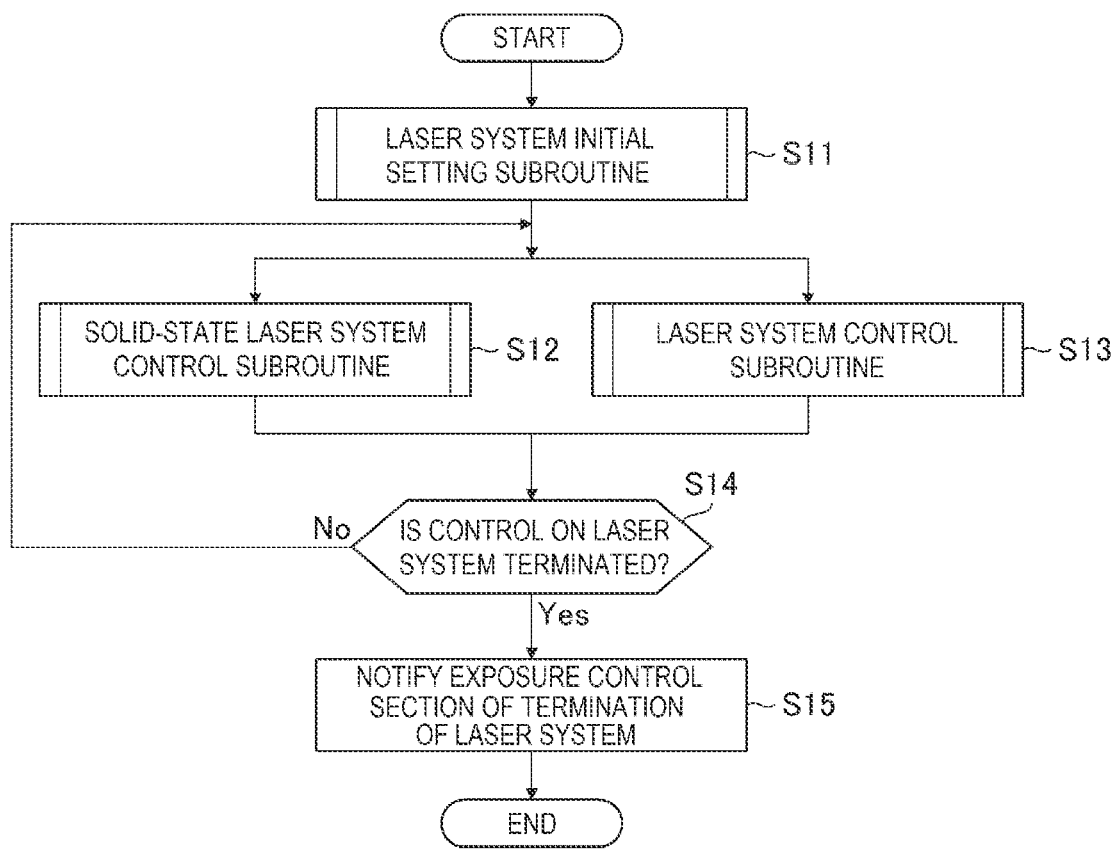
FIG. 8 is a flowchart showing an example of the content of processes carried out by a laser control section.

FIG. 8 is a flowchart showing an example of the content of processes carried out by the laser control section 18. The processes and operation shown in the flowchart of FIG. 8 are achieved when a processor configured to function as the laser control section 18 executes a program.

In step S11, the laser control section 18 carries out the subroutine of an initial setting of the laser system. After step S11, the laser control section 18 carries out a control subroutine (step S12) of controlling the solid-state laser system 10 and a control subroutine (step S13) of controlling the laser system 1. The processes in step S12 and the processes in step S13 may be carried out concurrently or in parallel.

The control in step S12 performed on the solid-state laser system 10 includes pulse energy feedback control and wavelength control. The wavelength control on the wavelength of the light from the first semiconductor laser system 110 is performed irrespective of the input of the light emission trigger signal Tr. On the other hand, the control in step S13 performed on the laser system 1 primarily includes feedback control on the pulse energy of the excimer laser light amplified by the excimer amplifier 14.

In step S14, the laser control section 18 evaluates whether or not the control performed on the laser system 1 is terminated. When the result of the evaluation in step S14 is No, the laser control section 18 returns to steps S12 and S13. When the result of the evaluation in step S14 is Yes, the laser control section 18 proceeds to step S15.

In step S15, the laser control section 18 notifies the exposure control section 22 of the termination of the operation of the laser system 1 and terminates the flowchart of FIG. 8.

Figure 9:
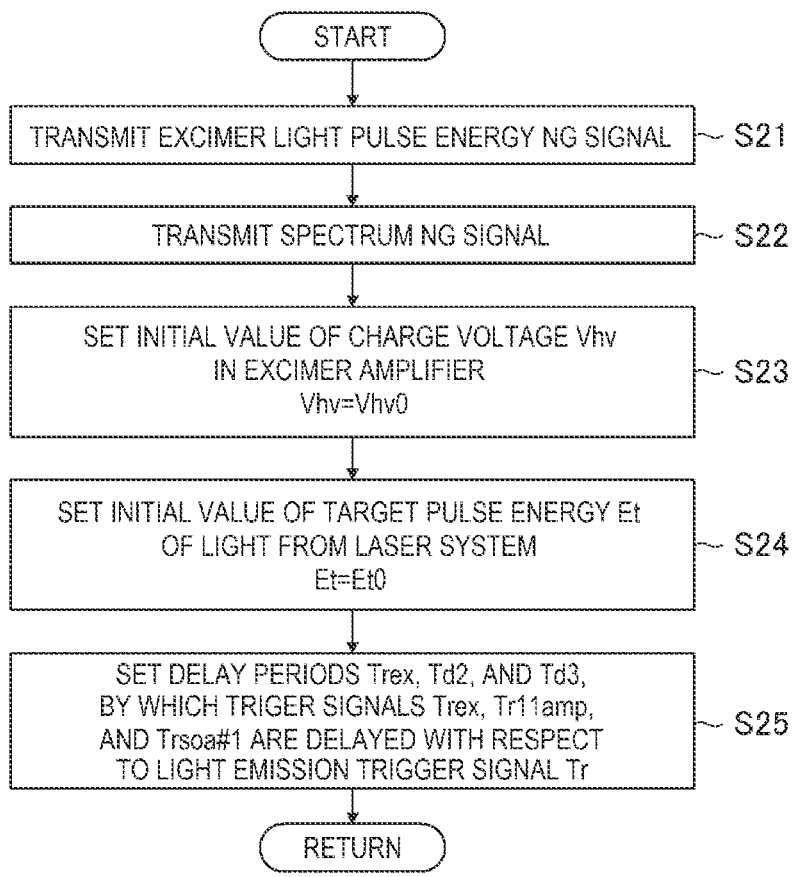
FIG. 9 is a flowchart showing an example of a subroutine of an initial setting of the laser system.

FIG. 9 is a flowchart showing an example of the subroutine of the initial setting of the laser system 1. The flowchart of FIG. 9 is applied to step S11 in FIG. 8.

In step S21 in FIG. 9, the laser control section 18 transmits an excimer light pulse energy NG signal to the exposure control section 22. In the process in step S21, the excimer light pulse energy is set in advance to be NG in the initial setting, and the laser control section 18 transmits the pulse energy NG signal to the exposure control section 22 in accordance with the initial setting.

In step S22, the laser control section 18 transmits a spectrum NG signal to the exposure control section 22. In the process in step S22, the excimer light center wavelength is set in advance to be NG in the initial setting, and the laser control section 18 transmits the spectrum NG signal to the exposure control section 22 in accordance with the initial setting.

In step S23, the laser control section 18 sets the charge voltage Vhv in the excimer amplifier 14 at an initial value Vhv0.

In step S24, the laser control section 18 sets the target pulse energy Et of the light from the laser system 1 at an initial value Et0. The laser control section 18 sets a standard initial value Et0 specified in advance before reception of data on the target pulse energy Et from the exposure apparatus 20.

In step S25, the laser control section 18 sets the delay periods Tdex, Td2, and Td3, by which the trigger signals Trex, Tr11amp, and Trsoa #1 are delayed with respect to the light emission trigger signal Tr, respectively. The laser control section 18 sets the delay periods in such a way that discharge occurs at the timing when the pulsed laser light outputted from the solid-state laser system 10 enters the excimer amplifier 14. The delay periods may each be a fixed value.

Figure 10:
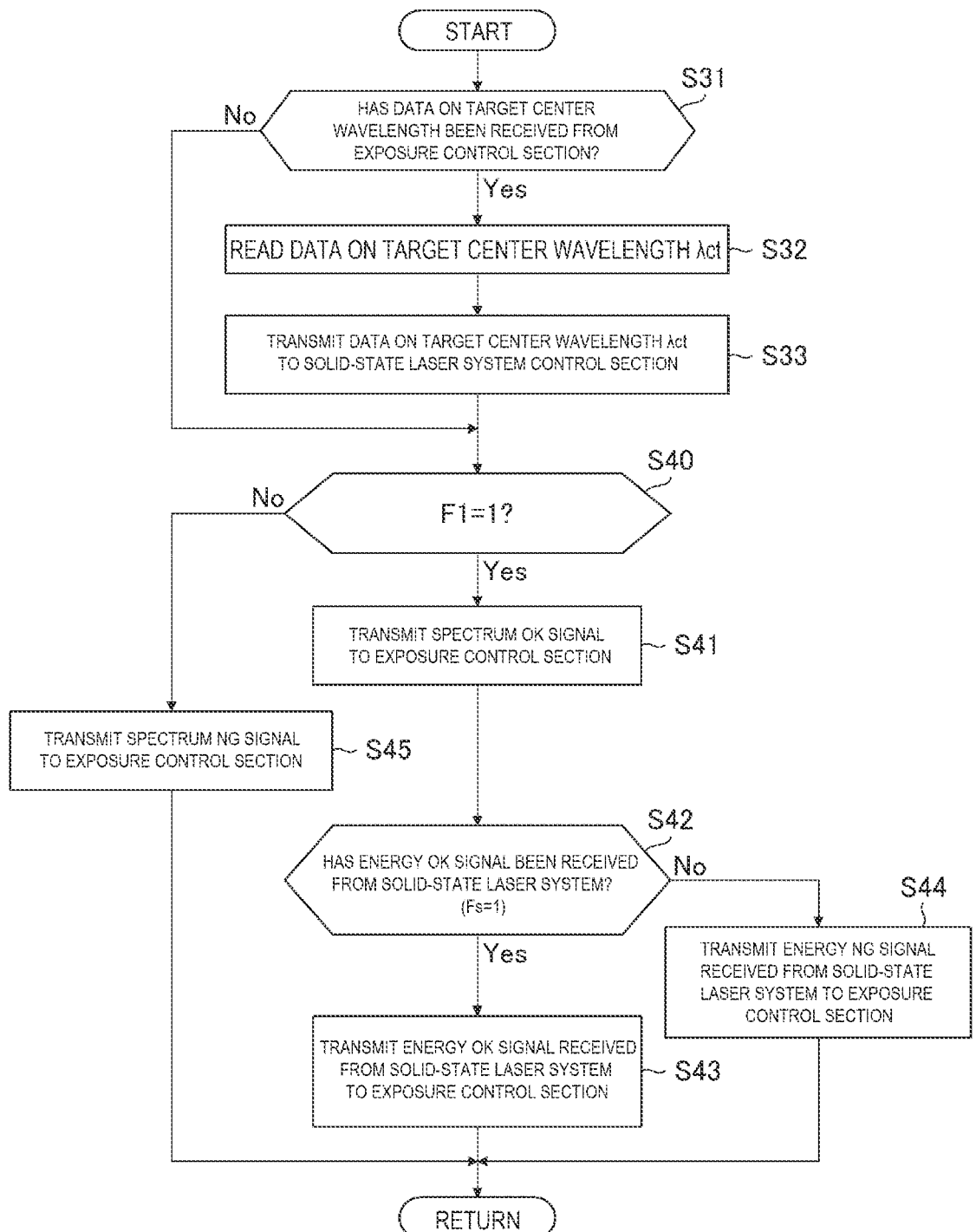
FIG. 10 is a flowchart showing an example of a control subroutine of controlling a solid-state laser system.

FIG. 10 is a flowchart showing an example of the control subroutine of controlling the solid-state laser system 10. The flowchart of FIG. 10 is applied to step S12 in FIG. 8.

In step S31 in FIG. 10, the laser control section 18 evaluates whether or not it has newly received the data on the target center wavelength from the exposure control section 22. When the result of the evaluation in step S31 is Yes, the laser control section 18 proceeds to step S32.

In step S32, the laser control section 18 reads the data on the target center wavelength λct. Thereafter, in step S33, the laser control section 18 transmits the data on the target center wavelength λct to the solid-state laser system control section 350.

After step S33, the laser control section 18 proceeds to step S40. When the result of the evaluation in step S31 is No, the laser control section 18 skips steps S32 and S33 and proceeds to step S40.

In step S40, the laser control section 18 checks the value of a flag F1 and evaluates whether or not the flag F1 is equal to one. The flag F1 is a flag representing whether the state of the first semiconductor laser system 110 is an OK or NG state. The flag value of "1" represents OK, and the flag value of "0" represents NG. That is, the laser control section 18 evaluates whether or not the state of the first semiconductor laser system 110 is the OK state.

When the result of the evaluation in step S40 is Yes, the laser control section 18 proceeds to step S41. In step S41, the laser control section 18 transmits a spectrum OK signal to the exposure control section 22.

In step S42, the laser control section 18 evaluates whether or not it has received the energy OK signal from the solid-state laser system 10. For example, the laser control section 18 checks the value of a flag Fs and evaluates whether or not the flag Fs is equal to one. The flag Fs is a flag representing whether the state of the pulse energy outputted from the solid-state laser system 10 is an OK or NG state. The value of the flag Fs of "1" represents OK, and the value of the flag Fs of "0" represents NG. The laser control section 18 evaluates based on the value of the flag Fs whether or not the state of the pulse energy from the solid-state laser system 10 is the OK state. When the result of the evaluation in step S42 is Yes, the laser control section 18 proceeds to step S43.

In step S43, the laser control section 18 transmits the energy OK signal received from the solid-state laser system 10 to the exposure control section 22. On the other hand, when the result of the evaluation in step S42 is No, the laser control section 18 proceeds to step S44.

In step S44, the laser control section 18 transmits the energy NG signal received from the solid-state laser system 10 to the exposure control section 22.

When the result of the evaluation in step S40 is No, the laser control section 18 proceeds to step S45, where the laser control section 18 transmits the spectrum NG signal to the exposure control section 22.

After step S43, S44, or S45, the laser control section 18 terminates the flowchart of FIG. 10 and returns to the flowchart of FIG. 8.

Figure 11:
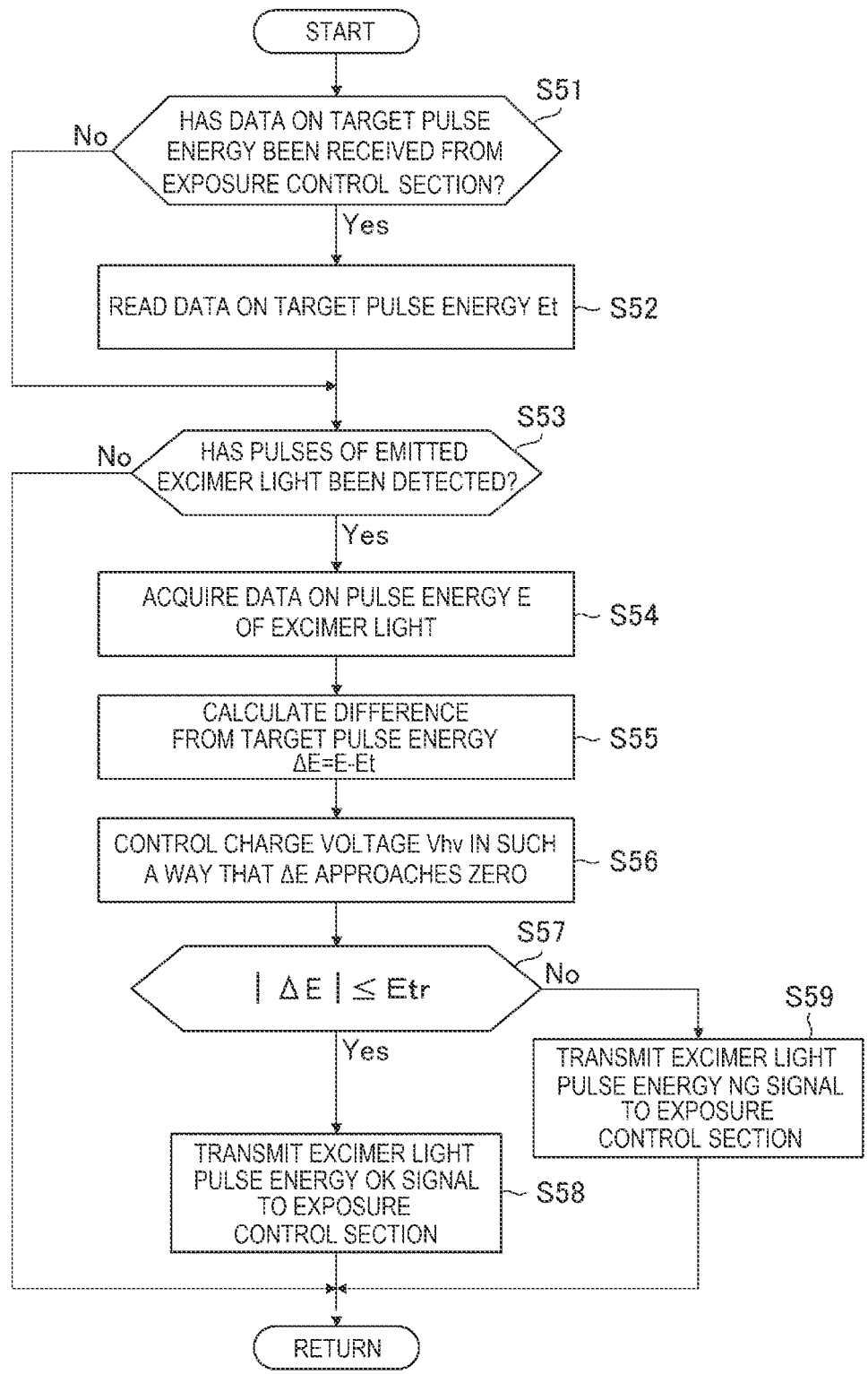
FIG. 11 is a flowchart showing an example of a control subroutine of controlling the laser system.

FIG. 11 is a flowchart showing an example of the control subroutine of controlling the laser system 1. The flowchart of FIG. 11 is applied to step S13 in FIG. 8.

In step S51 in FIG. 11, the laser control section 18 evaluates whether or not it has newly received data on the target pulse energy from the exposure control section 22. When the result of the evaluation in step S51 is Yes, the laser control section 18 proceeds to step S52.

In step S52, the laser control section 18 reads the data on the target pulse energy Et. After step S52, the laser control section 18 proceeds to step S53. When the result of the evaluation in step S51 is No, the laser control section 18 skips step S52 and proceeds to step S53.

In step S53, the laser control section 18 evaluates whether or not it has detected the pulses of the emitted excimer light. The laser control section 18 evaluates based on a signal produced by the monitor module 16 whether or not the laser control section 18 has detected the pulse energy of the pulsed laser light (excimer light) outputted to the exposure apparatus 20. When the result of the evaluation in step S53 is Yes, the laser control section 18 proceeds to step S54.

In step S54, the laser control section 18 acquires data on the pulse energy E of the excimer light detected by the monitor module 16.

In step S55, the laser control section 18 calculates the difference ΔE between the pulse energy E and the target pulse energy Et.

In step S56, the laser control section 18 controls the charge voltage Vhv in the excimer amplifier 14 in such a way that ΔE approaches zero.

Thereafter, in step S57, the laser control section 18 evaluates whether or not the absolute value of ΔE is smaller than or equal to an acceptable upper limit Etr representing an acceptable range. When the result of the evaluation in step S57 is Yes, the laser control section 18 proceeds to step S58, where the laser control section 18 transmits an excimer light pulse energy OK signal to the exposure control section 22.

When the result of the evaluation in step S57 is No, the laser control section 18 proceeds to step S59, where the laser control section 18 transmits an excimer light pulse energy NG signal to the exposure control section 22.

After step S58 or S59, the laser control section 18 terminates the flowchart of FIG. 11 and returns to the flowchart of FIG. 8.

When the result of the evaluation in step S53 in FIG. 11 is No, the laser control section 18 skips steps S54 to S59, terminates the flowchart of FIG. 11, and returns to the flowchart of FIG. 8.

Figure 12:
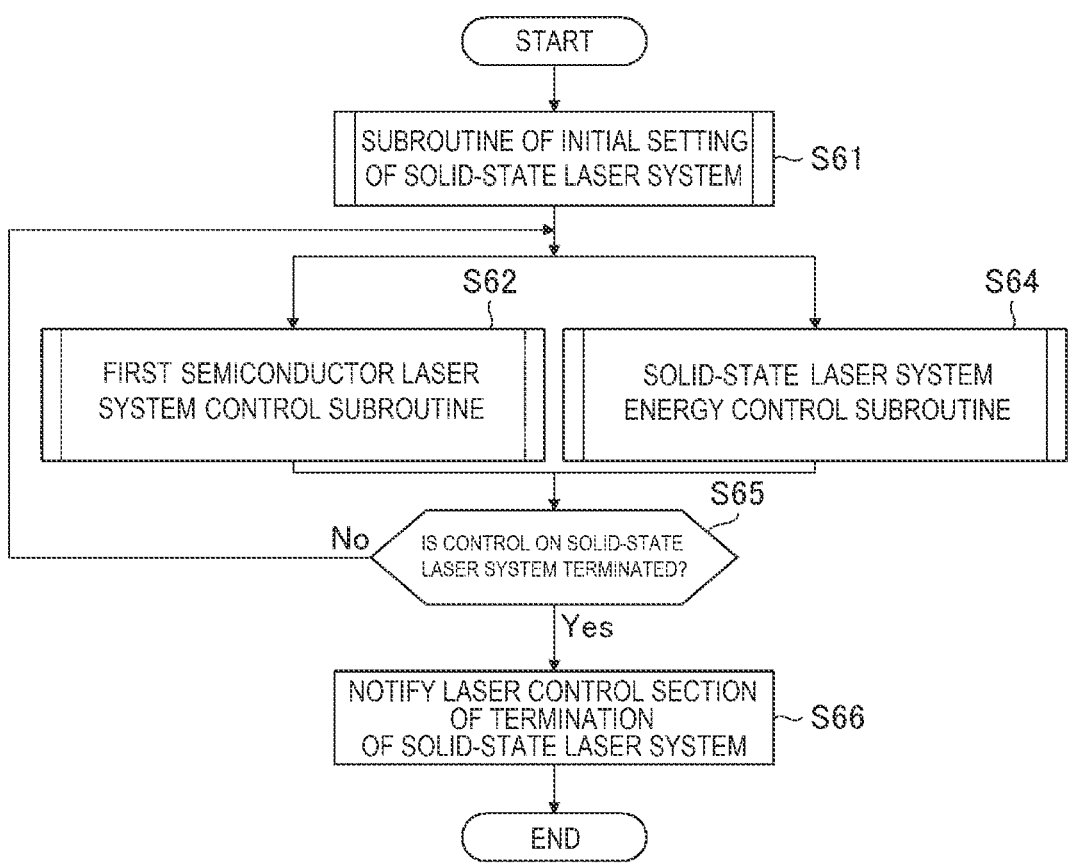
FIG. 12 is a flowchart showing an example of the content of processes carried out by a solid-state laser system control section.

2.4 Example of Processes Carried Out by Solid-State Laser System Control Section FIG. 12 is a flowchart showing an example of the content of processes carried out by the solid-state laser system control section 350. The processes and operation shown in the flowchart of FIG. 12 are achieved when a processor configured to function as the solid-state laser system control section 350 executes a program. The flowchart of the control performed by the solid-state laser system control section 350 includes control on the first semiconductor laser system 110 and energy control of controlling the energy from the solid-state laser system 10.

In step S61, the solid-state laser system control section 350 carries out the subroutine of an initial setting of the solid-state laser system 10.

After step S61, the solid-state laser system control section 350 carries out a control subroutine of controlling the first semiconductor laser system 110 (step S62) and an energy control subroutine of controlling the energy of the light from the solid-state laser system 10 (step S64). The processes in steps S62 and S64 may be carried out concurrently or in parallel.

In step S65, the solid-state laser system control section 350 evaluates whether or not the control on the solid-state laser system 10 is terminated.

When the result of the evaluation in step S65 is No, the solid-state laser system control section 350 returns to steps S62 and S64. When the result of the evaluation in step S65 is Yes, the solid-state laser system control section 350 proceeds to step S66.

In step S66, the solid-state laser system control section 350 notifies the laser control section 18 of the termination of the solid-state laser system 10 and terminates the flowchart of FIG. 12.

Figure 13:
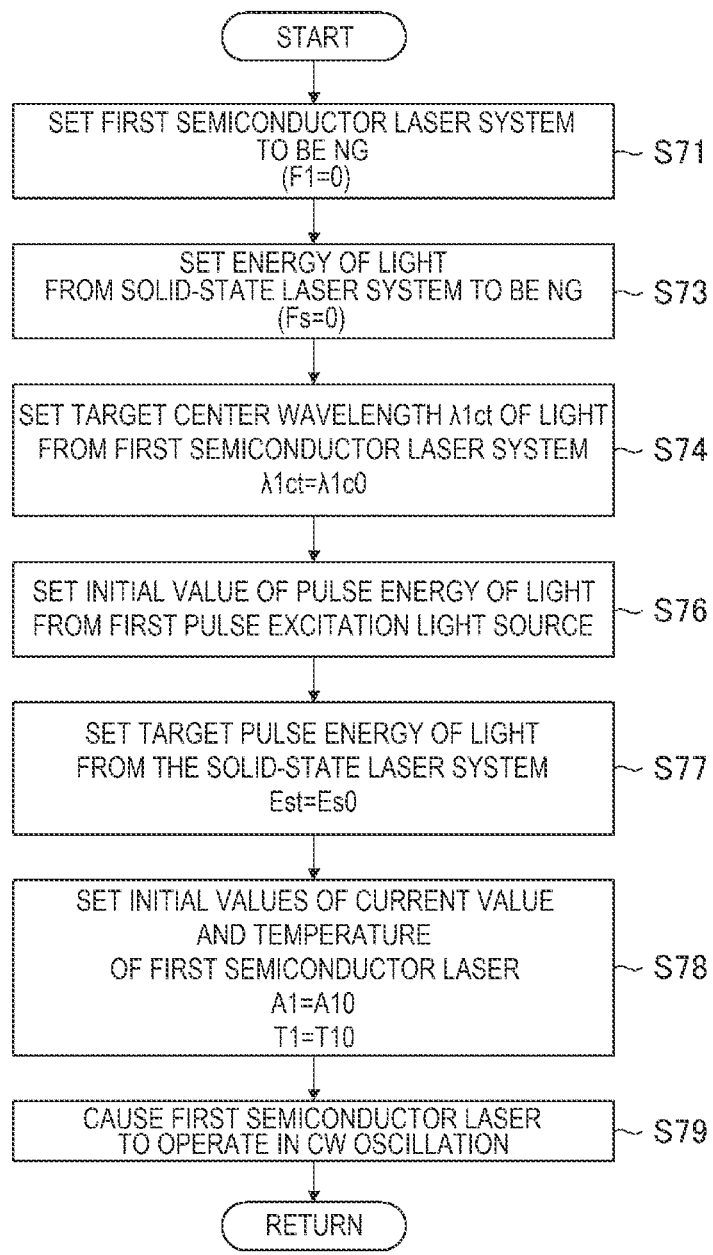
FIG. 13 is a flowchart showing an example of the subroutine of an initial setting of the solid-state laser system.

FIG. 13 is a flowchart showing an example of the subroutine of the initial setting of the solid-state laser system 10. The flowchart of FIG. 13 is applied to step S61 in FIG. 12.

In step S71 in FIG. 13, the solid-state laser system control section 350 sets the state of the first semiconductor laser system 110 to be the NG state. That is, the solid-state laser system control section 350 sets the value of the flag F1 at "0".

In step S73, the solid-state laser system control section 350 sets the state of the energy of the light from the solid-state laser system 10 to be the NG state. That is, the solid-state laser system control section 350 sets the value of the flag Fs at "0".

In step S74, the solid-state laser system control section 350 sets the target center wavelength $\lambda1ct$ of the light from the first semiconductor laser system 110 at an initial value $\lambda1c0$. The initial value $\lambda1c0$ may, for example, be set at 1547.2 nm.

In step S76, the solid-state laser system control section 350 sets an initial value of the pulse energy of the light from the first pulse excitation light source 132.

In step S77, the solid-state laser system control section 350 sets the target pulse energy Est of the light from the solid-state laser system 10 at an initial value Es0. The initial value Es0 is a fixed value specified in advance and is a value that can suppress occurrence of amplified spontaneous emission (ASE) in the excimer amplifier 14.

In step S78, the solid-state laser system control section 350 sets the current value and the temperature of the first semiconductor laser 111 at initial values. The initial values of the current value and the temperature of the first semiconductor laser 111 are so set that the oscillation wavelength is a wavelength close to $\lambda1c0$. It is assumed that the initial value of the current value A1 is A10 and the initial value of the temperature T1 is T0.

In step S79, the solid-state laser system control section 350 causes the first semiconductor laser 111 to operate in the CW oscillation under the conditions that the current value A1 is set at A10 and the temperature T1 is set at T10.

After step S79, the solid-state laser system control section 350 terminates the flowchart of FIG. 13 and returns to the flowchart of FIG. 12.

Figure 14:
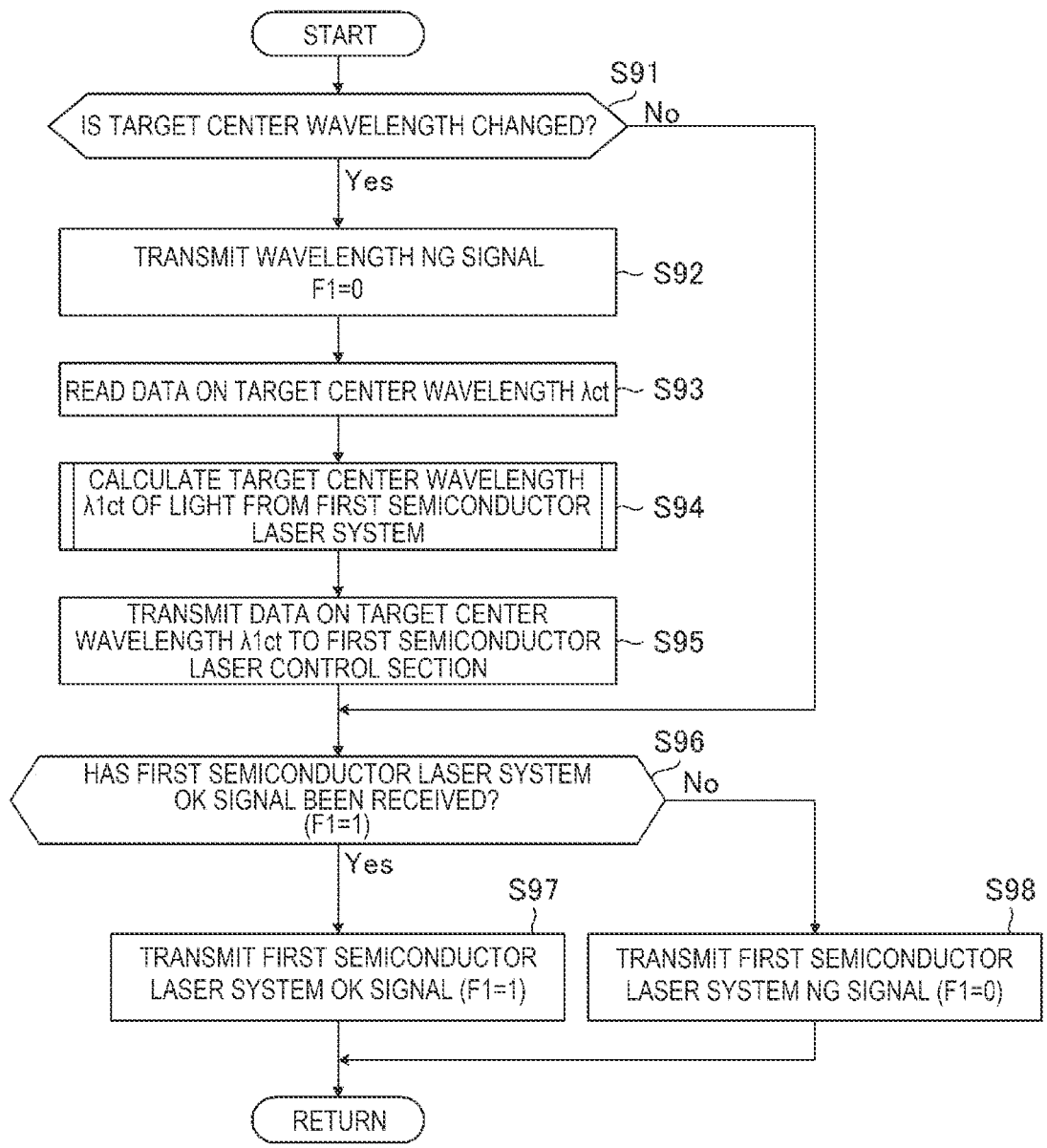
FIG. 14 is a flowchart showing an example of a control subroutine of controlling a first semiconductor laser system.

FIG. 14 is a flowchart showing an example of the control subroutine of controlling the first semiconductor laser system 110. The flowchart of FIG. 14 is applied to step S62 in FIG. 12.

In step S91 in FIG. 14, the solid-state laser system control section 350 evaluates whether or not it has received an instruction to change the target center wavelength from the exposure control section 22 via the laser control section 18. When the result of the evaluation in step S91 is Yes, the solid-state laser system control section 350 proceeds to step S92.

In step S92, the solid-state laser system control section 350 transmits a wavelength NG signal to the laser control section 18. When the target center wavelength is changed, the state of the solid-state laser system transitions to the wavelength NG state (F1=0) because the wavelength needs to be adjusted.

In step S93, the solid-state laser system control section 350 reads data on a new target center wavelength $\lambda ct$.

In step S94, the solid-state laser system control section 350 calculates the target center wavelength $\lambda1ct$ of the light from the first semiconductor laser system 110. The content of the process in step S94 will be described later with reference to FIG. 15. The solid-state laser system control section 350 calculates the target center wavelength $\lambda1ct$ in accordance with a wavelength conversion expression that will be described later.

In step S95 in FIG. 14, the solid-state laser system control section 350 transmits the data on the target center wavelength $\lambda1ct$ to the first semiconductor laser control section 114. After step S95, the solid-state laser system control section 350 proceeds to step S96.

On the other hand, when the result of the evaluation in step S91 is No, that is, when the solid-state laser system control section 350 has not received the instruction to change the target center wavelength from the exposure control section 22, the solid-state laser system control section 350 skips steps S92 to S95 and proceeds to step S96.

In step S96, the solid-state laser system control section 350 evaluates whether or not it has received the OK signal associated with the first semiconductor laser system 110 from the first semiconductor laser control section 114. When the result of the evaluation in step S96 is Yes, the solid-state laser system control section 350 proceeds to step S97.

In step S97, the solid-state laser system control section 350 transmits the OK signal associated with the first semiconductor laser system 110 to the laser control section 18. That is, the flag signal representing F1=1 is transmitted from the solid-state laser system control section 350 to the laser control section 18.

On the other hand, when the result of the evaluation in step S96 is No, that is, when the flag F1 is equal to zero, the solid-state laser system control section 350 proceeds to step S98.

In step S98, the solid-state laser system control section 350 transmits the NG signal associated with the first semiconductor laser system 110 to the laser control section 18. That is, the flag signal representing F1=0 is transmitted from the solid-state laser system control section 350 to the laser control section 18.

After step S97 or S98, the solid-state laser system control section 350 terminates the flowchart of FIG. 14 and returns to the flowchart of FIG. 12.

Figure 15:
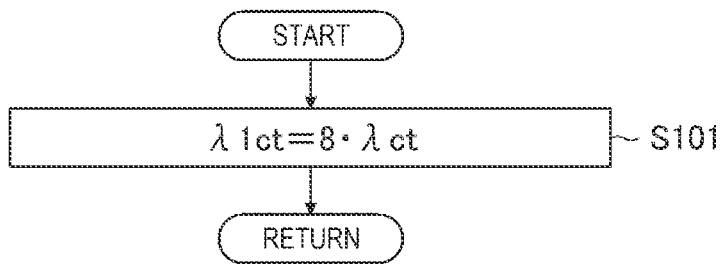
FIG. 15 is a flowchart showing an example of the subroutine of the process of calculating a target center wavelength $\lambda 1ct$ of the light from the first semiconductor laser system.

FIG. 15 is a flowchart showing an example of the subroutine of the process of calculating the target center wavelength $\lambda 1ct$ of the light from the first semiconductor laser system 110. The flowchart of FIG. 15 is applied to step S94 in FIG. 14.

In step S101 in FIG. 15, the solid-state laser system control section 350 sets the target center wavelength $\lambda 1ct$ of the light from the first semiconductor laser system 110 at $8 \cdot \lambda ct$. Since the wavelength conversion system 300 is configured to generate the eighth harmonic light, the target center wavelength $\lambda 1ct$ of the light from the first semiconductor laser system 110 is eight times the wavelength $\lambda ct$.

Since the wavelength of the light from an ArF excimer laser varies over a range, for example, from 193.2 to 193.5 nm, the wavelength of the light from the first semiconductor laser 111, which is the fundamental wave light, ranges from 1545.6 to 1548.0 nm.

The procedure of the calculation described in step S101 in FIG. 15 is not necessarily employed, and the calculation may be performed, for example, by using table data that provides the same conversion result.

After step S101, the solid-state laser system control section 350 terminates the flowchart of FIG. 15 and returns to the flowchart of FIG. 14.

Figure 16:
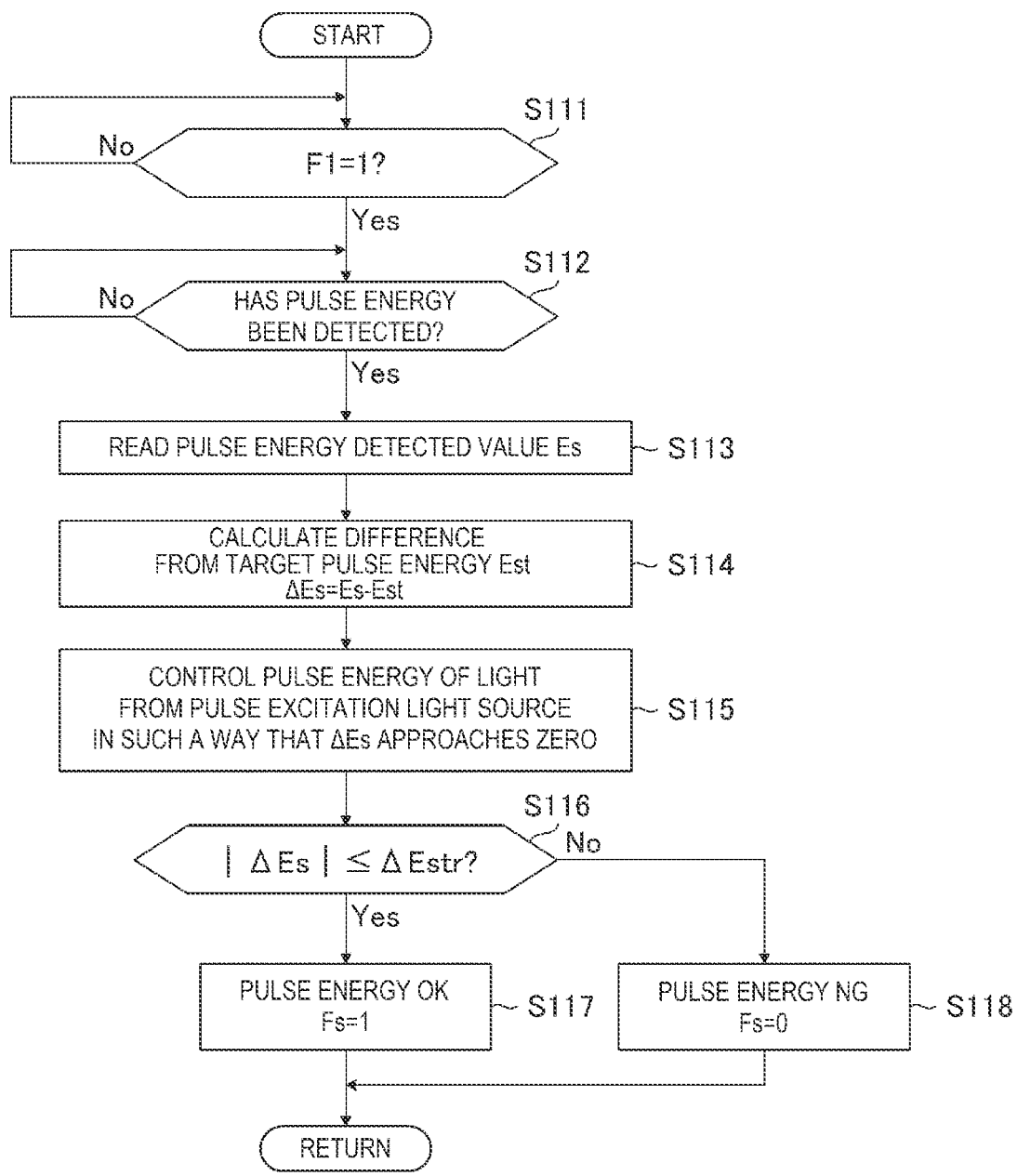
FIG. 16 is a flowchart showing an example of the subroutine of controlling the energy of the light from the solid-state laser system.

FIG. 16 is a flowchart showing an example of the subroutine of controlling the energy of the light from the solid-state laser system 10. The flowchart of FIG. 16 is applied to step S64 in FIG. 12.

In step S111 in FIG. 16, the solid-state laser system control section 350 checks the value of the flag F1 and evaluates whether or not the flag F1 is equal to one. That is, the solid-state laser system control section 350 evaluates whether or not it has received the OK signal from the first semiconductor laser system 110.

When the result of the evaluation in step S111 is No, the solid-state laser system control section 350 repeats the process in step S111. When the result of the evaluation in step S111 is Yes, the solid-state laser system control section 350 proceeds to step S12.

In step S112, the solid-state laser system control section 350 evaluates whether or not the first pulse energy monitor 330 has detected the pulse energy of the pulsed laser light. The solid-state laser system control section 350 performs the evaluation based on a signal provided from the first pulse energy monitor 330.

When the result of the evaluation in step S112 is No, the solid-state laser system control section 350 repeats the process in step S112. When the result of the evaluation in step S112 is Yes, the solid-state laser system control section 350 proceeds to step S113.

In step S113, the solid-state laser system control section 350 reads the value of the pulse energy Es detected by the first pulse energy monitor 330.

In step S14, the solid-state laser system control section 350 calculates the difference $\Delta$Es between the pulse energy Es and the target pulse energy Est.

In step S115, the solid-state laser system control section 350 controls the pulse energy of the light from the first pulse excitation light source 132 in such a way that $\Delta$Es approaches zero.

Thereafter, in step S116, the solid-state laser system control section 350 evaluates whether or not the absolute value of $\Delta$Es is smaller than or equal to an acceptable upper limit $\Delta$Estr representing an acceptable range. When the result of the evaluation in step S116 is Yes, the solid-state laser system control section 350 proceeds to step S117.

In step S117, the solid-state laser system control section 350 transmits the pulse energy OK signal associated with the solid-state laser system 10, that is, the flag signal representing Fs=1 to the laser control section 18.

On the other hand, when the result of the evaluation in step S116 is No, the solid-state laser system control section 350 proceeds to step S118 and transmits the pulse energy NG signal associated with the solid-state laser system 10, that is, the flag signal representing Fs=0 to the laser control section 18.

After step S117 or S118, the solid-state laser system control section 350 terminates the flowchart of FIG. 16 and returns to the flowchart of FIG. 12.

2.5 Example of Semiconductor Laser System
2.5.1 Configuration

Figure 17:
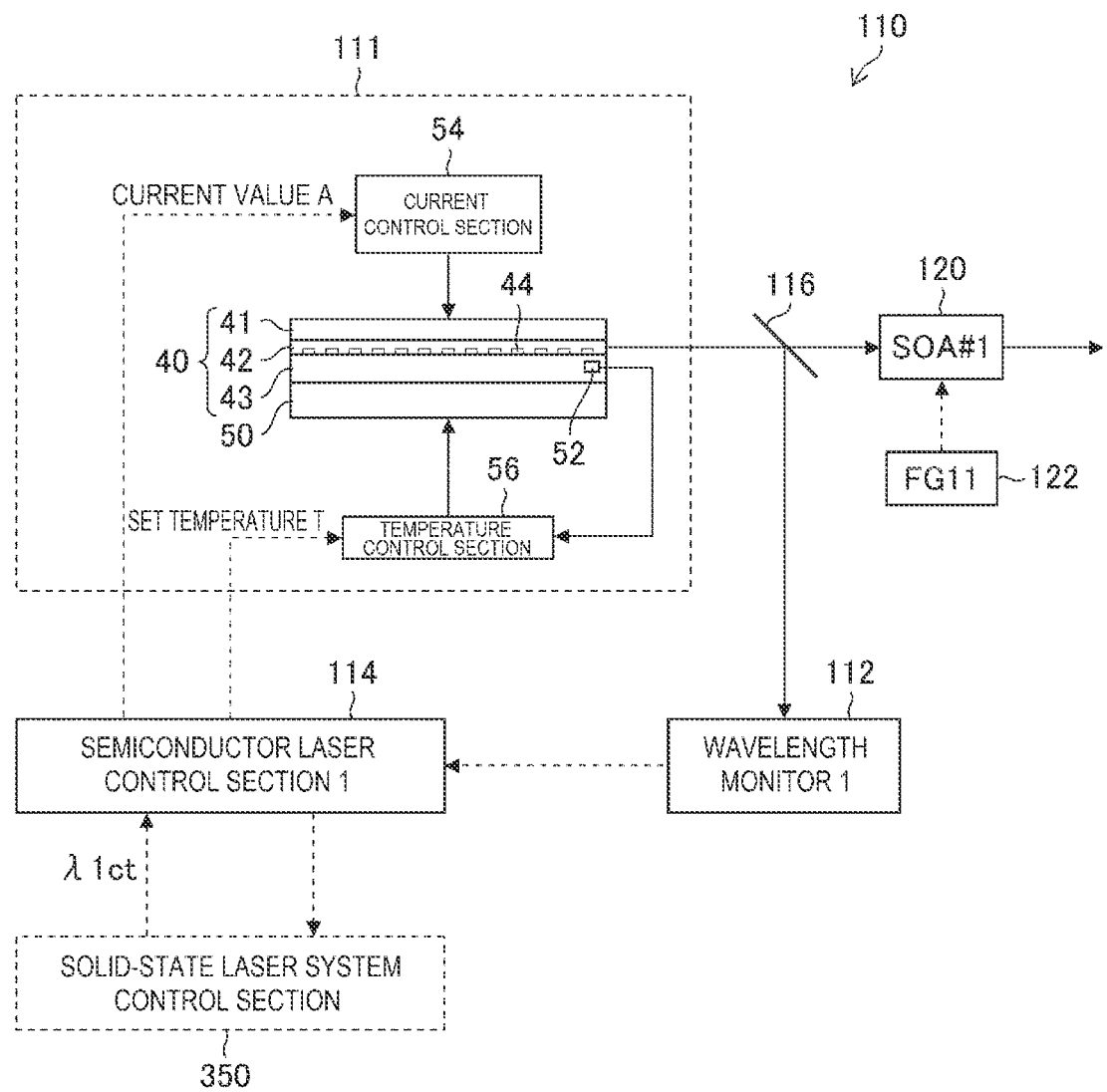
FIG. 17 schematically shows an example of the configuration of the semiconductor laser system.

FIG. 17 schematically shows an example of the configuration of the first semiconductor laser system 110. The first semiconductor laser system 110 includes the first semiconductor laser 111, which operates in the single longitudinal mode, the first wavelength monitor 112, the first semiconductor laser control section 114, the first beam splitter 116, and the first semiconductor optical amplifier 120.

The first semiconductor laser 111 is a DFB laser and includes a semiconductor element 40, a Peltier element 50, a temperature sensor 52, a current control section 54, and a temperature control section 56. The semiconductor element 40 includes a first cladding layer 41, an active layer 42, and a second cladding layer 43 and further includes a grating 44 at the boundary between the active layer 42 and the second cladding layer 43.

2.5.2 Operation

The oscillation wavelength at which the first semiconductor laser 111 oscillates can be changed by changing the current value A and/or the set temperature T of the semiconductor element 40. The current value A may, for example, be a direct current (DC) value. To change the oscillation wavelength at high speed over a narrow range, the current value A is changed. To greatly change the oscillation wavelength, the set temperature T is changed.

Figure 18:
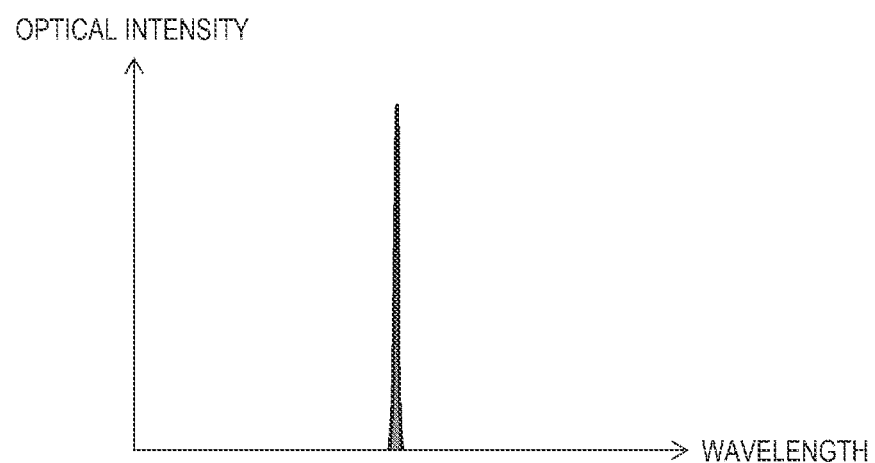
FIG. 18 shows an example of the spectrum waveform of laser light outputted from a distributed feedback semiconductor laser.

FIG. 18 shows an example of the spectrum waveform of the laser light outputted from the first semiconductor laser 111. The laser light outputted from the first semiconductor laser 111 has the spectrum shape of a single line having a narrow spectral linewidth achieved by single longitudinal mode oscillation, as shown in FIG. 18.

Figure 19:
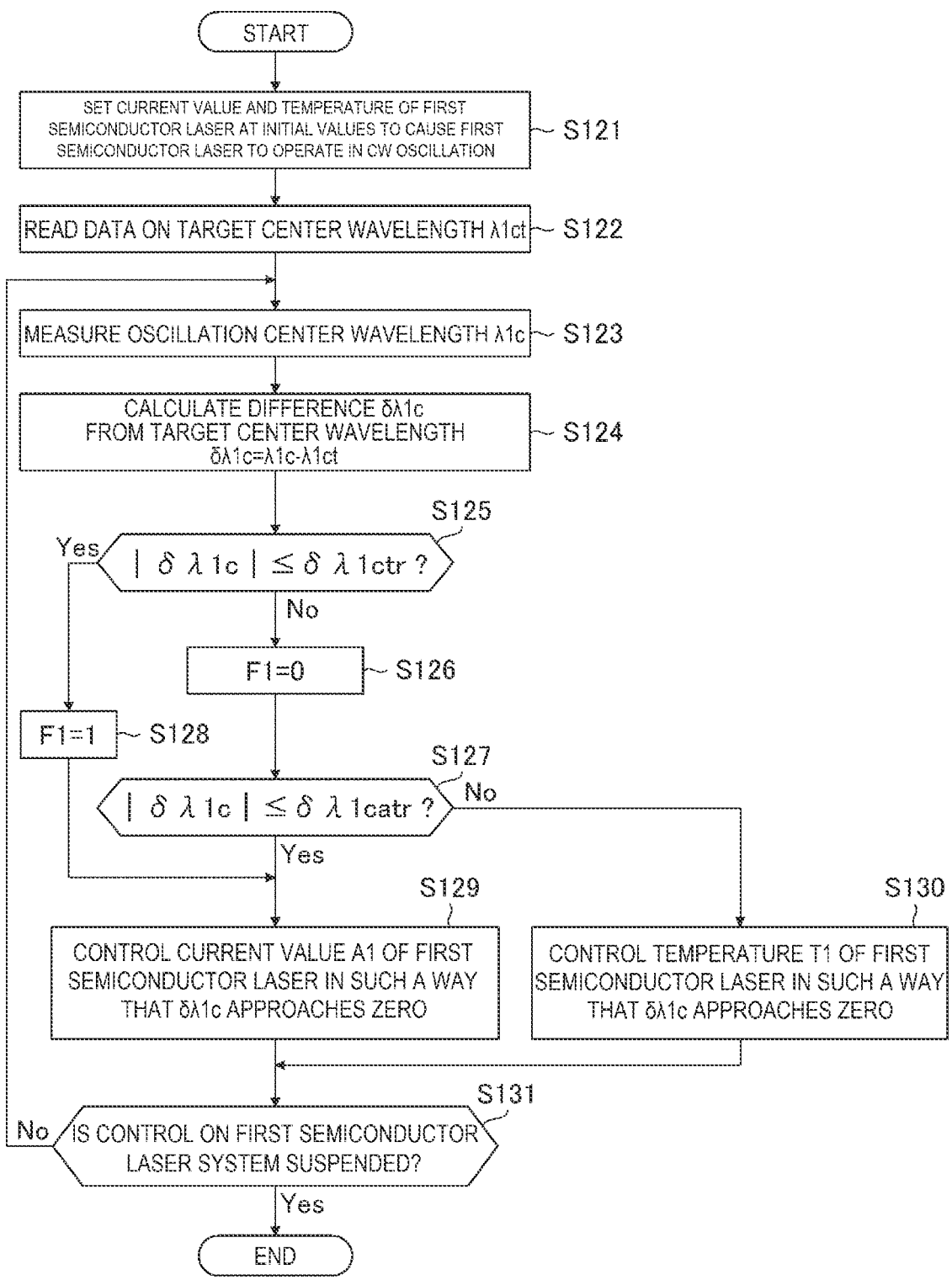
FIG. 19 is a flowchart showing an example of the content of processes carried out by a first semiconductor laser control section.

2.6 Example of Processes Carried Out by First Semiconductor Laser Control Section FIG. 19 is a flowchart showing an example of the content of processes carried out by the first semiconductor laser control section 114. The processes and operation shown in the flowchart of FIG. 19 are achieved when a processor configured to function as the first semiconductor laser control section 114 executes a program.

In step S121, the first semiconductor laser control section 114 sets the current value and the temperature of the first semiconductor laser 111 at initial values to cause the first semiconductor laser 111 to operate in CW oscillation. For example, the first semiconductor laser control section 114 reads values of the current value and the temperature of the first semiconductor laser that have been set at the initial values in step S78 in FIG. 13 to cause the first semiconductor laser 111 to operate in the CW oscillation.

In step S122, the first semiconductor laser control section 114 reads the data on the target center wavelength $\lambda 1ct$.

In step S123, the first semiconductor laser control section 114 measures the oscillation center wavelength $\lambda 1c$ by using the first wavelength monitor 112.

In step S124, the first semiconductor laser control section 114 calculates the difference $\delta\lambda 1c$ between the oscillation center wavelength $\lambda 1c$ and the target center wavelength $\lambda 1ct$.

In step S125, the first semiconductor laser control section 114 evaluates whether or not the absolute value of $\delta\lambda 1c$ is smaller than or equal to an acceptable upper limit $\delta\lambda 1ctr$ representing an acceptable range. When the result of the evaluation in step S125 is No, the first semiconductor laser control section 114 proceeds to step S126, where the first semiconductor laser control section 114 transmits the flag signal representing F1=0 to the solid-state laser system control section 350.

In step S127, the first semiconductor laser control section 114 evaluates whether or not the absolute value of $\delta\lambda 1c$ is smaller than or equal to an acceptable upper limit $\delta\lambda 1catr$ representing a range over which the wavelength can be controlled by the current. When the result of the evaluation in step S27 is Yes, the first semiconductor laser control section 114 proceeds to step S129, where the semiconductor laser control section 114 controls the current value A1 of the first semiconductor laser 111 in such a way that $\delta\lambda 1c$ approaches zero.

When the result of the evaluation in step S127 is No, the first semiconductor laser control section 114 proceeds to step S130, where the first semiconductor laser control section 114 controls the temperature T1 of the first semiconductor laser 111 in such a way that $\delta\lambda 1c$ approaches zero.

When the result of the evaluation in step S125 is Yes, the first semiconductor laser control section 114 proceeds to step S128, where the first semiconductor laser control section 114 transmits the flag signal representing F1=1 to the solid-state laser system control section 350. After step S128, the first semiconductor laser control section 114 proceeds to step S129.

After step S129 or S130, the first semiconductor laser control section 114 proceeds to step S131. In step S131, the first semiconductor laser control section 114 evaluates whether or not the control on the first semiconductor laser system 110 is suspended. When the result of the evaluation in step S131 is No, the first semiconductor laser control section 114 returns to step S123 and repeats the processes in steps S123 to S131.

When the result of the evaluation in step S131 is Yes, the first semiconductor laser control section 114 terminates the flowchart of FIG. 19.

3. Problems

When a semiconductor laser configured to oscillate in the single longitudinal mode is used as the first semiconductor laser 111 shown in FIG. 5, the following problems occur.

[Problem 1] When seed laser light is amplified into pulsed laser light by using a fiber amplifier in such a way that the pulsed laser light has high pulse energy, stimulated Brillouin scattering (SBS), which is a nonlinear phenomenon in an optical fiber, could break the solid-state laser apparatus due to a narrow spectral linewidth. It is therefore difficult to increase the pulse energy of the pulsed laser light by using pulse amplification performed by a fiber amplifier.

[Problem 2] To achieve a desired exposure process in the exposure apparatus 20, it is necessary to control the spectral linewidth of the pulsed laser light (excimer light) that enters the exposure apparatus 20. In a semiconductor laser configured to oscillate in the single longitudinal mode, however, it is difficult to change the spectral linewidth of the laser light, and it is therefore difficult to control the spectral linewidth of the excimer light converted in terms of wavelength and amplified by the wavelength conversion system 300.

[Problem 3] If a semiconductor laser that is not shown but is configured to oscillate in multiple longitudinal modes is used in the solid-state laser system 10, occurrence of SBS can be suppressed, but it is difficult to precisely control the spectral linewidth to be a target spectral linewidth.

4. First Embodiment 4.1 Configuration

Figure 20:
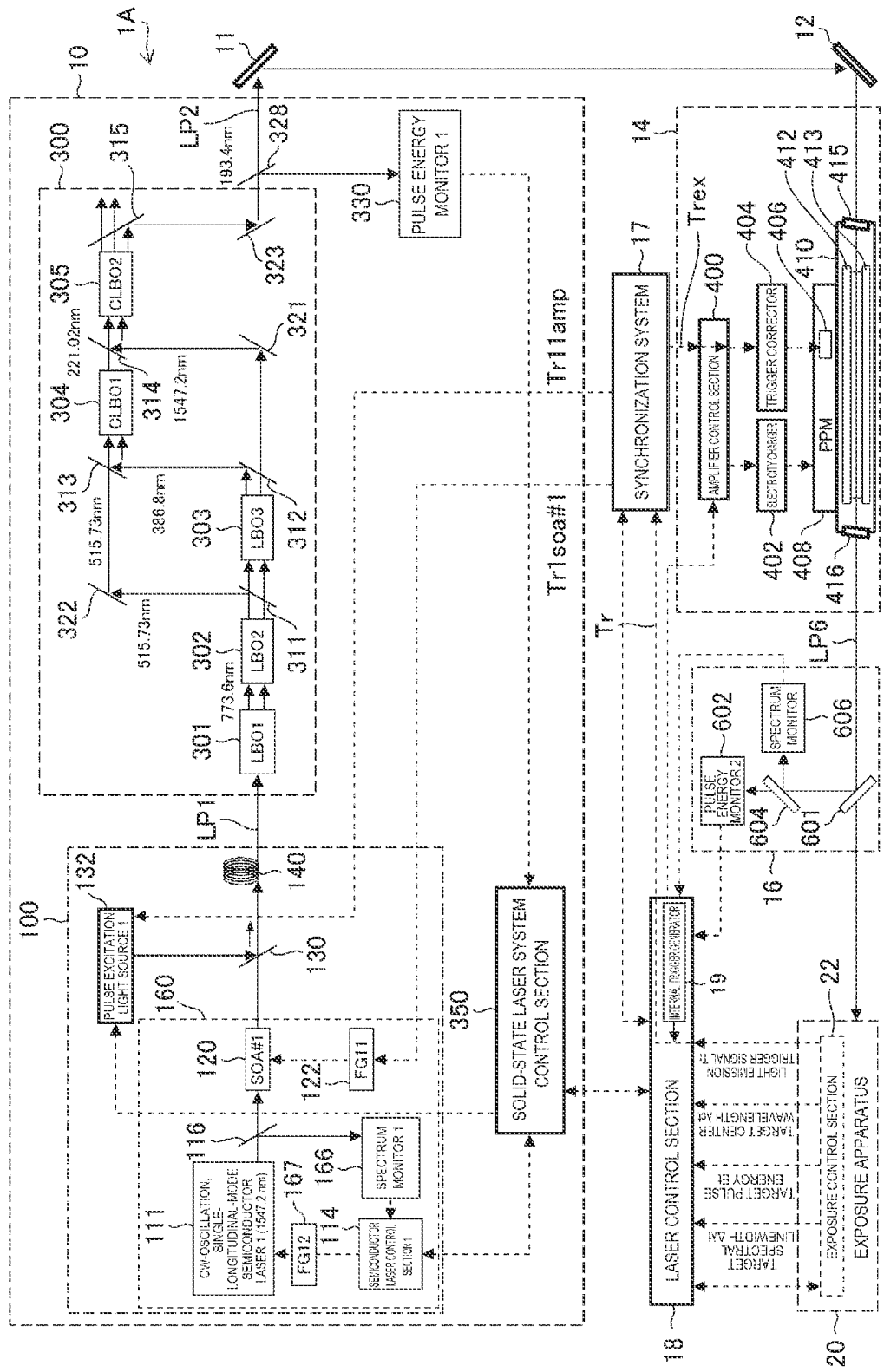
FIG. 20 schematically shows the configuration of a laser system according to a first embodiment.
Figure 21:
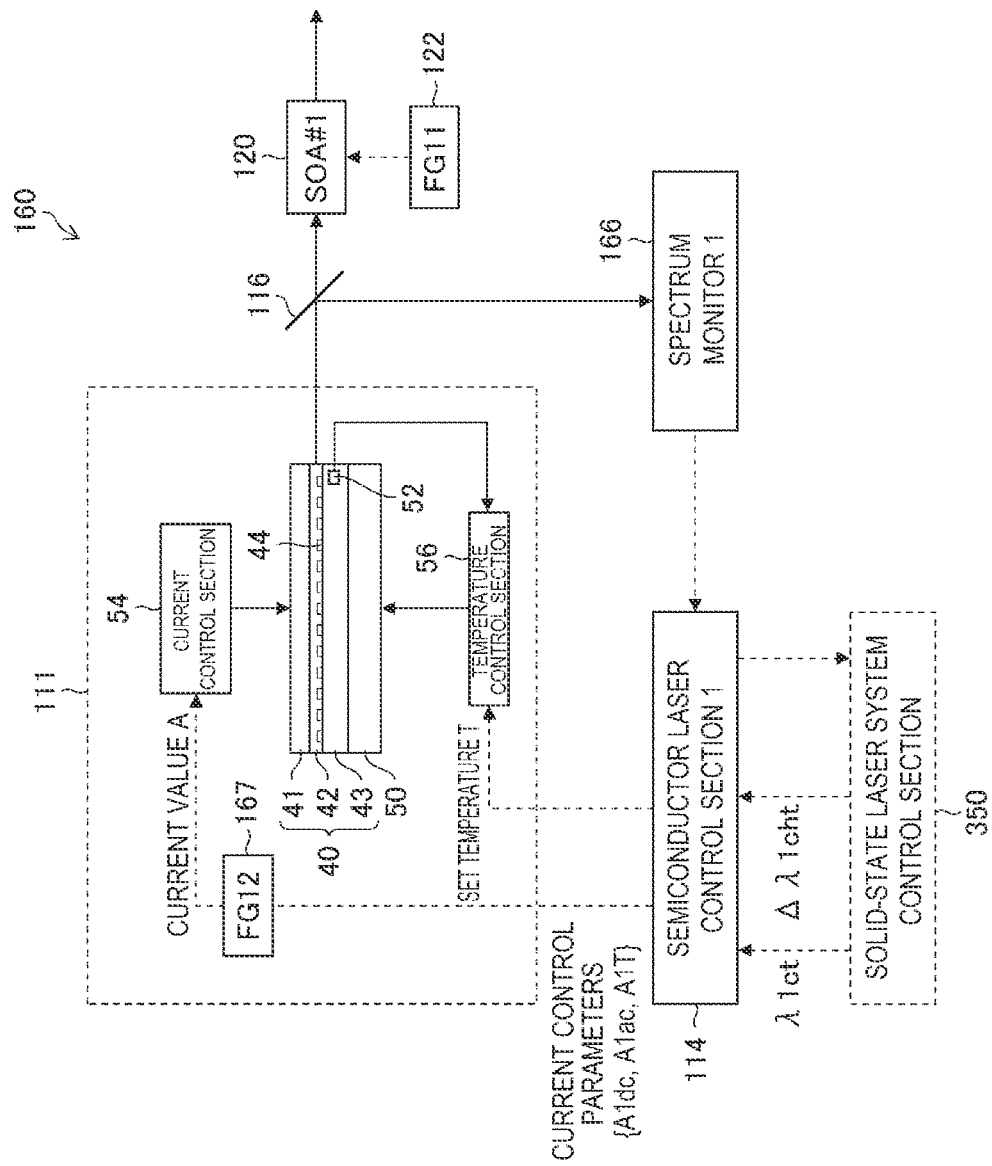
FIG. 21 schematically shows an example of the configuration of the first semiconductor laser system.

FIG. 20 schematically shows the configuration of a laser system 1A according to a first embodiment. Differences from FIG. 5 will be described. The laser system 1A according to the first embodiment shown in FIG. 20 includes a first semiconductor laser system 160 in place of the first semiconductor laser system 110 shown in FIG. 5. FIG. 21 is a block diagram showing an example of the first semiconductor laser system 160.

The first semiconductor laser system 160 includes a first spectrum monitor 166 in place of the first wavelength monitor 112 in FIG. 5, and a function generator 167 for performing modulation control on the current caused to flow through the first semiconductor laser 111 is further added to the first semiconductor laser system 160.

The monitor module 16 in FIG. 20 further includes a beam splitter 604 and a spectrum monitor 606. The spectrum monitor 606 may, for example, have a configuration including an etalon spectrometer configured to measure the spectral linewidth of ArF laser light (excimer light), such as the configuration shown in FIG. 68, which will be described later.

The exposure control section 22 has a signal line along which data on a target spectral linewidth $\Delta\lambda t$ of the excimer light is transmitted to the laser control section 18.

4.2 Operation

Upon reception of the data on the target spectral linewidth $\Delta\lambda t$ of the excimer light from the exposure control section 22, the laser control section 18 of the laser system 1A shown in FIG. 20 calculates a target spectral linewidth $\Delta\lambda 1cht$ of the first semiconductor laser system 160 in such a way that the target spectral linewidth $\Delta\lambda 1cht$ is equal to the target spectral linewidth $\Delta\lambda t$. The laser control section 18 is configured to transmit data on the target spectral linewidth $\Delta\lambda 1cht$ to the solid-state laser system control section 350. When the laser control section 18 calculates the target spectral linewidth $\Delta\lambda 1cht$ from the target spectral linewidth $\Delta\lambda t$ of the excimer light, the correlation between $\Delta\lambda t$ and $\Delta\lambda 1cht$ may be held in advance in the form of table data or a function in a storage section, such as a memory. Data that identifies the correlation may be updated when the laser system 1A is activated.

Further, upon reception of the data on the target center wavelength $\lambda ct$ of the excimer light from the exposure control section 22, the laser control section 18 calculates the target center wavelength $\lambda 1cht = 8 \cdot \lambda ct$ of the light from the first semiconductor laser system 160 in such a way that the target center wavelength $\lambda 1cht$ is equal to the target center wavelength $\lambda ct$. The laser control section 18 is configured to transmit data on the target center wavelength $\lambda 1ct$ to the solid-state laser system control section 350.

Upon reception of the data on the target spectral linewidth $\Delta\lambda 1cht$ and the target center wavelength $\lambda 1ct$, the first semiconductor laser control section 114 measures the spectral linewidth $\Delta\lambda 1ch$ and the center wavelength $\lambda 1c$ detected by the first spectrum monitor 166. The first semiconductor laser control section 114 is configured to calculate a difference $\Delta\Delta\lambda 1ch$ between the measured spectral linewidth $\Delta\lambda 1ch$ and the target spectral linewidth $\Delta\lambda 1cht$ ($=\Delta\lambda 1ch - \Delta\lambda 1cht$). The first semiconductor laser control section 114 is configured to further calculate the difference $\delta\lambda 1c$ between the measured center wavelength $\lambda 1ch$ and the target center wavelength $\lambda 1cht$ ($=\lambda 1ch - \lambda 1cht$). The first semiconductor laser control section 114 is configured to control a variation width A1ac of an AC (alternate current) component out of current control parameters of the current caused to flow through the first semiconductor laser 111 in such a way that $\Delta\Delta\lambda 1ch$ approaches zero.

Figure 33:
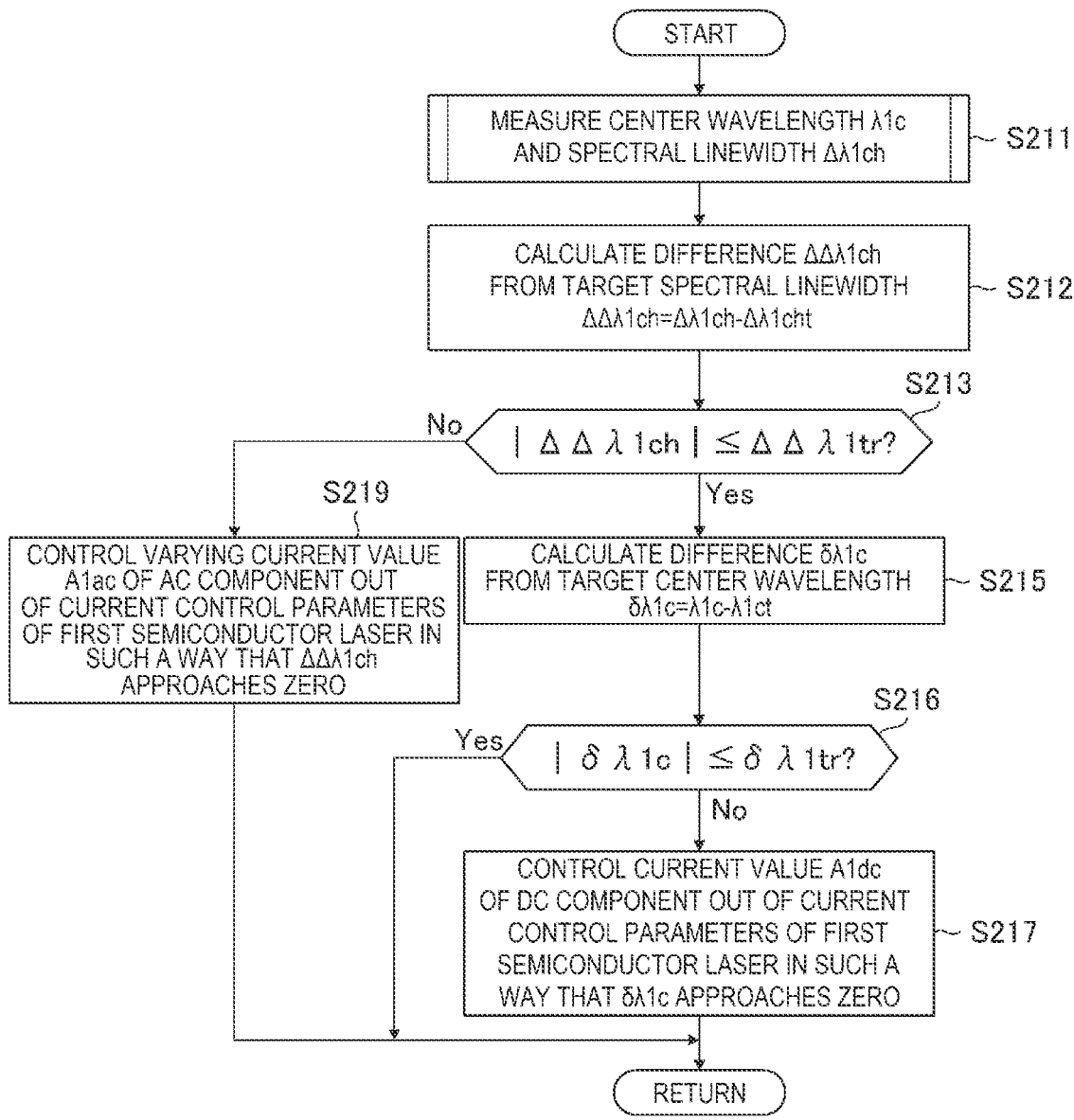
FIG. 33 is a flowchart showing Example 1 of a control subroutine (2) of controlling the first semiconductor laser.

The first semiconductor laser control section 114 is further configured to control a DC component value A1dc out of the current control parameters of the current caused to flow through the first semiconductor laser 111 in such a way that $\delta\lambda 1c$ approaches zero (see FIG. 33). The first semiconductor laser control section 114 is configured to alternatively control the temperature T1 of the first semiconductor laser 111 in such a way that $\delta\lambda 1c$ approaches zero (see FIG. 34).

4.3 Operation of First Semiconductor Laser System

The oscillation center wavelength at which a distributed feedback semiconductor laser oscillates can be changed by changing the current value and/or a semiconductor set temperature of the semiconductor element 40.

To control the spectral linewidth by causing the wavelength to chirp at high speed, the control can be achieved by changing at high speed the current value of the current flowing through the first semiconductor laser 111.

The high-speed wavelength chirping is performed by transmitting values of the following parameters: the DC component value A1dc; the AC component variation width A1ac; and an AC component cycle A1T as the current control parameters from the first semiconductor laser control section 114 to the function generator 167, as shown in FIG. 21, whereby the spectral linewidth can be controlled. The function generator 167 is configured to output an electric signal having a waveform according to the current control parameters specified by the first semiconductor laser control section 114 to the current control section 54. The current control section 54 is configured to perform current control in such a way that current according to the electric signal from the function generator 167 is caused to flow through the semiconductor element 40. The function generator 167 may be provided as a component external to the first semiconductor laser 111. For example, the function generator 167 may be included in the first semiconductor laser control section 114.

Figure 22:
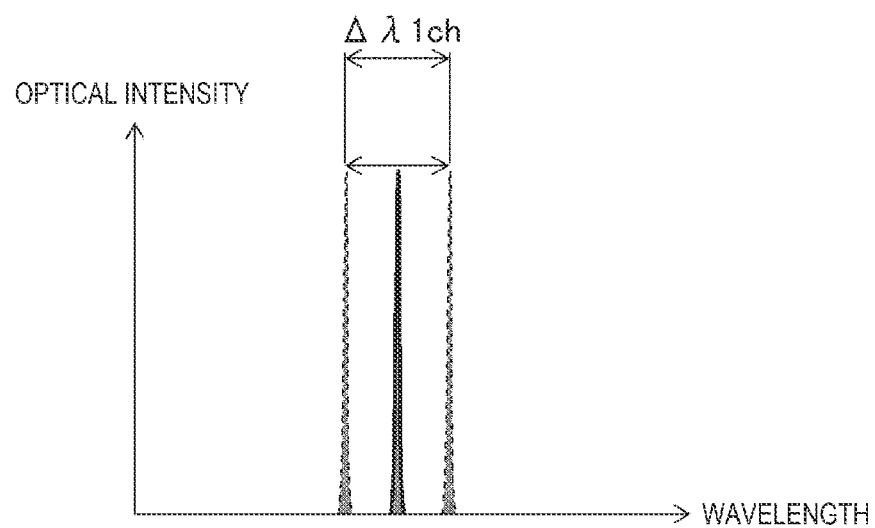
FIG. 22 is a conceptual view of the spectral linewidth achieved by the chirping.

FIG. 22 is a conceptual view of the spectral linewidth achieved by the chirping. The spectral linewidth $\Delta\lambda 1ch$ is measured as the difference between a maximum wavelength and a minimum wavelength generated by the chirping.

Figure 23:
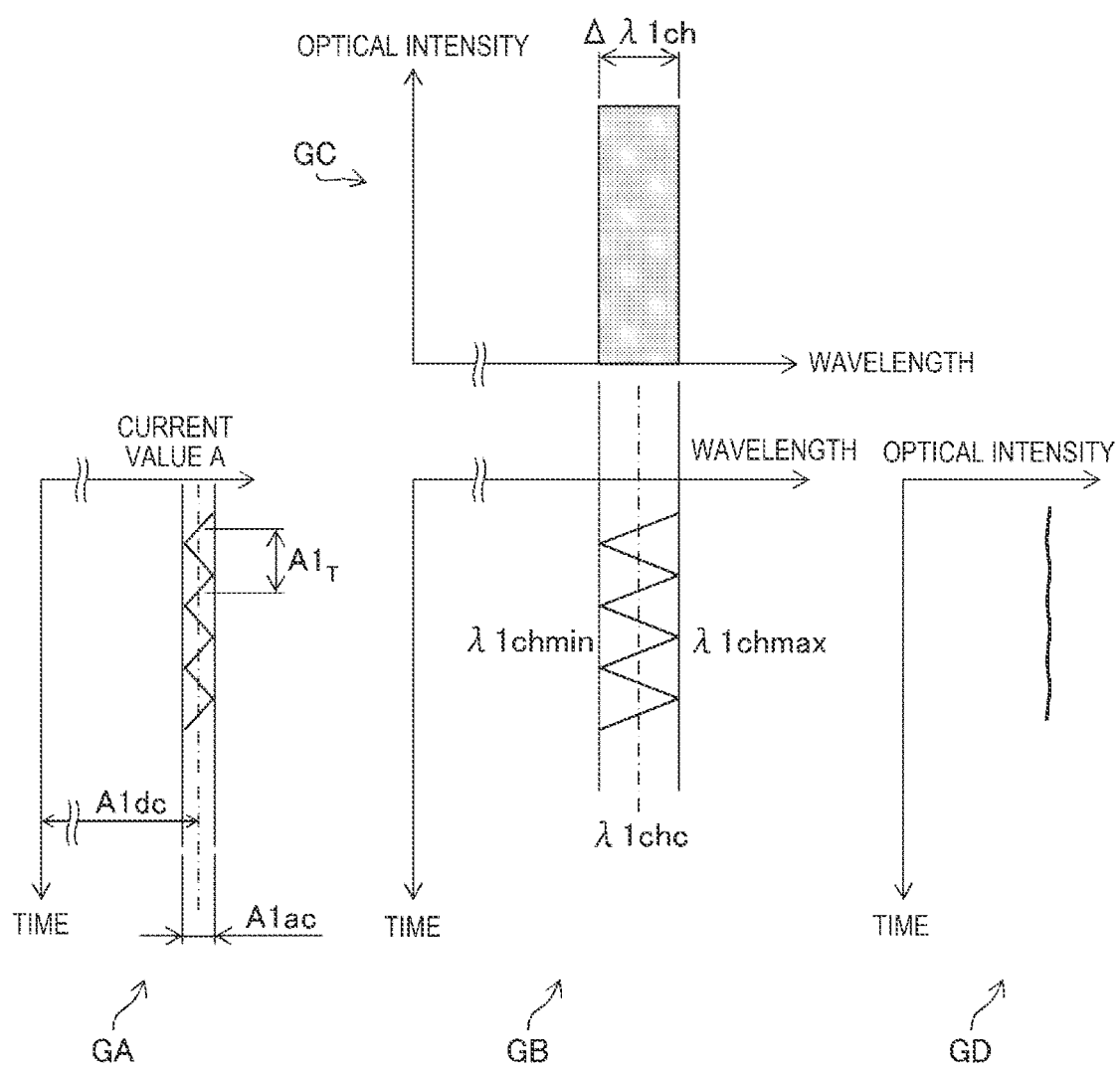
FIG. 23 is a descriptive diagram showing the relationship among the current flowing through the first semiconductor laser, a change in the wavelength due to the chirping, the spectrum waveform, and the optical intensity.

FIG. 23 is a descriptive diagram showing the relationship among the current flowing through the first semiconductor laser, a change in the wavelength due to the chirping, the spectrum waveform, and the optical intensity. The graph GA displayed in the lower left portion of FIG. 23 is a graph showing a change in the current value A. The graph GB displayed in the lower central portion of FIG. 23 is a graph showing the chirping produced by the current indicated by the graph GA. The graph GC displayed in the upper portion of FIG. 23 schematically shows the spectrum waveform generated by the chirping indicated by the graph GB. The graph GD displayed in the lower right portion of FIG. 23 is a graph showing a change in the optical intensity of the laser light produced by the current indicated by the graph GA and outputted from the first semiconductor laser 111.

The current control parameters of the first semiconductor laser system 160 include the following values, as indicated by the graph GA.

A1dc: DC component value of current flowing through semiconductor element

A1ac: Variation width of AC component of current flowing through semiconductor element (difference between maximum and minimum of current)

A1T: Cycle of AC component of current flowing through semiconductor element

In the example shown in FIG. 23, a triangular wave is presented as an example of the AC component out of the current control parameters, and FIG. 23 shows a case where the variation in the triangular wave current results in a small variation in optical intensity.

The relationship between a time width D of the pluses amplified by the first semiconductor optical amplifier 120 and the cycle A1T of the AC component preferably satisfies Expression (2) below.

$$D = n \cdot A1T, \; n \text{ is an integer greater than or equal to one.} \quad (2)$$

When the relationship in Expression (2) is satisfied, the pulse amplification can be performed at any timing by the first semiconductor optical amplifier 120 with a suppressed change in the spectrum waveform of the amplified pulsed laser light.

Even when Expression (2) is not satisfied, the width of the pulses amplified by the first semiconductor optical amplifier 120 ranges, for example, from 10 to 50 ns. The cycle A1T of the AC component of the current flowing through the semiconductor element is sufficiently shorter than the width of the pulses amplified by the first semiconductor optical amplifier 120 (time width D of amplified pulses). For example, the cycle is preferably greater than or equal to $1/1000$ of the width of the pulses amplified by the first semiconductor optical amplifier 120 but smaller than or equal to 1/10 of the pulse width. The cycle may further preferably be greater than or equal to 1/1000 of the pulse width but smaller than or equal to 1/100 of the pulse width.

Figure 24:
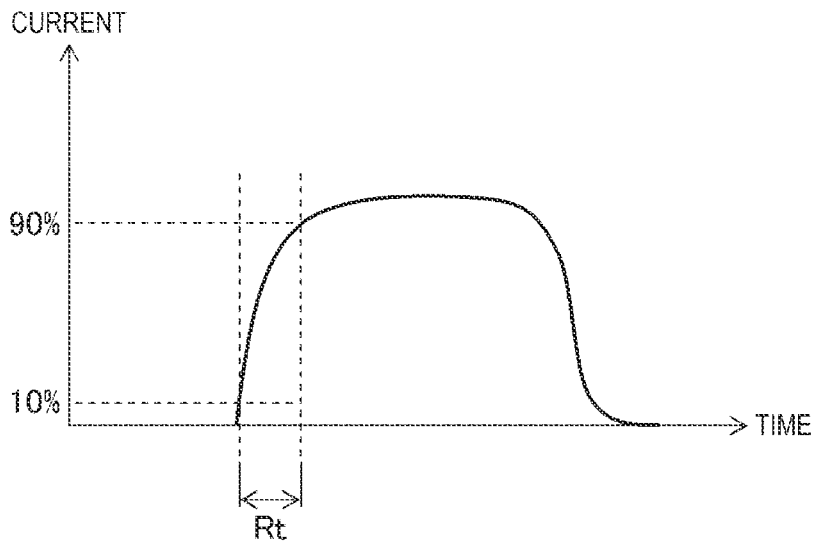
FIG. 24 is a graph for describing a rising period of a first semiconductor optical amplifier.

A rising period of the first semiconductor optical amplifier 120 is preferably, for example, shorter than or equal to 2 ns, further preferably shorter than or equal to 1 ns. The rising period used herein refers to a period Rt required for the amplitude of the waveform of the pulse current to increase from 10% of the maximum amplitude to 90% thereof, as shown in FIG. 24.

4.3.1 Others

In the example shown in FIG. 23, a triangular wave is presented as an example of the waveform of the AC component of the current, but not necessarily. For example, a waveform that changes on a fixed cycle basis may be used. Examples of the waveform of the AC component other than a triangular wave may include a sinusoidal wave and a rectangular wave.

4.4 Example of Processes Carried Out by Laser Control Section

Figure 25:
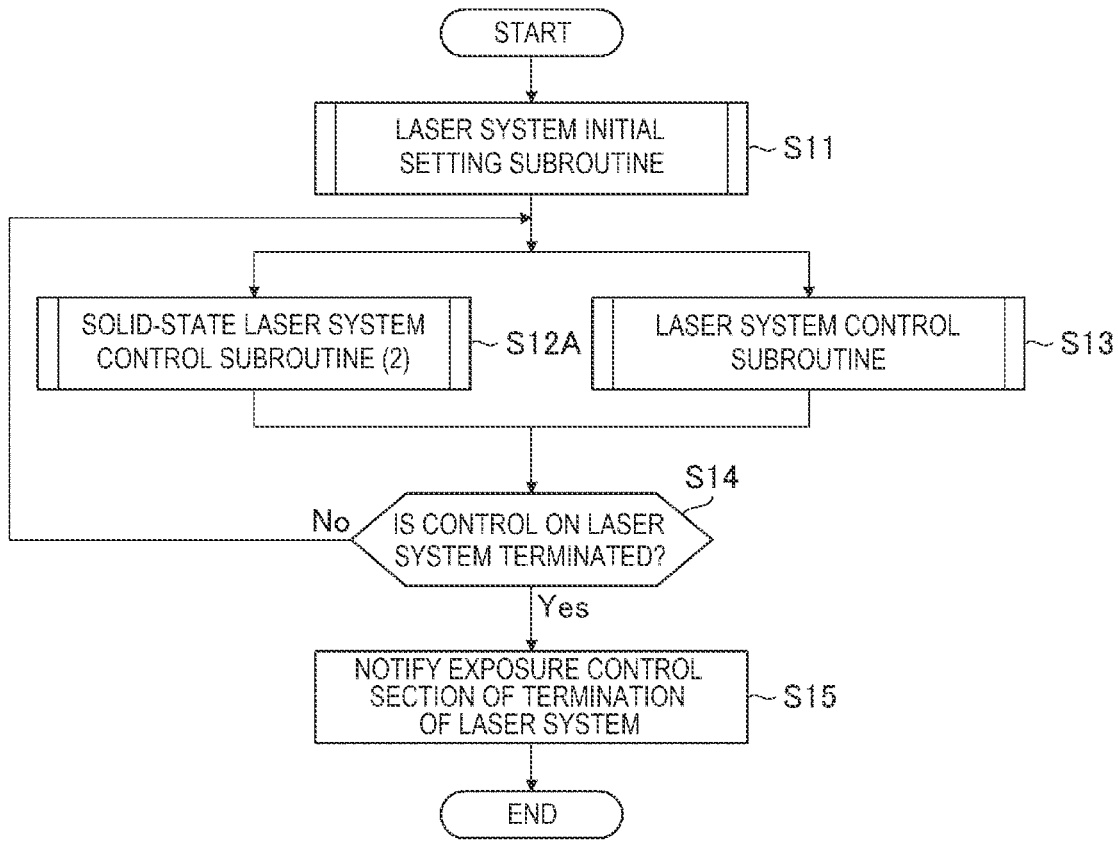
FIG. 25 is a flowchart showing an example of the content of processes carried out by the laser control section.

FIG. 25 is a flowchart showing an example of the content of processes carried out by the laser control section 18. The flowchart of FIG. 25 can be applied in place of the flowchart of FIG. 8. Differences from FIG. 8 will be described.

The flowchart shown in FIG. 25 includes step S12A in place of step S12 in FIG. 8. In step S12A, the laser control section 18 carries out processes in a control subroutine (2) of controlling the solid-state laser system 10.

Figure 26:
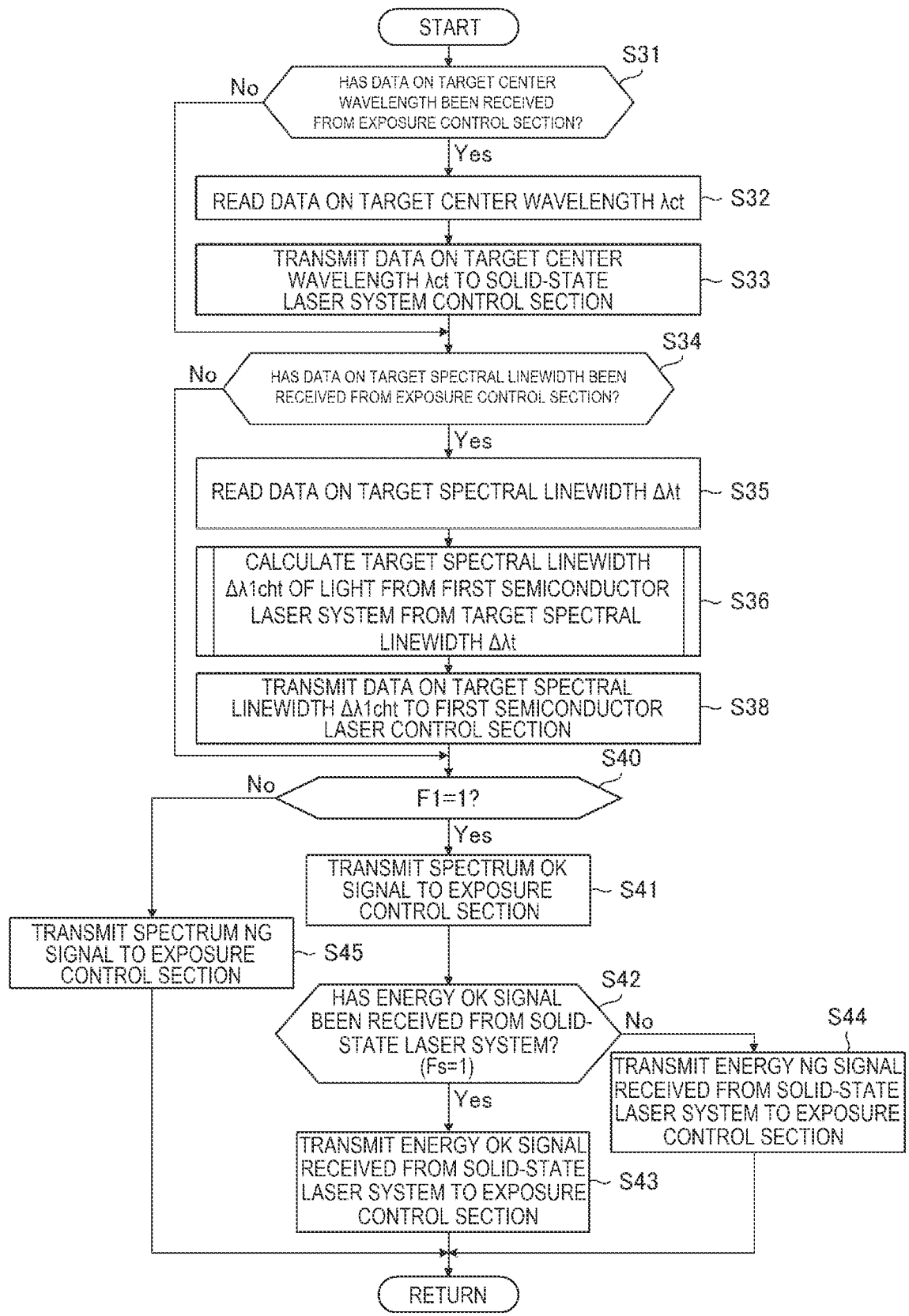
FIG. 26 is a flowchart showing an example of a control subroutine (2) of controlling the solid-state laser system.

FIG. 26 is a flowchart showing an example of the control subroutine (2) of controlling the solid-state laser system. The flowchart of FIG. 26 is applied to step S12A in FIG. 25. Differences in the flowchart between FIG. 26 and FIG. 10 will be described.

The flowchart shown in FIG. 26 includes steps S34 to S38 between steps S33 and S40.

When the result of the evaluation in step S31 is No or after step S33, the laser control section 18 proceeds to step S34.

In step S34, the laser control section 18 evaluates whether or not it has received the data on the target spectral linewidth from the exposure control section 22.

When the result of the evaluation in step S34 is Yes, that is, when data on a new target spectral linewidth has been received from the exposure control section 22, the laser control section 18 proceeds to step S35 and reads the data on the target spectral linewidth $\Delta\lambda t$.

Thereafter, in step S36, the laser control section 18 calculates from the target spectral linewidth $\Delta\lambda t$ the target spectral linewidth $\Delta\lambda 1cht$ of the first semiconductor laser system 160.

Thereafter, in step S38, the laser control section 18 transmits data on the target spectral linewidth $\Delta\lambda 1cht$ to the solid-state laser system control section 350.

After step S38, the laser control section 18 proceeds to step S40. When the result of the evaluation in step S34 is No, the laser control section 18 skips steps S35 to S38 and proceeds to step S40. The content of the processes after step S40 has been described in the flowchart of FIG. 10.

Figure 27:
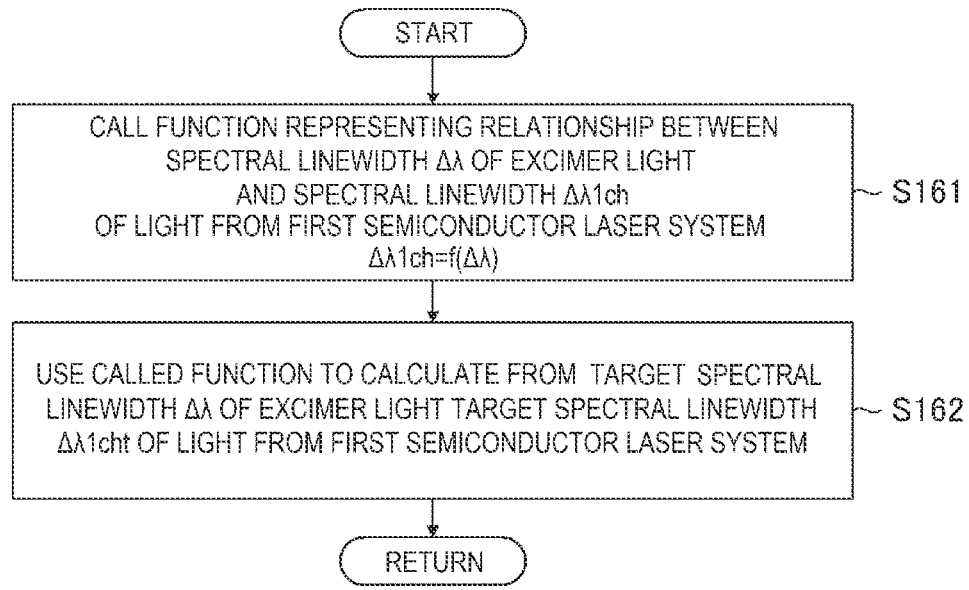
FIG. 27 is a flowchart showing an example of the process of calculating a target spectral linewidth $\Delta\lambda 1cht$ of a first semiconductor laser system.

FIG. 27 is a flowchart showing an example of the process of calculating the target spectral linewidth $\Delta\lambda 1cht$ of the first semiconductor laser system 160. The flowchart shown in FIG. 27 is applied to step S36 in FIG. 26.

In step S161 in FIG. 27, the laser control section 18 calls a function $\Delta\lambda 1ch=f(\Delta\lambda)$ representing the relationship between the spectral linewidth $\Delta\lambda$ of the excimer light and the spectral linewidth $\Delta\lambda 1ch$ of the light from the first semiconductor laser system.

Figure 28:
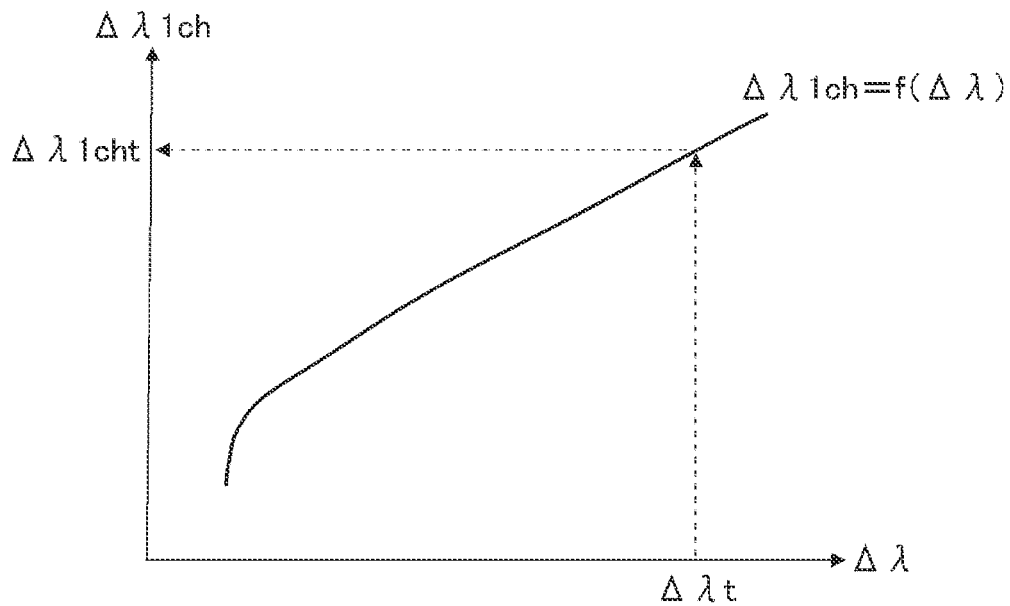
FIG. 28 is a graph showing an example of a function representing the relationship between a spectral linewidth $\Delta\lambda$ of excimer light and a spectral linewidth $\Delta\lambda 1ch$ of the light from the first semiconductor laser system.

FIG. 28 shows an example of the function $\Delta\lambda 1ch=f(\Delta\lambda)$. FIG. 28 is a graph showing an example of the function representing the relationship between the spectral linewidth $\Delta\lambda$ of the excimer light and the spectral linewidth $\Delta\lambda 1ch$ of the light from the first semiconductor laser system 160. The function described above is provided, for example, by measuring in advance the spectral linewidth $\Delta\lambda$ of the pulsed laser light amplified by the excimer amplifier 14 and data on the spectral linewidth $\Delta\lambda 1ch$ of the pulsed laser light outputted from the first semiconductor laser system 160 and determining an approximate function from the result of the measurement.

The laser control section 18 can calculate $\Delta\lambda 1cht$ from $\Delta\lambda t$ by calling an approximate function, such as that in FIG. 28, from the memory.

In step S162 in FIG. 27, the laser control section 18 uses the called function to calculate from the target spectral linewidth $\Delta\lambda t$ of the excimer light the target spectral linewidth $\Delta\lambda 1cht$ of the first semiconductor laser system 160.

After step S162, the laser control section 18 terminates the flowchart of FIG. 27 and returns to the flowchart of FIG. 26.

In place of the function shown in FIG. 28, table data may be stored in the memory, and $\Delta\lambda 1cht$ may be calculated from $\Delta\lambda t$ by calling the table data.

Figure 29:
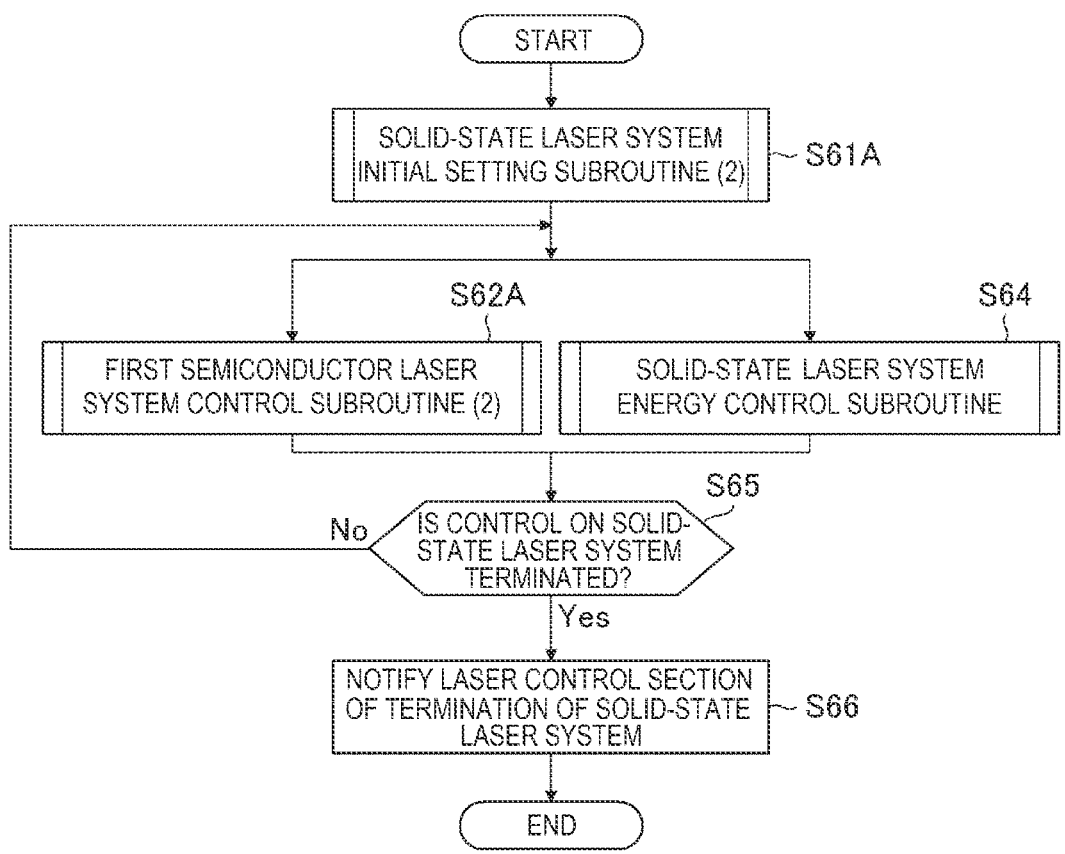
FIG. 29 is a flowchart showing an example of the content of processes carried out by the solid-state laser system control section.

4.5 Example of Processes Carried Out by Solid-State Laser System Control Section FIG. 29 is a flowchart showing an example of the content of processes carried out by the solid-state laser system control section 350. The flowchart of FIG. 29 can be applied in place of the flowchart of FIG. 12. Differences from FIG. 12 will be described.

The flowchart shown in FIG. 29 includes steps S61A and S62A in place of steps S61 and S62 in FIG. 12.

In step S61A, the solid-state laser system control section 350 carries out processes in a subroutine (2) of an initial setting of the solid-state laser system.

In step S62A, the solid-state laser system control section 350 carries out processes in a control subroutine of controlling the first semiconductor laser system 160.

Figure 30:
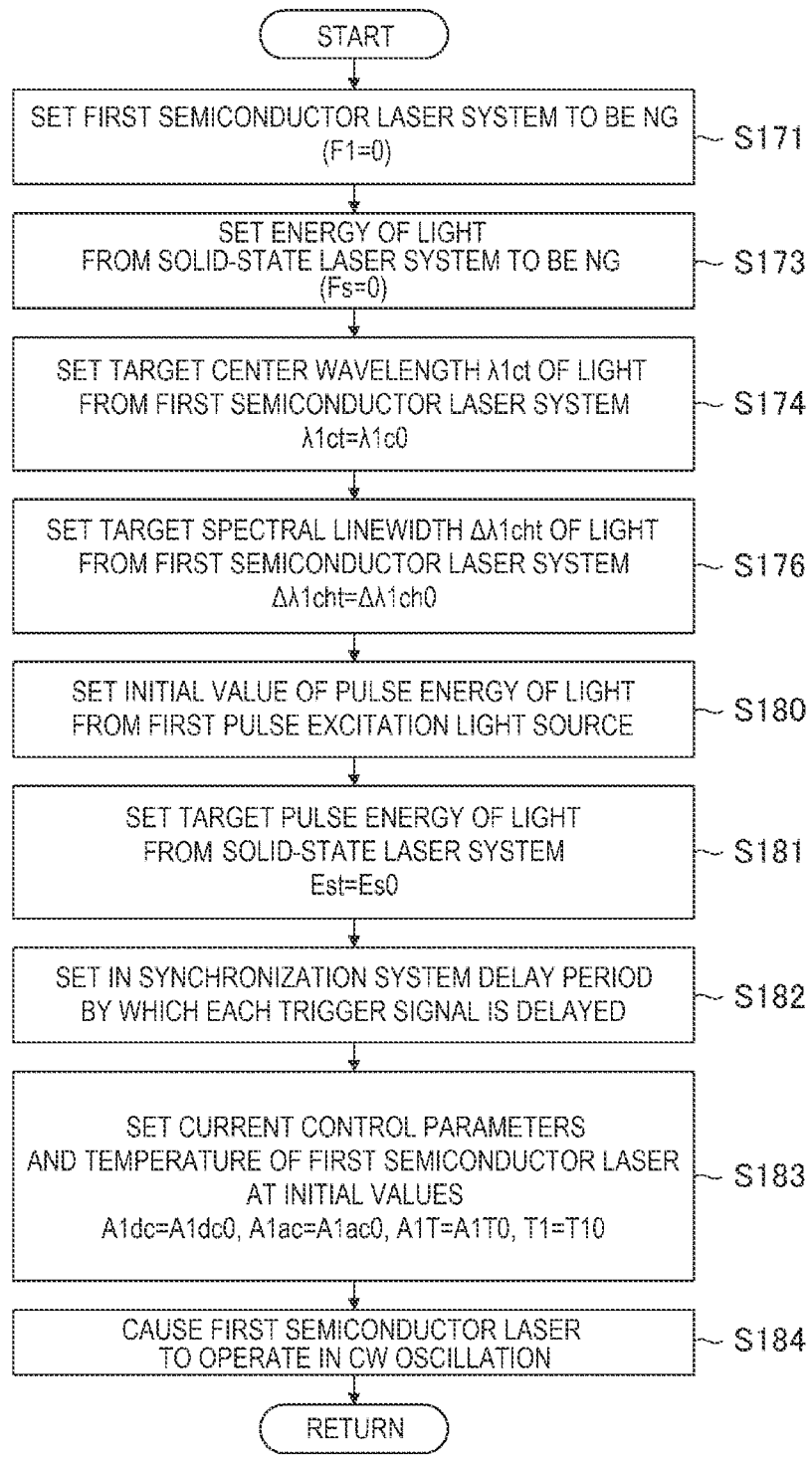
FIG. 30 is a flowchart showing an example of a subroutine (2) of the initial setting of the solid-state laser system.

FIG. 30 is a flowchart showing an example of the subroutine (2) of the initial setting of the solid-state laser system. The flowchart shown in FIG. 30 is applied to step S61A in FIG. 29.

In step S171 in FIG. 30, the solid-state laser system control section 350 sets the flag signal representing the state of the first semiconductor laser system 160 to be NG. That is, the solid-state laser system control section 350 sets the value of the flag F1 at "0".

In step S173, the solid-state laser system control section 350 sets the flag signal representing the state of the energy of the light from the solid-state laser system 10 to be NG. That is, the solid-state laser system control section 350 sets the value of the flag Fs at "0".

In step S174, the solid-state laser system control section 350 sets the target center wavelength $\lambda 1ct$ of the light from the first semiconductor laser system 160 at the initial value $\lambda 1c0$. The initial value $\lambda 1c0$ may be set, for example, at 1547.2 nm.

In step S176, the solid-state laser system control section 350 sets the target spectral linewidth $\Delta\lambda 1cht$ of the first semiconductor laser system 160 resulting from the chirping at an initial value $\Delta\lambda 1ch0$. In the description, the target spectral linewidth $\Delta\lambda 1cht$ is set at an initial value $\Delta\lambda 1ch0$ that is a spectral linewidth that can suppress occurrence of SBS in the Er fiber amplifier 140.

In step S180, the solid-state laser system control section 350 sets the initial value of the pulse energy of the light from the first pulse excitation light source 132.

In step S181, the solid-state laser system control section 350 sets the target pulse energy Est of the light from the solid-state laser system 10 at the initial value Es0.

In step S182, the solid-state laser system control section 350 sets in the synchronization system 17 a delay period by which each of the trigger signals is delayed.

In step S183, the solid-state laser system control section 350 sets the current control parameters and the temperature of the first semiconductor laser 111 at respective initial values. That is, the DC component value A1$dc$, the variation width A1$ac$ of the AC component, and the cycle A1T of the AC component out of the current control parameters, and the temperature T1 are set at respective initial values, A1$dc$=A1dc0, A1$ac$=A1ac0, A1T=A1T0, and T1=T10. The initial values are values of the current control parameters and a value of the temperature that allow the oscillation wavelength and the spectral linewidth of the light from the first semiconductor laser 111 to be values close to $\lambda 1c0$ and $\Delta\lambda 1ch0$.

In step S184, the solid-state laser system control section 350 causes the first semiconductor laser 111 to operate in the CW oscillation in accordance with the settings made in step S183.

After step S184, the solid-state laser system control section 350 terminates the flowchart of FIG. 30 and returns to the flowchart of FIG. 25.

Figure 31:
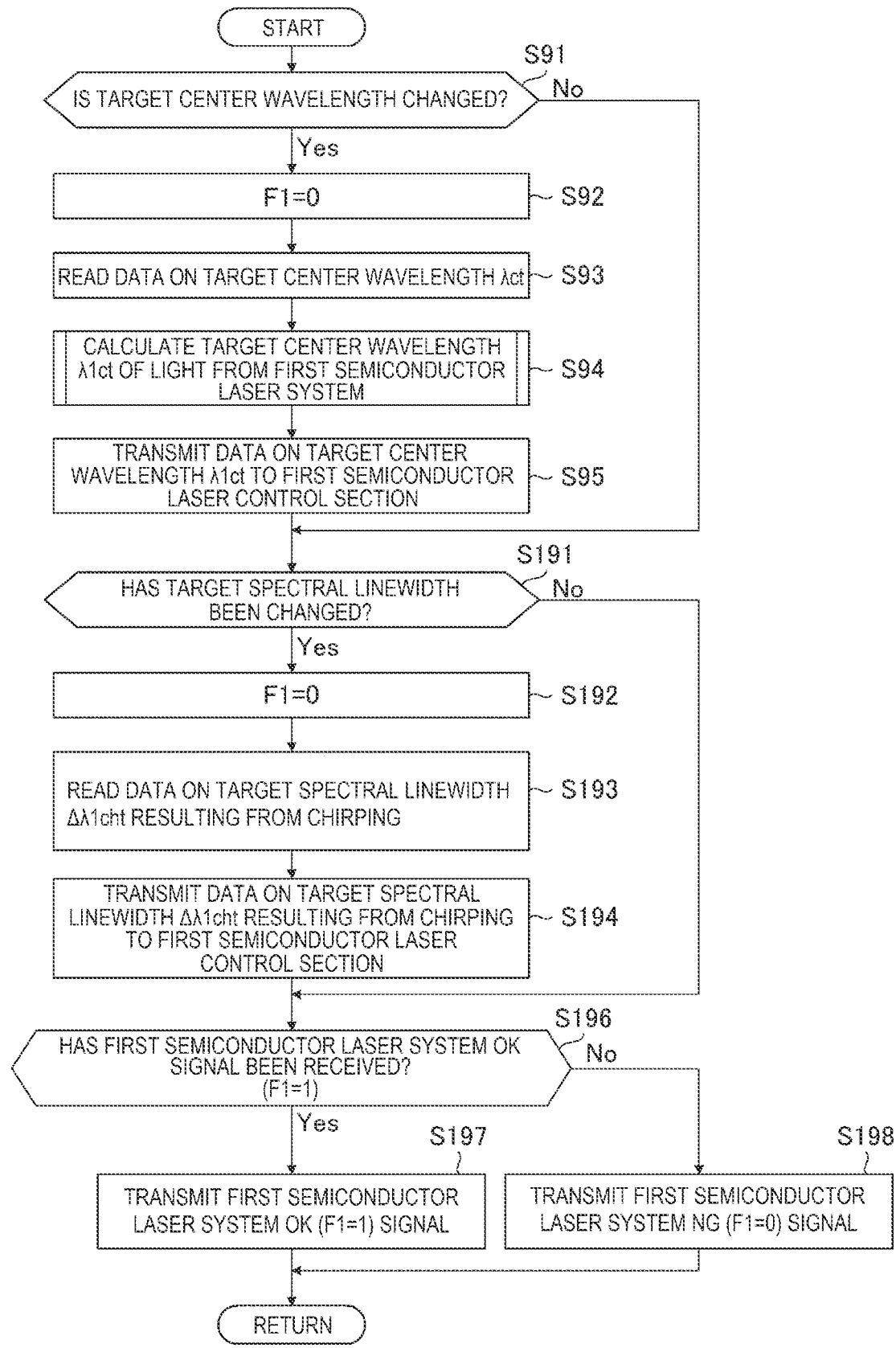
FIG. 31 is a flowchart showing an example of the control subroutine of controlling the first semiconductor laser system.

FIG. 31 is a flowchart showing an example of the control subroutine of controlling the first semiconductor laser system 160. The flowchart of FIG. 31 is applied to step S62A in FIG. 29.

Steps S91 to S95 in the flowchart of FIG. 31 are the same as those in FIG. 14. In FIG. 31, after step S95 or when the result of the evaluation in step S91 is No, the solid-state laser system control section 350 proceeds to step S191.

In step S191, the solid-state laser system control section 350 evaluates whether or not the target spectral linewidth has been changed. When the result of the evaluation in step S191 is Yes, that is, when the target spectral linewidth has been changed, the solid-state laser system control section 350 proceeds to step S192, where the solid-state laser system control section 350 transmits the flag signal representing F1=0, which shows that the state of the first semiconductor laser system 160 is the NG state, to the laser control section 18.

Thereafter, in step S193, the solid-state laser system control section 350 reads the data on the target spectral linewidth $\Delta\lambda 1cht$ resulting from the chirping.

In step S194, the solid-state laser system control section 350 transmits the data on the target spectral linewidth $\Delta\lambda 1cht$ resulting from the chirping to the first semiconductor laser control section 114.

After step S194, the solid-state laser system control section 350 proceeds to step S196. When the result of the evaluation in step S191 is No, that is, when the exposure control section 22 has not requested a change in the target spectral linewidth, the solid-state laser system control section 350 skips steps S192 to S194 and proceeds to step S196.

In step S196, the solid-state laser system control section 350 evaluates whether or not it has received the OK signal from the first semiconductor laser system 160.

When the result of the evaluation in step S196 is Yes, the solid-state laser system control section 350 proceeds to step S197, where the solid-state laser system control section 350 transmits the flag signal representing F1=1 to the laser control section 18.

When the result of the evaluation in step S196 is No, the solid-state laser system control section 350 proceeds to step S198, where the solid-state laser system control section 350 transmits the flag signal representing F1=0 to the laser control section 18.

After step S197 or S198, the solid-state laser system control section 350 terminates the flowchart of FIG. 31 and returns to the flowchart of FIG. 29.

Figure 32:
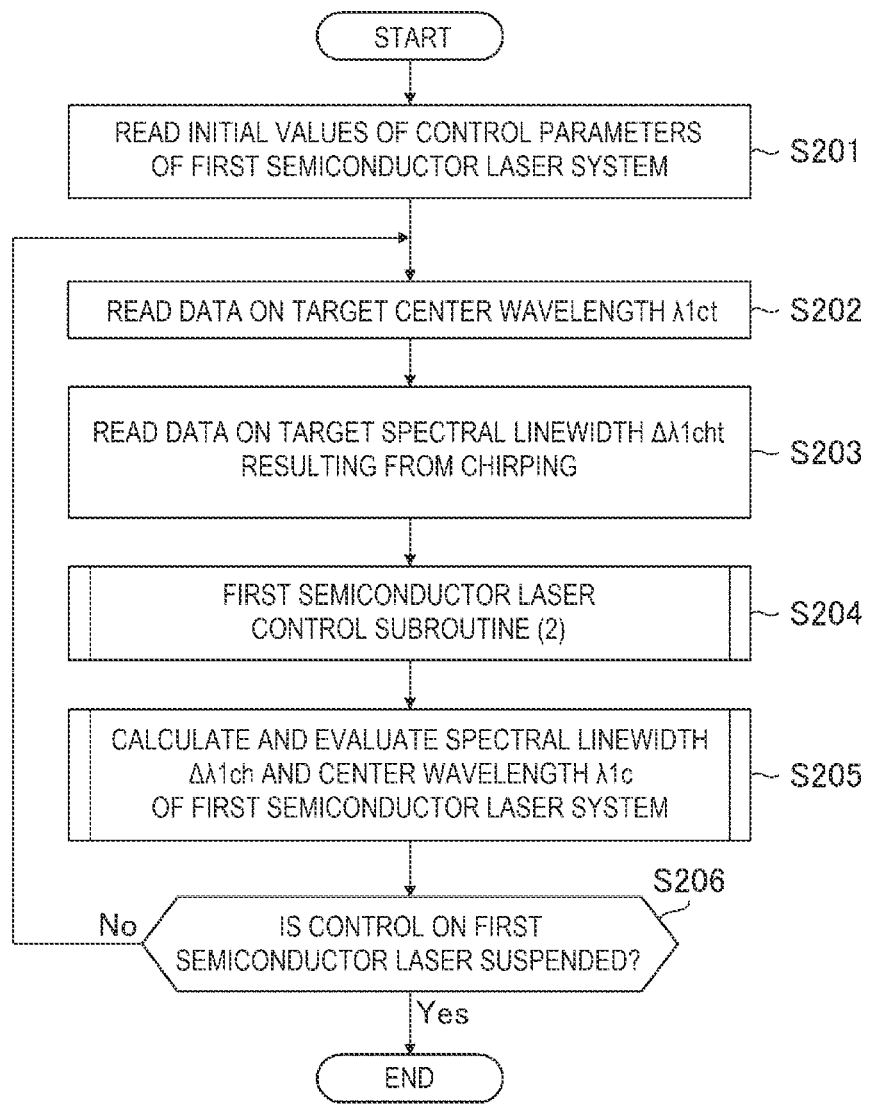
FIG. 32 is a flowchart showing an example of the content of processes carried out by the first semiconductor laser control section.

4.6 Example of Processes Carried Out by First Semiconductor Laser Control Section FIG. 32 is a flowchart showing an example of the content of processes carried out by the first semiconductor laser control section 114. The processes and operation shown in the flowchart of FIG. 32 are achieved when a processor configured to function as the first semiconductor laser control section 114 executes a program.

In step S201, the first semiconductor laser control section 114 reads initial values of control parameters of the first semiconductor laser system 160. The control parameters include the target center wavelength $\lambda 1ct$, the target spectral linewidth $\Delta\lambda 1cht$, the current control parameters of the first semiconductor laser 111 {A1$dc$, A1$ac$, and A1T}, and the temperature T1. In the description, the control parameters are set as follows: $\lambda 1ct=\lambda 1c0$; $\Delta\lambda 1cht=\Delta\lambda 1ch10$; A1$dc$=A1dc0; A1$ac$=A1ac0; A1T=A1T0; and T1=T10.

In step S202, the first semiconductor laser control section 114 reads data on the target center wavelength $\lambda 1ct$.

In step S203, the first semiconductor laser control section 114 reads data on the target spectral linewidth $\Delta\lambda 1cht$ resulting from the chirping.

In step S204, the first semiconductor laser control section 114 carries out processes in a control subroutine (2) of controlling the first semiconductor laser. The content of the process in step S204 will be described later with reference to FIG. 33. After step S204, the first semiconductor laser control section 114 proceeds to step S205.

In step S205, the first semiconductor laser control section 114 calculates the spectral linewidth $\Delta\lambda 1ch$ and the center wavelength $\lambda 1c$ of the light from the first semiconductor laser system 160 and evaluates whether or not the difference between each of the spectral linewidth $\Delta\lambda 1ch$ and the center wavelength $\lambda 1c$ and the target value thereof falls within an acceptable range.

Thereafter, in step S206, the first semiconductor laser control section 114 evaluates whether or not the control on the first semiconductor laser 111 is suspended. When the result of the evaluation in step S206 is No, the first semiconductor laser control section 114 returns to step S202 and repeats steps S202 to S206.

When the result of the evaluation in step S206 is Yes, the first semiconductor laser control section 114 terminates the flowchart of FIG. 32.

FIG. 33 is a flowchart showing Example 1 of the control subroutine (2) of controlling the first semiconductor laser. The flowchart of FIG. 33 is applied to step S204 in FIG. 32.

The flowchart of FIG. 33 is an example in which the value of the variation width of the AC component (AC component value) out of the current control parameters is controlled when the spectral linewidth is changed and the DC component value out of the current control parameters is controlled when the center wavelength is changed.

In step S211 in FIG. 33, the first semiconductor laser control section 114 causes the first spectrum monitor 166 to measure the center wavelength $\lambda 1c$ and the spectral linewidth $\Delta\lambda 1ch$ of the light from the first semiconductor laser 111.

In step S212, the first semiconductor laser control section 114 calculates the difference $\Delta\Delta\lambda 1ch$ between the spectral linewidth measured by the first spectrum monitor 166 and the target spectral linewidth.

$$\Delta\Delta\lambda 1ch = \Delta\lambda 1ch - \Delta\lambda 1cht \qquad (3)$$

Thereafter, in step S213, the first semiconductor laser control section 114 evaluates whether or not the absolute value of $\Delta\Delta\lambda 1ch$ is smaller than or equal to an acceptable upper limit $\Delta\Delta\lambda 1tr$ representing an acceptable range. When the result of the evaluation in step S213 is Yes, the first semiconductor laser control section 114 proceeds to step S215.

In step S215, the first semiconductor laser control section 114 calculates the difference $\delta\lambda 1c$ between the center wavelength measured by the first spectrum monitor 166 and the target center wavelength.

$$\delta\lambda 1c = \lambda 1c - \lambda 1ct \qquad (4)$$

Thereafter, in step S216, the first semiconductor laser control section 114 evaluates whether or not the absolute value of $\delta\lambda 1c$ is smaller than or equal to an acceptable upper limit $\delta\lambda 1tr$ representing an acceptable range. When the result of the evaluation in step S216 is No, the first semiconductor laser control section 114 proceeds to step S217.

In step S217, the first semiconductor laser control section 114 controls the current value of the DC component, that is, the DC component value A1$dc$, out of the current control parameters of the first semiconductor laser 111 in such a way that $\delta\lambda 1c$ approaches zero.

When the result of the evaluation in step S213 is No, the first semiconductor laser control section 114 proceeds to step S219. In step S219, the first semiconductor laser control section 114 controls the varying current value of the AC component, that is, the AC component value A1$ac$, out of the current control parameters of the first semiconductor laser 111 in such a way that $\Delta\Delta\lambda 1ch$ approaches zero.

After step S217 or S219 or when the result of the evaluation in step S216 is Yes, the first semiconductor laser control section 114 terminates the flowchart of FIG. 33 and returns to the flowchart of FIG. 32.

Figure 34:
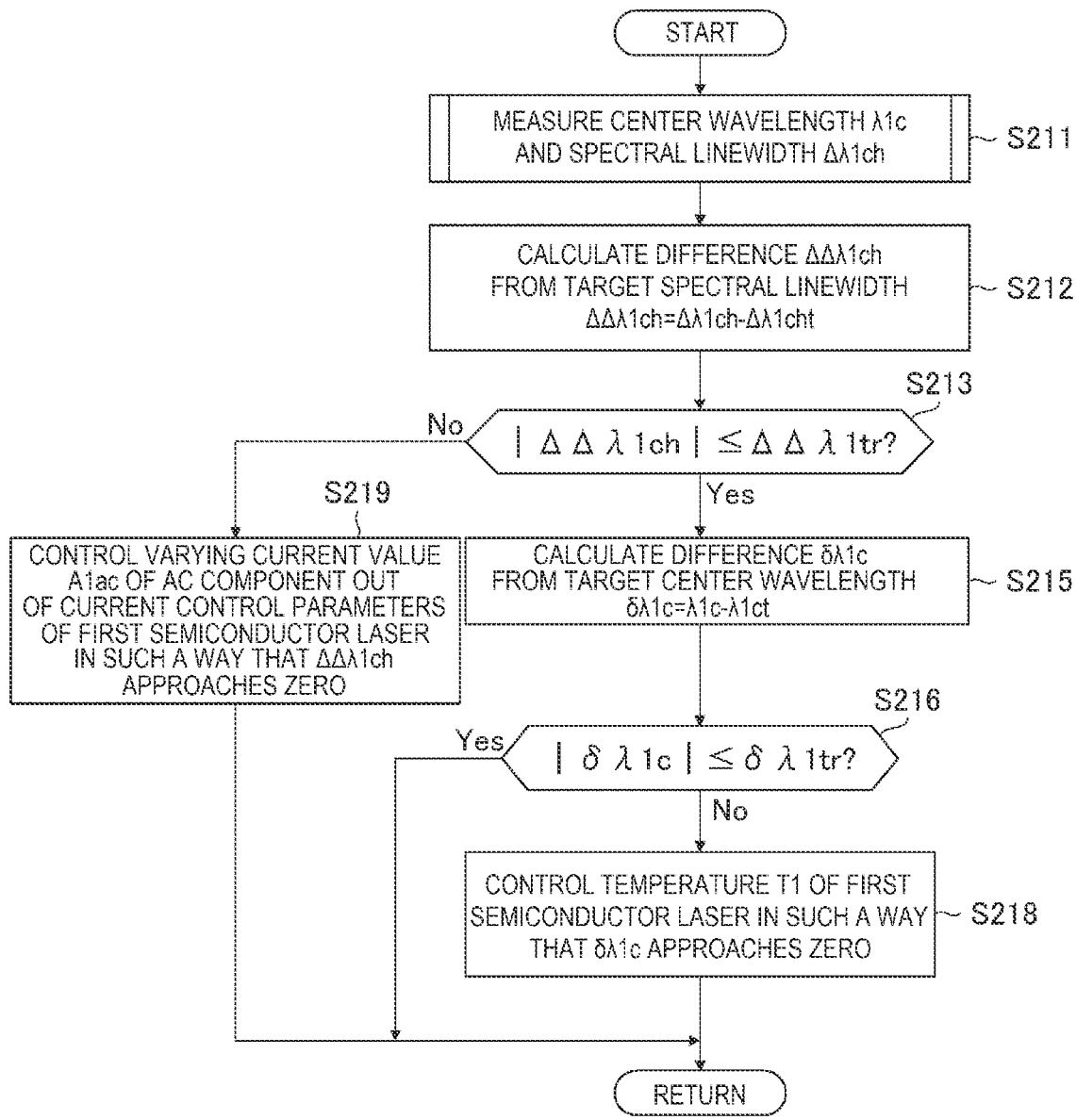
FIG. 34 is a flowchart showing Example 2 of the control subroutine (2) of controlling the first semiconductor laser.

FIG. 34 is a flowchart showing Example 2 of the control subroutine (2) of controlling the first semiconductor laser. The flowchart of FIG. 34 is applied to step S204 in FIG. 32. The flowchart of FIG. 34 is an example in which the AC component value out of the current control parameters is controlled when the spectral linewidth is changed and the temperature is controlled when the center wavelength is changed.

The flowchart shown in FIG. 34 includes step S218 in place of step S217 in FIG. 33.

When the result of the evaluation in step S216 in FIG. 34 is No, the first semiconductor laser control section 114 proceeds to step S218. In step S218, the first semiconductor laser control section 114 controls the temperature T1 of the first semiconductor laser in such away that $\delta\lambda 1c$ approaches zero. After step S218, the first semiconductor laser control section 114 terminates the flowchart of FIG. 34 and returns to the flowchart of FIG. 32.

Figure 35:
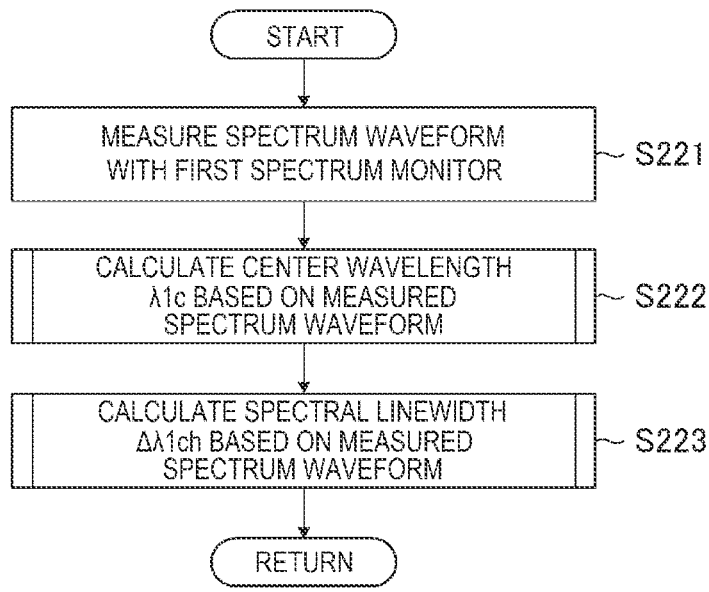
FIG. 35 is a flowchart showing an example of the process of measuring a center wavelength $\lambda 1c$ and the spectral linewidth $\Delta\lambda 1ch$.

FIG. 35 is a flowchart showing an example of the process of measuring the center wavelength $\lambda 1c$ and the spectral linewidth $\Delta\lambda 1ch$. The flowchart of FIG. 35 is applied to step S211 in FIG. 33.

In step S221 in FIG. 35, the first semiconductor laser control section 114 causes the first spectrum monitor 166 to measure the spectrum waveform.

In step S222, the first semiconductor laser control section 114 calculates the center wavelength $\lambda 1c$ based on the spectrum waveform measured by the first spectrum monitor 166.

In step S223, the first semiconductor laser control section 114 calculates the spectral linewidth $\Delta\lambda 1ch$ based on the spectrum waveform measured by the first spectrum monitor 166.

After step S223, the first semiconductor laser control section 114 terminates the flowchart of FIG. 35 and returns to the flowchart of FIG. 33.

Figure 36:
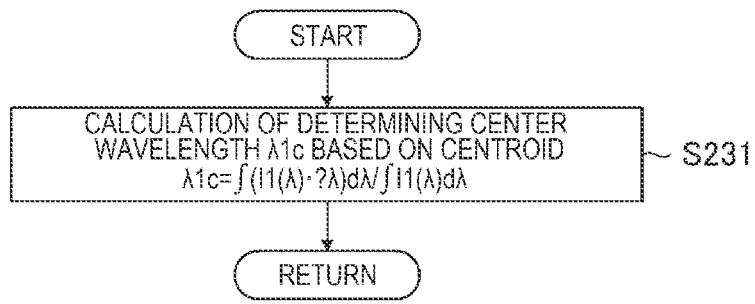
FIG. 36 is a flowchart showing Example 1 of the process of calculating the center wavelength $\lambda 1c$ based on the spectrum waveform measured by a first spectrum monitor.

FIG. 36 is a flowchart showing Example 1 of the process of calculating the center wavelength $\lambda 1c$ based on the spectrum waveform measured by the first spectrum monitor 166. The description will be made of calculation of a centroid wavelength. The flowchart of FIG. 36 is applied to step S222 in FIG. 35.

In step S231 in FIG. 36, the first semiconductor laser control section 114 calculates the center wavelength $\lambda 1c$ based on the centroid of the spectrum waveform.

$$\lambda 1c = \int (I1(\lambda)\cdot\lambda)d\lambda / \int I1(\lambda)d\lambda \qquad (5)$$

Figure 37:
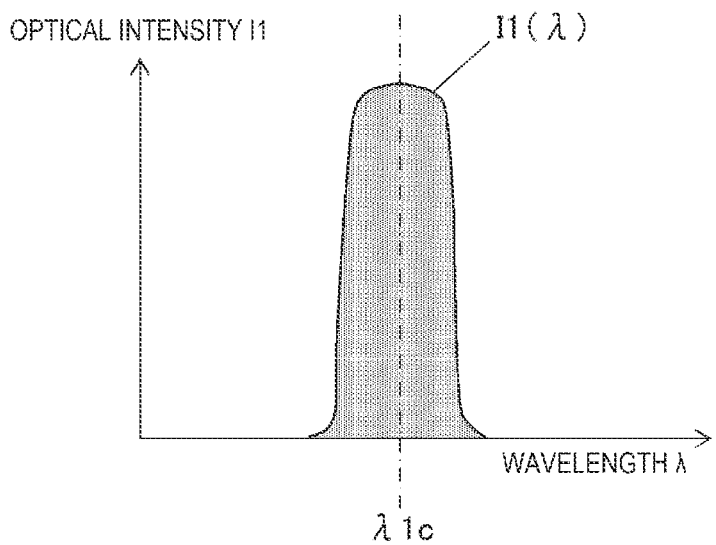
FIG. 37 shows an example of the spectrum waveform measured by the first spectrum monitor and is a descriptive diagram of the process of calculating the center wavelength $\lambda 1c$ based on the centroid of the spectrum waveform.

FIG. 37 shows an example of the spectrum waveform measured by the first spectrum monitor 166 and is a descriptive diagram of the process of calculating the center wavelength $\lambda 1c$ based on the centroid of the spectrum waveform. The member $I1(\lambda)$ in Expression (5) is a function representing optical intensity I1 at the wavelength $\lambda$.

After step S231 in FIG. 36, the first semiconductor laser control section 114 terminates the flowchart of FIG. 36 and returns to the flowchart of FIG. 35.

Figure 38:
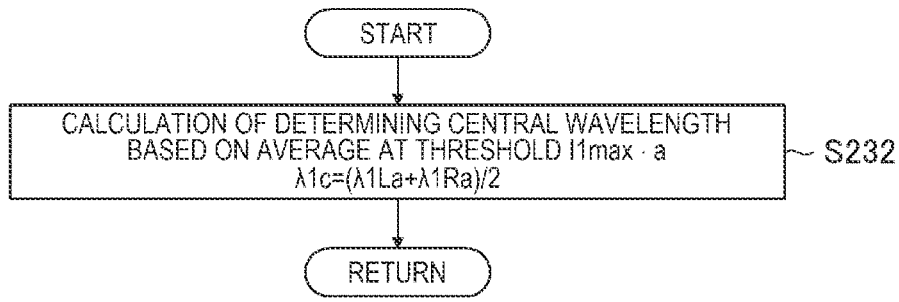
FIG. 38 is a flowchart showing Example 2 of the process of calculating the center wavelength $\lambda 1c$ based on the spectrum waveform measured by the first spectrum monitor.

FIG. 38 is a flowchart showing Example 2 of the process of calculating the center wavelength $\lambda 1c$ based on the spectrum waveform measured by the first spectrum monitor 166. The description will be made of calculation of the center wavelength based on the average of the maximum wavelength and the minimum wavelength at an optical intensity threshold I1max·a of the spectrum waveform. The flowchart of FIG. 38 is applied to step S222 in FIG. 35.

Figure 39:
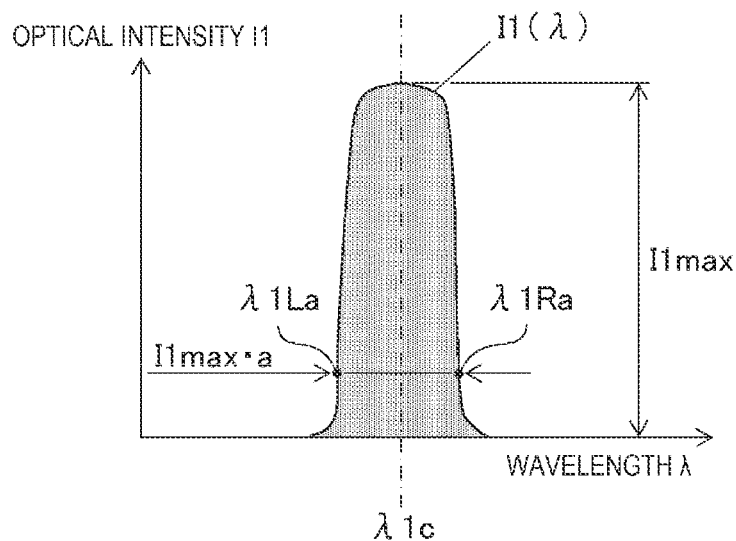
FIG. 39 shows an example of the spectrum waveform measured by the first spectrum monitor and is a descriptive diagram of the process of calculating the center wavelength $\lambda 1c$ based on the spectrum waveform.

FIG. 39 shows an example of the spectrum waveform measured by the first spectrum monitor 166 and is a descriptive diagram of the process of calculating the center wavelength $\lambda 1c$ based on the spectrum waveform.

In step S232 in FIG. 38, the first semiconductor laser control section 114 performs calculation of determining the center wavelength $\lambda 1c$ based on the average of a maximum wavelength $\lambda 1Ra$ and a minimum wavelength $\lambda 1La$ within a wavelength region (bandwidth) where the optical intensity is greater than or equal to the optical intensity threshold I1max·a of the spectrum waveform. The symbol a represents a constant, for example, greater than or equal to 0.05 but smaller than or equal to 0.5.

$$\lambda 1c = (\lambda 1La + \lambda 1Ra)/2 \qquad (6)$$

Let I1max be the maximum optical intensity of the spectrum waveform, and the calculation may be performed by assuming that the average of the maximum and minimum in the bandwidth at the optical intensity threshold I1max·a is the center wavelength $\lambda 1c$, as shown in FIG. 39.

After step S232 in FIG. 38, the first semiconductor laser control section 114 terminates the flowchart of FIG. 38 and returns to the flowchart of FIG. 35.

Figure 40:
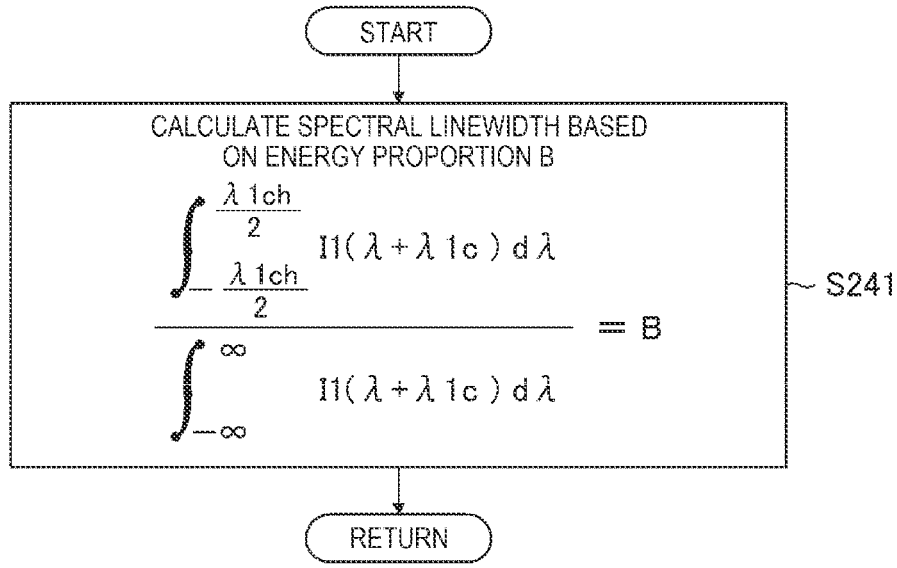
FIG. 40 is a flowchart showing Example 1 of the process of calculating the spectral linewidth $\Delta\lambda 1ch$ based on the spectrum waveform measured by the first spectrum monitor.

FIG. 40 is a flowchart showing Example 1 of the process of calculating the spectral linewidth $\Delta\lambda 1ch$ based on the spectrum waveform measured by the first spectrum monitor 166. The description will be made of calculation of the spectral linewidth based on the energy proportion of the spectrum waveform. The flowchart of FIG. 40 is applied to step S223 in FIG. 35.

Figure 41:
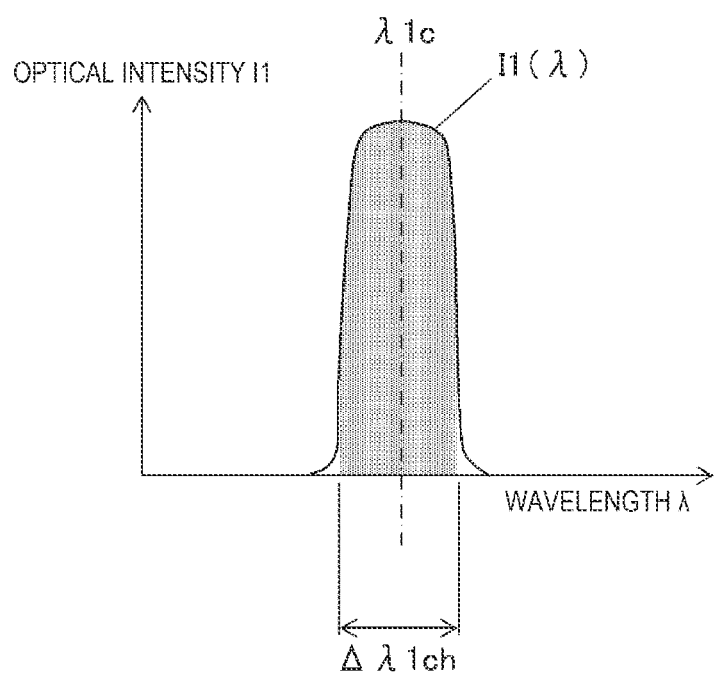
FIG. 41 shows an example of the spectrum waveform measured by the first spectrum monitor and is a descriptive diagram of the process of calculating the center wavelength $\lambda 1c$ based on the spectrum waveform.

FIG. 41 shows an example of the spectrum waveform measured by the first spectrum monitor 166 and is a descriptive diagram of the process of calculating the center wavelength $\lambda 1c$ based on the spectrum waveform.

In step S241 in FIG. 40, the first semiconductor laser control section 114 calculates the spectral linewidth $\Delta\lambda 1ch$ based on an energy proportion B of the spectrum waveform.

[Expression 7]

$$\frac{\int_{-\frac{\Delta\lambda 1ch}{2}}^{\frac{\Delta\lambda 1ch}{2}} I1(\lambda + \lambda 1c)d\lambda}{\int_{-\infty}^{\infty} I1(\lambda + \lambda 1c)d\lambda} = B \tag{7}$$

For example, B may be 0.95.

The calculation may be performed by assuming that the bandwidth of the energy proportion B of the spectrum waveform is the spectral linewidth $\Delta\lambda 1ch$, as shown in FIG. 41.

After step S241 in FIG. 40, the first semiconductor laser control section 114 terminates the flowchart of FIG. 40 and returns to the flowchart of FIG. 35.

Figure 42:
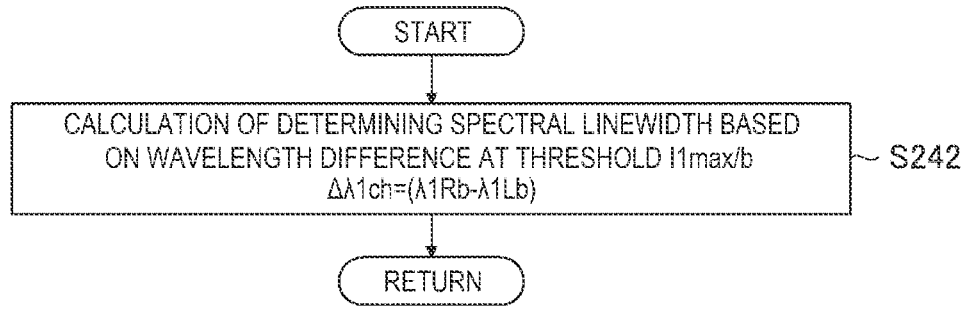
FIG. 42 is a flowchart showing Example 2 of the process of calculating the spectral linewidth $\Delta\lambda 1ch$ based on the spectrum waveform measured by the first spectrum monitor.

FIG. 42 is a flowchart showing Example 2 of the process of calculating the spectral linewidth $\Delta\lambda 1ch$ based on the spectrum waveform measured by the first spectrum monitor 166. The description will be made of calculation of the spectral linewidth based on the difference between the maximum wavelength and the minimum wavelength in a wavelength region where the optical intensity is greater than or equal to an optical intensity threshold of the spectrum waveform. The flowchart of FIG. 42 is applied to step S223 in FIG. 35.

Figure 43:
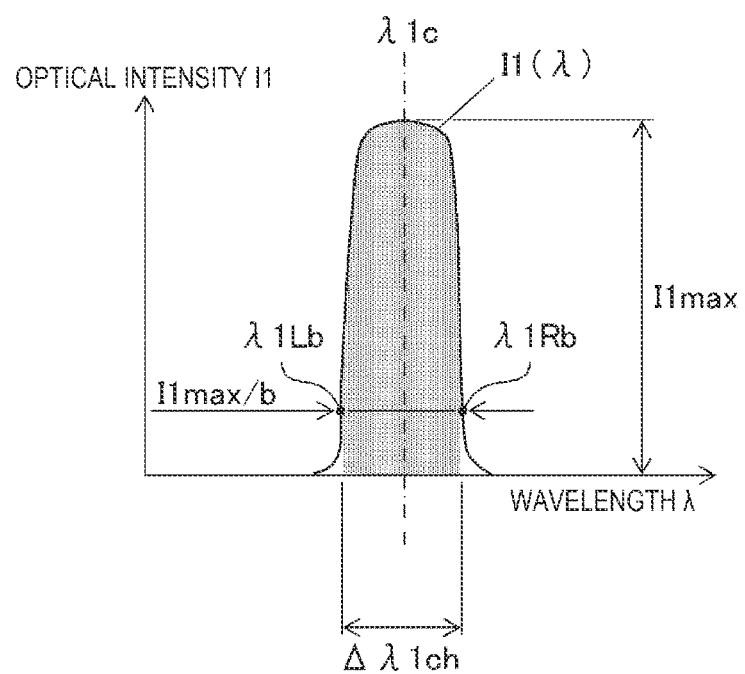
FIG. 43 shows an example of the spectrum waveform measured by the first spectrum monitor and is a descriptive diagram of the process of calculating the spectral linewidth $\Delta\lambda 1ch$ based on the spectrum waveform.

FIG. 43 shows an example of the spectrum waveform measured by the first spectrum monitor 166 and is a descriptive diagram of the process of calculating the spectral linewidth $\Delta\lambda 1ch$ based on the spectrum waveform.

In step S242 in FIG. 42, the first semiconductor laser control section 114 calculates the spectral linewidth $\Delta\lambda 1ch$ based on the difference between a maximum wavelength $\lambda 1Rb$ and a minimum wavelength $\lambda 1Lb$ in a wavelength region where the optical intensity is greater than or equal to an optical intensity threshold $I1max/b$ of the spectrum waveform.

$$\Delta\lambda 1ch = (\lambda 1Rb - \lambda 1Lb) \tag{8}$$

For example, b may be a constant greater than or equal to 2 but smaller than or equal to 10.

Let I1max be the maximum optical intensity of the spectrum waveform, and the calculation may be performed by assuming that the difference between the maximum and minimum in the bandwidth at the optical intensity threshold I1max/b is the spectral linewidth $\Delta\lambda 1ch$, as shown in FIG. 43.

After step S242 in FIG. 42, the first semiconductor laser control section 114 terminates the flowchart of FIG. 42 and returns to the flowchart of FIG. 35.

Figure 44:
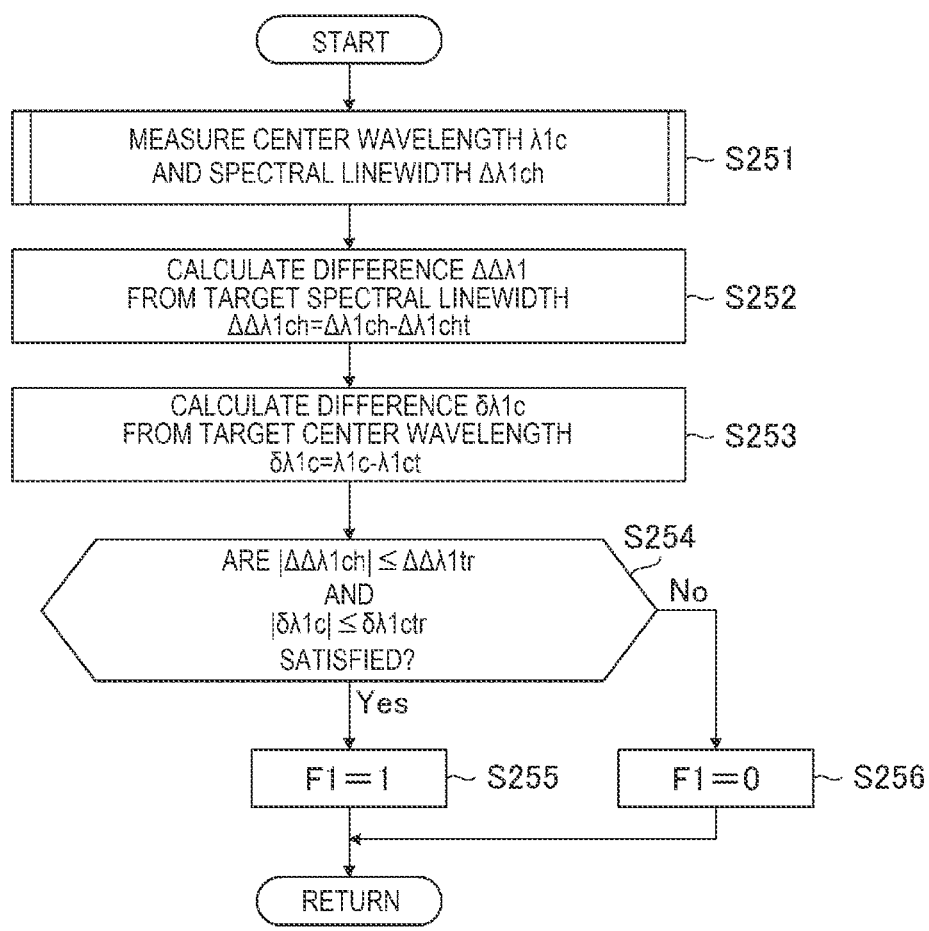
FIG. 44 is a flowchart showing an example of the process of calculating and evaluating the spectral linewidth $\Delta\lambda 1ch$ and the center wavelength $\lambda 1c$ of the light from the first semiconductor laser system.

FIG. 44 is a flowchart showing an example of the process of calculating and evaluating the spectral linewidth $\Delta\lambda 1ch$ and the center wavelength $\lambda 1c$ of the light from the first semiconductor laser system 160. The flowchart of FIG. 44 is applied to step S205 in FIG. 32.

In step S251 in FIG. 44, the first semiconductor laser control section 114 measures the center wavelength $\lambda 1c$ and the spectral linewidth $\Delta\lambda 1ch$ of the light from the first semiconductor laser system 160 based on the spectrum measured by using the first spectrum monitor 166.

In step S252, the first semiconductor laser control section 114 calculates the difference $\Delta\Delta\lambda 1ch$ between the spectral linewidth $\Delta\lambda 1ch$ provided in step S251 and the target spectral linewidth $\Delta\lambda 1cht$.

$$\Delta\Delta\lambda 1ch = \Delta\lambda 1ch - \Delta\lambda 1cht \tag{9}$$

In step S253, the first semiconductor laser control section 114 calculates the difference $\delta\lambda 1c$ between the center wavelength $\lambda 1c$ provided in step S251 and the target center wavelength $\lambda 1ct$.

Thereafter, in step S254, the first semiconductor laser control section 114 evaluates whether or not the absolute value of $\Delta\Delta\lambda 1ch$ is smaller than or equal to the acceptable upper limit $\Delta\Delta\lambda 1tr$ representing an acceptable range and whether or not the absolute value of $\delta\lambda 1c$ is smaller than or equal to the acceptable upper limit $\delta\lambda 1ctr$ representing an acceptable range. When the result of the evaluation in step S254 is Yes, the first semiconductor laser control section 114 proceeds to step S255, where the first semiconductor laser control section 114 transmits the flag signal representing F1=1, which shows that the state of the first semiconductor laser system 160 is the OK state, to the solid-state laser system control section 350.

When the result of the evaluation in step S254 is No, the first semiconductor laser control section 114 proceeds to step S256, where the first semiconductor laser control section 114 transmits the flag signal representing F1=0, which shows that the state of the first semiconductor laser system 160 is the NG state, to the solid-state laser system control section 350.

After step S255 or S256, the first semiconductor laser control section 114 terminates the flowchart of FIG. 44 and returns to the flowchart of FIG. 32.

4.7 Effects and Advantages

The laser system 1A according to the first embodiment provides the following effects.

[1] The wavelength of the laser light outputted from the first semiconductor laser 111 used in the first semiconductor laser system 160 can be caused to chirp, and the spectral linewidth resulting from the chirping (amount of chirping) can be controlled to precisely control the spectral linewidth of the excimer laser light after the pulse amplification.

[2] When the laser control section 18 receives data on the target spectral linewidth $\Delta\lambda t$ from the exposure control section 22, the laser control section 18 can perform feedback control before the pulse amplification is performed, whereby the spectral linewidth control speed is improved.

[3] Since the wavelength of the laser light outputted from the first semiconductor laser 111 used in the first semiconductor laser system 160 is caused to chirp for suppression of occurrence of SBS in the Er fiber amplifier 140, breakage of the Er fiber amplifier 140 and the first semiconductor laser system 160 can be suppressed.

In the first embodiment, the CW laser light outputted from the first semiconductor laser 111 is an example of the "first laser light" in the present disclosure. The pulsed laser light outputted from the first semiconductor optical amplifier 120 is an example of the "first pulsed laser light" in the present disclosure. The combination of the current control section 54 and the function generator 167 is an example of the "first current controller" in the present disclosure. The Er fiber amplifier 140 is an example of the "first amplifier" in the present disclosure. The pulsed laser light amplified by the Er fiber amplifier 140 and outputted from the first solid-state laser apparatus 100 is an example of the "second pulsed laser light" in the present disclosure. The pulsed laser light of ultraviolet light outputted from the wavelength conversion system 300 and having the wavelength of about 193.4 nm is an example of the "third pulsed laser light" in the present disclosure. The combination of the laser control section 18, the solid-state laser system control section 350, and the first semiconductor laser control section 114 is an example of the "control section" in the present disclosure. The exposure apparatus 20 is an example of the "external apparatus" in the present disclosure. The configuration in which the spectral linewidth $\Delta\lambda 1ch$ resulting from the chirping is variably controlled in accordance with the target spectral linewidth $\Delta\lambda t$ instructed from the exposure control section 22 is an example of "controlling the amount of chirping" in the present disclosure.

4.8 Variation 1

In the example presented in the first embodiment, the laser light outputted from the first semiconductor laser 111 is monitored by the first spectrum monitor 166 for feedback control, but not necessarily. For example, the spectral linewidth $\Delta\lambda$ and the center wavelength $\lambda c$ of the excimer laser light that are measured by the spectrum monitor 606 may be measured and directly feedback controlled.

For example, the chirping performed on the wavelength of the laser light outputted from the first semiconductor laser 111 may be so controlled that the difference $\Delta\Delta\lambda$ between the spectral linewidth $\Delta\lambda$ of the excimer laser light measured by the spectrum monitor 606 and the target spectral linewidth $\Delta\lambda t$ decreases. Specifically, the AC component value A1ac out of the current control parameters of the current caused to flow through the first semiconductor laser 111 may be so controlled that $\Delta\Delta\lambda$ approaches zero.

Further, for example, the chirping performed on the laser light outputted from the first semiconductor laser 111 may be so controlled that the difference $\delta\lambda c$ between the center wavelength $\lambda c$ of the excimer laser light measured by the spectrum monitor 606 and the target center wavelength $\lambda ct$ decreases. Specifically, the DC component value A1dc out of the current control parameters of the current caused to flow through the first semiconductor laser 111 may be so controlled that $\delta\lambda c$ approaches zero.

4.9 Variation 2
4.9.1 Configuration

Figure 45:
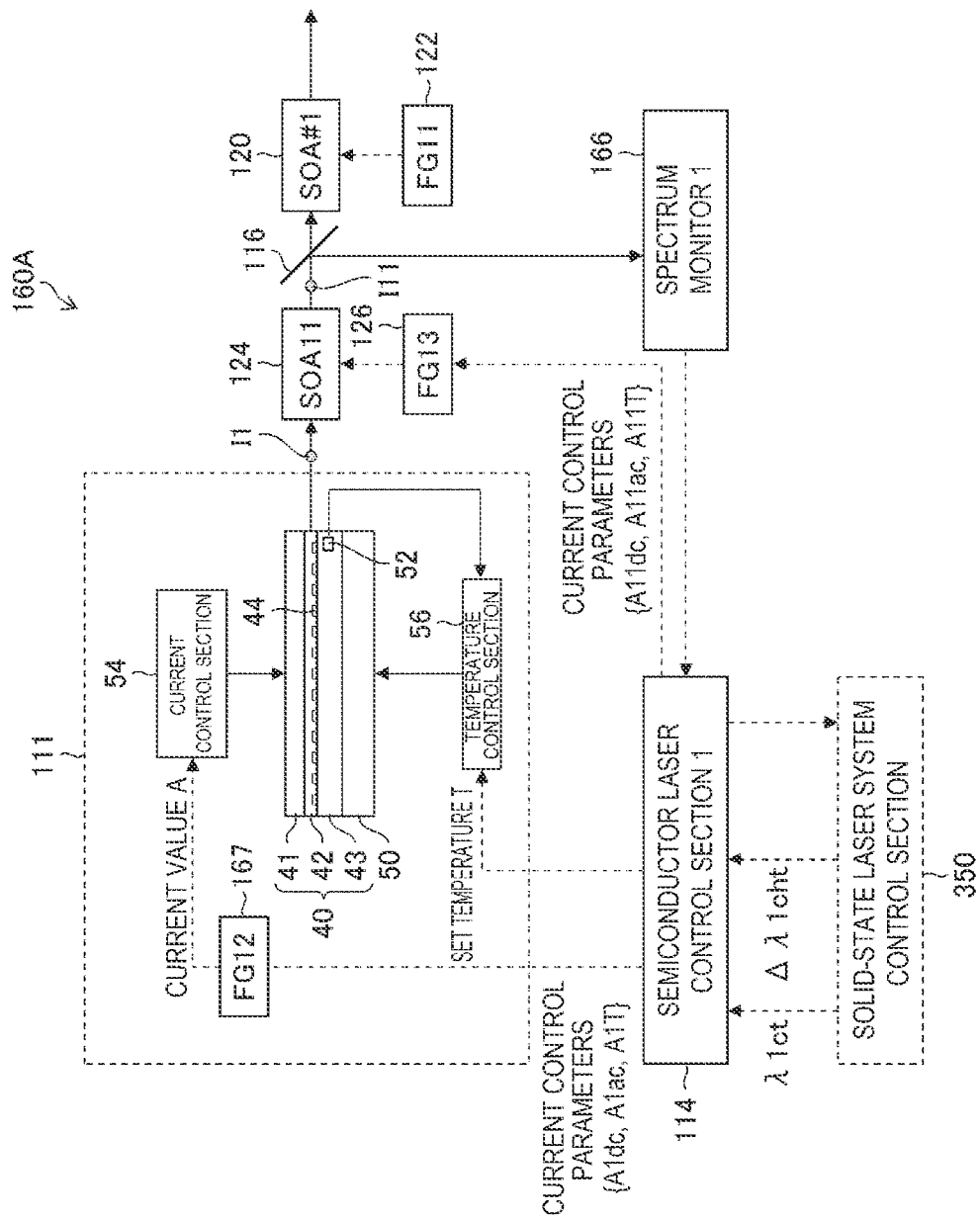
FIG. 45 schematically shows a variation of the first semiconductor laser system.

FIG. 45 shows a variation of the first semiconductor laser system. In place of the first semiconductor laser system 160 described with reference to FIG. 21, a first semiconductor laser system 160A shown in FIG. 45 may be employed. Differences from FIG. 21 will be described.

In the first semiconductor laser system 160A shown in FIG. 45, a semiconductor optical amplifier 124 is disposed in the optical path between the first semiconductor laser 111 and the first beam splitter 116. The first semiconductor laser system 160A includes a function generator 126 for performing modulation control on the current caused to flow through the semiconductor optical amplifier 124. The function generator 126 is configured to generate signals having a variety of waveforms based on current control parameters associated with the semiconductor optical amplifier 124.

In FIG. 45, the optical intensity of the laser light outputted from the first semiconductor laser 111 before amplified by the semiconductor optical amplifier 124 is expressed by "I1," and the optical intensity of the laser light after amplified by the semiconductor optical amplifier 124 is expressed by "I11."

4.9.2 Operation

In the configuration shown in FIG. 45, the first semiconductor laser control section 114 is configured to precisely control the current flowing through the semiconductor optical amplifier 124 in such a way that a spectrum waveform symmetric with respect to the center wavelength is generated.

Figure 46:
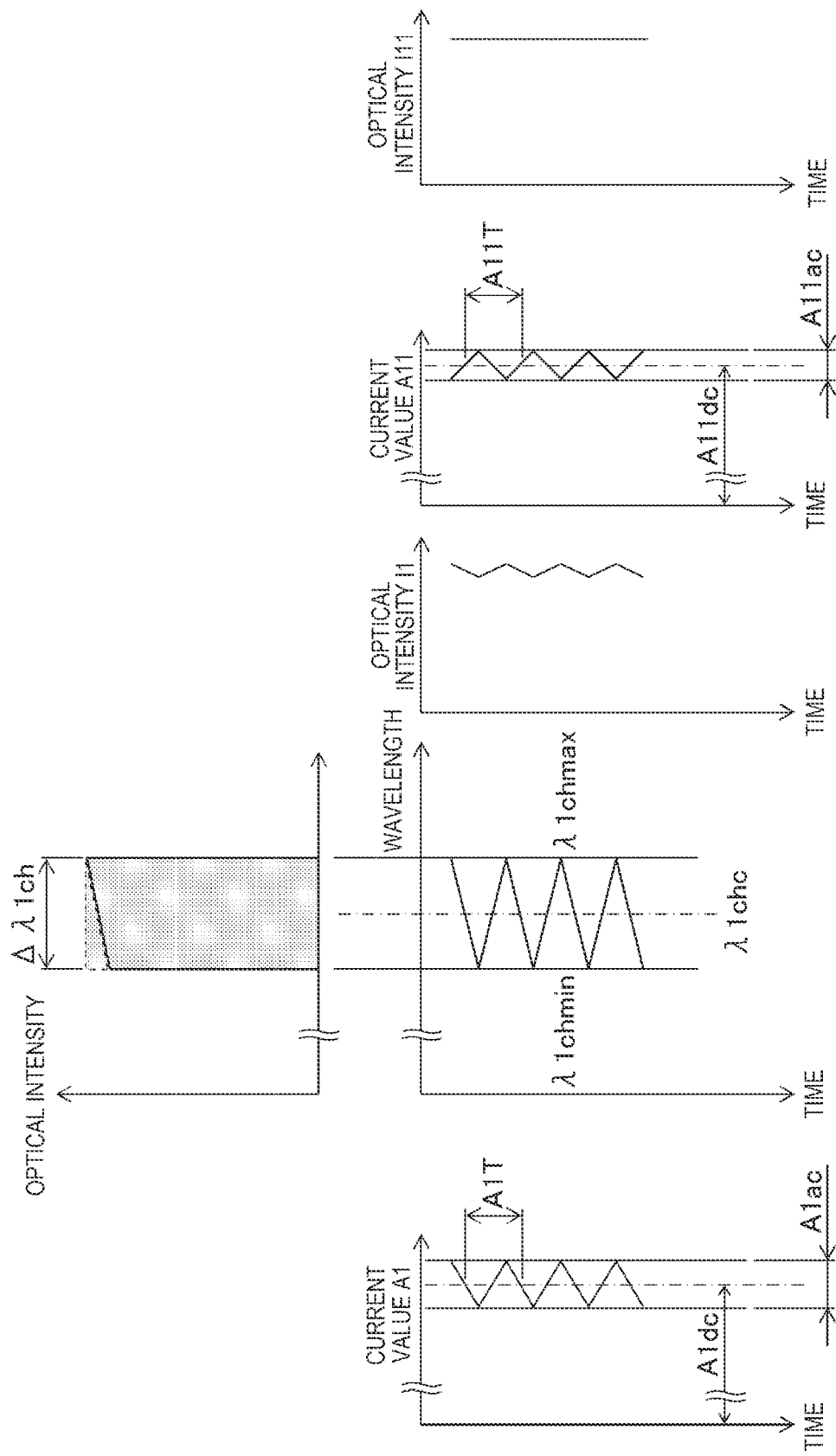
FIG. 46 is a descriptive diagram showing the relationship among the current flowing through the first semiconductor laser, a change in the wavelength due to the chirping, the spectrum waveform, and the optical intensity.

FIG. 46 is a descriptive diagram showing the relationship among the value of the current flowing through the first semiconductor laser 111, the spectrum waveform, the chirping, and the optical intensity. FIG. 46 shows control so performed that the target spectral linewidth increases and the amount of chirping performed on the wavelength of the light from the first semiconductor laser 111 increases as compared with the case shown in FIG. 23. In this case, the AC component value A1ac, which represents the amount of variation in the AC component, which is one of the current control parameters, increases, as shown by the leftmost graph in the lower portion of FIG. 46, so that the variation width of the optical intensity I1 of the laser light outputted from the first semiconductor laser 111 also increases (see third graph counted from lower left graph in FIG. 46). As a result, the optical intensity distribution of the spectrum is asymmetric with respect to a chirping center wavelength $\lambda 1chc$ in some cases as shown by the graph of the upper portion of FIG. 46. The graph shown in the upper portion of FIG. 46 shows a case where the optical intensity is not fixed in the spectrum shape in the wavelength region from a wavelength $\lambda 1ch\min$ to a wavelength $\lambda 1ch\max$ and the optical intensity decreases as the wavelength decreases.

To correct the asymmetry of the spectrum shape described above, the current flowing through the semiconductor optical amplifier 124 is so controlled that the optical intensity has a fixed value over the range of the spectral linewidth $\Delta\lambda 1ch$, as shown by the second graph counted from the lower right graph in FIG. 46. The optical intensity I11 after amplified by the semiconductor optical amplifier 124 is thus fixed, whereby the symmetry of the spectrum waveform is improved.

A region in the spectrum waveform shown in the upper portion of FIG. 46 that is the region surrounded by the broken line represents a portion where the optical intensity distribution has been corrected by using the semiconductor optical amplifier 124. The current control parameters of the semiconductor optical amplifier 124 include the following values.

A11dc: DC component value of current flowing through semiconductor element

A11ac: Variation width of AC component of current flowing through semiconductor element (difference between maximum and minimum of current)

A11T: Cycle of AC component of current flowing through semiconductor element

The first semiconductor laser control section 114 is configured to be capable of controlling the optical intensity distribution by transmitting the current control parameters to the function generator 126.

Correcting the spectrum waveform by using the semiconductor optical amplifier 124 as described above allows the optical intensity I11 to be fixed, as shown by the rightmost graph in the lower portion of FIG. 46.

The semiconductor optical amplifier 124 is an example of the "third semiconductor optical amplifier" in the present disclosure.

5. Second Embodiment

5.1 Configuration

Figure 47:
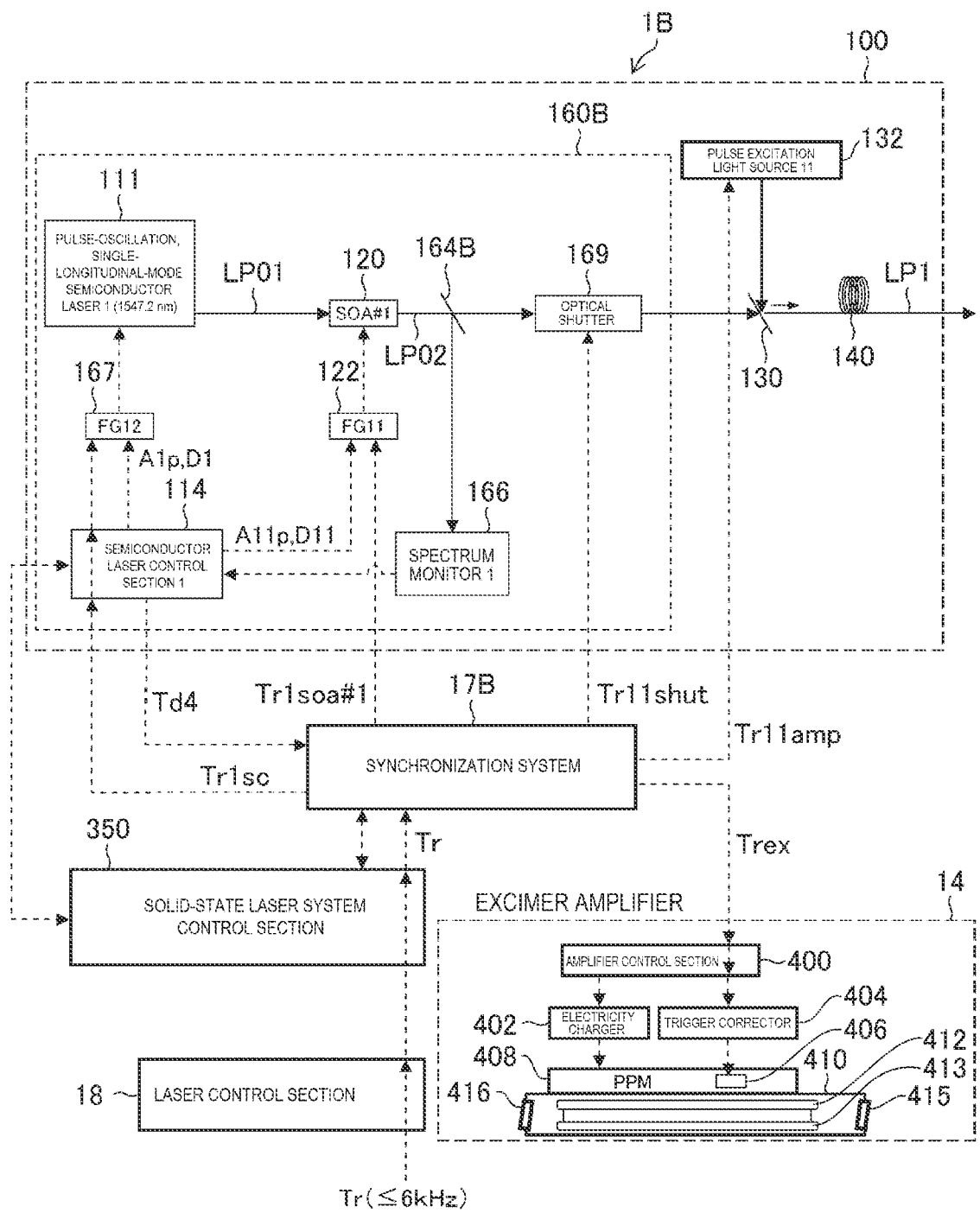
FIG. 47 schematically shows the configuration of key parts of a laser system according to a second embodiment.

FIG. 47 schematically shows the configuration of key parts of a laser system 1B according to the second embodiment. In place of the first semiconductor laser system 160 described with reference to FIG. 20, a first semiconductor laser system 160B shown in FIG. 47 may be employed. FIG. 47 shows the first solid-state laser apparatus 100 and a control system therefor. Other elements not shown in FIG. 47 are the same as the elements in the configuration in the first embodiment shown in FIG. 20. Differences from the first embodiment will be described.

In the laser system 1B according to the second embodiment, the first semiconductor laser system 160B and a synchronization system 17B differ from those in the configuration in the first embodiment described with reference to FIG. 20. The first semiconductor laser system 160B has a configuration in which the first semiconductor laser 111 is caused to undergo pulse oscillation and outputs pulsed laser light LP01. The first semiconductor laser system 160B further includes an optical shutter 169. The optical shutter 169 is disposed in the optical path of pulsed laser light LP02 outputted from the first semiconductor optical amplifier 120. The optical shutter 169 may, for example, be an optical shutter that is the combination of an electro-optic (EO) Pockels cell and two polarizers.

A beam splitter 164B is disposed in the optical path between the first semiconductor optical amplifier 120 and the optical shutter 169. The beam splitter 164B is so disposed that light reflected off the beam splitter 164B enters the first spectrum monitor 166.

Figure 48:
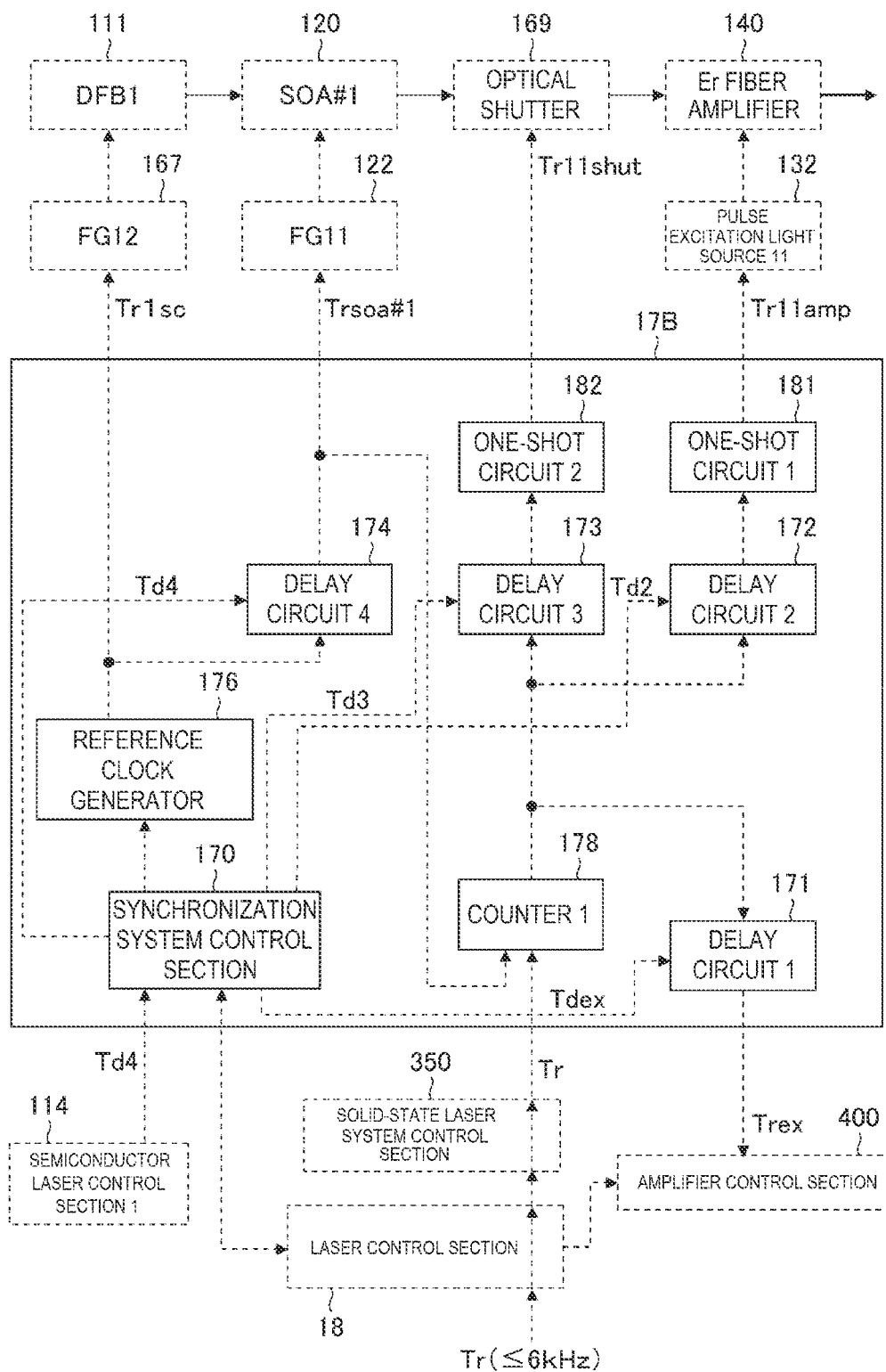
FIG. 48 is a block diagram schematically showing an example of the configuration of a synchronization system in the second embodiment.

FIG. 48 is a block diagram schematically showing an example of the configuration of the synchronization system 17B. Differences from FIG. 6 will be described. The synchronization system 17B shown in FIG. 48 has the configuration shown in FIG. 6 to which a reference clock generator 176, a first counter 178, a second one-shot circuit 182, and a fourth delay circuit 174 are further added.

The reference clock generator 176 is so configured as to generate a reference clock (CL) signal having a frequency, for example, higher than or equal to 1 to 10 MHz. The frequency of the reference clock signal is higher than the frequency of a jitter acceptable to the exposure apparatus 20. The frequency of the reference clock signal is higher than or equal to the maximum frequency of the light emission trigger signal outputted from the exposure control section 22. The frequency of the reference clock signal is preferably higher than or equal to 10 times the maximum frequency of the light emission trigger signal. The frequency of the reference clock signal is further preferably higher than or equal to 100 times the maximum frequency of the light emission trigger signal.

A reference clock signal output terminal of the reference clock generator 176, from which the reference clock signal is outputted, is connected to an input terminal of each of the function generator 167 and the fourth delay circuit 174.

An output terminal of the fourth delay circuit 174 is connected to an input terminal of each of the function generator 122 and the first counter 178.

The first counter 178 is configured to output, when a first count pulse outputted from the fourth delay circuit 174 is inputted to the first counter 178, a pulse signal in synchronization with the first count pulse.

An output terminal of the first counter 178 is connected to an input terminal of each of the first delay circuit 171, the second delay circuit 172, and the third delay circuit 173.

An output terminal of the third delay circuit 173 is connected to an input terminal of the second one-shot circuit 182.

The output waveform of a signal outputted from the second one-shot circuit 182 is so set at to have the same time period as the cycle of the reference clock signal.

An output terminal of the second one-shot circuit 182 is connected to the optical shutter 169.

The first semiconductor laser control section 114 is configured to set a delay period Td4 in the synchronization system control section 170. The synchronization system control section 170 is configured to be capable of setting the delay period Td4 set by the first semiconductor laser control section 114 in the fourth delay circuit 174. The delay period Td4 is so set as to be the difference between the timing when pulse current flowing through the first semiconductor laser 111 is caused to flow and the timing when pulse current flowing through the first semiconductor optical amplifier 120 is caused to flow.

5.2 Operation

Figure 49:
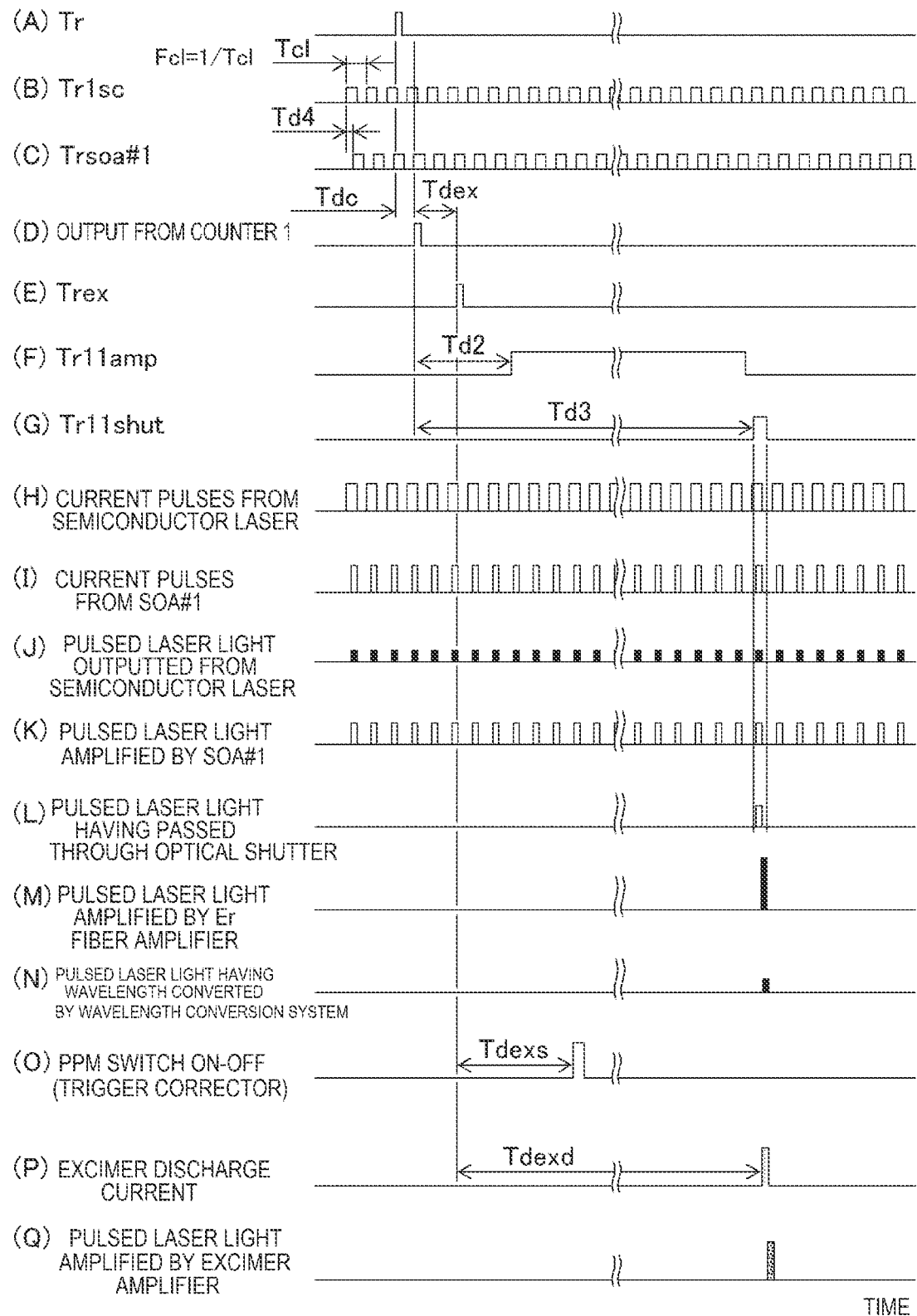
FIG. 49 shows an example of a timing chart in accordance with which the laser system according to the second embodiment operates.

FIG. 49 shows a timing chart in accordance with which the laser system 1B according to the second embodiment operates. The fourth delay circuit 174 is configured to transmit the trigger signal Trsoa #1 to the first semiconductor optical amplifier 120 in synchronization with a reference clock signal Tr1sc from the reference clock generator 176 but delayed by the delay period Td4 with respect to the reference clock signal Tr1sc. In FIG. 49, the frequency of the reference clock signal Tr1sc is "Fcl," and the cycle of the reference clock signal Tr1sc is "Tcl." The symbol "Tdc" in FIG. 49 represents the period that elapses after the light emission trigger signal Tr is inputted but until a first current pulse (trigger signal Trsoa #1) is inputted to the first semiconductor optical amplifier 120.

When the reference clock signal Tr1sc is inputted to the function generator 167, pulse current according to a pulse current value A1p and a pulse width D11, which are pulse current control parameters of the first semiconductor laser 111, is inputted in synchronization with the reference clock signal Tr1sc from the function generator 167 to the current control section 54 of the first semiconductor laser 111 via the first semiconductor laser control section 114.

When the pulse current flows through the first semiconductor laser 111 via the current control section 54, the pulsed laser light LP01 outputted from the first semiconductor laser 111 undergoes chirping, which causes the oscillation wavelength to temporally vary for the period from the start of the optical pulses to the end thereof.

When the trigger signal Trsoa #1 for the first semiconductor optical amplifier 120 is inputted to the function generator 122 with the trigger signal Trsoa #1 delayed by the delay period Td4 with respect to the reference clock signal Tr1sc, pulse current according to a pulse current value A11p and a pulse width D11, which are pulse current control parameters of the first semiconductor optical amplifier 120, flows through the first semiconductor optical amplifier 120 in synchronization with the trigger signal Trsoa #1. Part of the pulsed laser light LP01 is therefore amplified by the first semiconductor optical amplifier 120, and the pulsed laser light LP02 is thus outputted (see FIG. 47).

Figure 50:
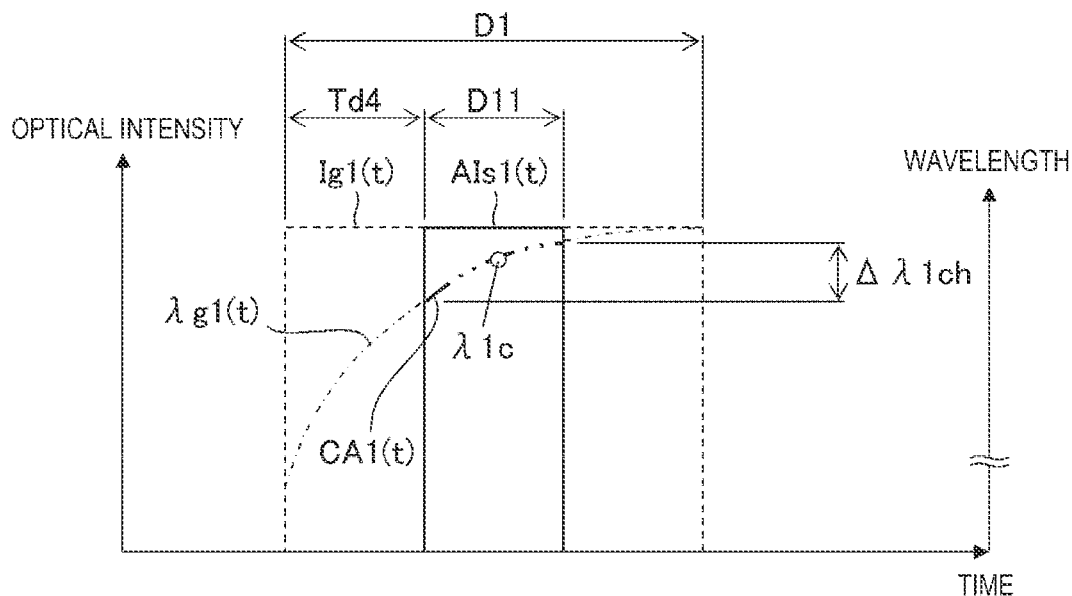
FIG. 50 is a graph showing the relationship between the chirping performed on the pulsed laser light outputted from the first semiconductor laser and the amplification performed by the first semiconductor optical amplifier.

FIG. 50 is a graph showing the relationship between the chirping performed on the pulsed laser light outputted from the first semiconductor laser 111 and the amplification performed by the first semiconductor optical amplifier 120. In FIG. 50, a rectangular graph Ig1(t) drawn with the broken line and having the pulse width D1 represents the optical intensity of the pulsed laser light outputted from the first semiconductor laser 111.

In FIG. 50, a curved graph λg1(*t*) drawn with the chain line represents a chirping-induced change in the wavelength of the pulsed laser light outputted from the first semiconductor laser 111.

In FIG. 50, a rectangular region AIs1(*t*) drawn with the solid line and having the pulse width D11 is a region of the pulses amplified by the first semiconductor optical amplifier 120.

In FIG. 50, a curved portion CA1(*t*) drawn with the two-dot chain line is a chirping region where the first semiconductor optical amplifier 120 performs the amplification. The wavelength substantially at the center of the wavelength range of the chirping area corresponds to the center wavelength λ1c, and the width of the wavelength range of the chirping area corresponds to the spectral linewidth Δλ1ch.

The pulse width D1, the delay period Td4, and the pulse width D11 are so set that a relationship D1>Td4+D11 is satisfied, and the pulse amplification performed by the first semiconductor optical amplifier 120 amplifies part of the laser light outputted from the first semiconductor laser 111.

A typical value of the pulse width D1 is, for example, greater than or equal to 50 ns but smaller than or equal to 100 ns. A typical value of the delay period Td4 is, for example, greater than or equal to 2 ns but smaller than or equal to 30 ns. A typical value of the pulse width D11 is, for example, greater than or equal to 5 ns but smaller than or equal to 20 ns.

Part of the pulsed laser light amplified by the first semiconductor optical amplifier 120 is reflected off the beam splitter 164B and enters the first spectrum monitor 166. The first spectrum monitor 166 is configured to measure the center wavelength λ1c and the spectral linewidth Δλ1ch based on the spectrum shape of the pulsed laser light incident via the beam splitter 164B.

When the first semiconductor laser control section 114 receives data on the target spectral linewidth Δλ1cht and the target center wavelength λ1ct, the first semiconductor laser control section 114 calculates the spectral linewidth Δλ1ch and the center wavelength λ1c measured by the first spectrum monitor 166 and calculates the difference from the respective target values. That is, the first semiconductor laser control section 114 is configured to calculate the difference ΔΔλ1ch between the spectral linewidth Δλ1ch measured by using the first spectrum monitor 166 and the target spectral linewidth Δλ1cht (=Δλ1ch−Δλ1cht). The first semiconductor laser control section 114 is further configured to calculate the difference δλ1c between the center wavelength λ1c measured by using the first spectrum monitor 166 and the target center wavelength λ1ct (=λ1c−λ1ct).

Thereafter, for example, the first semiconductor laser control section 114 controls the pulse current value A1p, which is one of the current control parameters of the current caused to flow through the first semiconductor laser 111, in such a way that ΔΔλ1ch approaches zero. The first semiconductor laser control section 114 then controls the temperature T1 in such a way that δλ1c approaches zero (see FIG. 54).

When the light emission trigger signal Tr is inputted to the first counter 178 of the synchronization system 17B via the solid-state laser system control section 350, the pulse count is set, and when one of the pulses outputted from the fourth delay circuit 174 is counted, the first counter 178 outputs a pulse, and the pulse count is reset.

The pulse outputted from the first counter 178 is inputted to the first delay circuit 171, the second delay circuit 172, and the third delay circuit 173, and the delay circuits output pulse signals delayed by Tdex, Td2, and Td3, respectively.

The first delay circuit 171 is configured to output the pulse signal Trex, which is delayed by the delay period Tdex with respect to the inputted pulse. The pulse signal Trex outputted from the first delay circuit 171 is a signal used as a trigger pulse for the discharge performed by the excimer amplifier 14, and the pulse signal Trex is inputted to the amplifier control section 400 of the excimer amplifier 14.

The second delay circuit 172 is configured to output a pulse signal delayed by the delay period Td2 with respect to the inputted pulse to the first one-shot circuit 181. The first one-shot circuit 181 is configured to output the one-shot pulse signal Tr11amp, which synchronizes with the pulse signal from the second delay circuit 172. The pulse signal Tr11amp outputted from the first one-shot circuit 181 is inputted to the first pulse excitation light source 132 as a light emission control pulse in accordance with which the first pulse excitation light source 132 emits light.

The third delay circuit 173 is configured to output a pulse signal delayed by the delay period Td3 with respect to the inputted pulse to the second one-shot circuit 182. The second one-shot circuit 182 is configured to output a trigger signal Tr11shut, which is a one-shot pulse signal, in synchronization with the pulse signal from the third delay circuit 173. The trigger signal Tr11shut outputted from the second one-shot circuit 182 is inputted to the optical shutter 169 as a control pulse in accordance with which the optical shutter 169 is opened and closed.

The synchronization system 17B is configured to cause the first semiconductor laser 111 and the first semiconductor optical amplifier 120 to operate at the frequency equal to the frequency of the reference clock signal, which generates a trigger signal having a frequency higher than the repetitive frequency of the light emission trigger signal Tr, and the first spectrum monitor 166 is configured to detect the center wavelength λ1c and the spectral linewidth Δλ1ch for the feedback control.

Further, the synchronization system 17B is configured to open/close the optical shutter 169 in accordance with the light emission trigger signal Tr, cause the Er fiber amplifier 140 to amplify the pulsed laser light having passed through the optical shutter 169, and cause the wavelength conversion system 300 to convert the wavelength of the pulsed laser light into about 193.4 nm.

The pulsed laser light outputted from the solid-state laser system 10 and having the wavelength of about 193.4 nm is further amplified by the discharge that occurs in the excimer amplifier 14 in synchronization with the entry of the pulsed laser light into the discharge space of the excimer amplifier 14.

Figure 51:
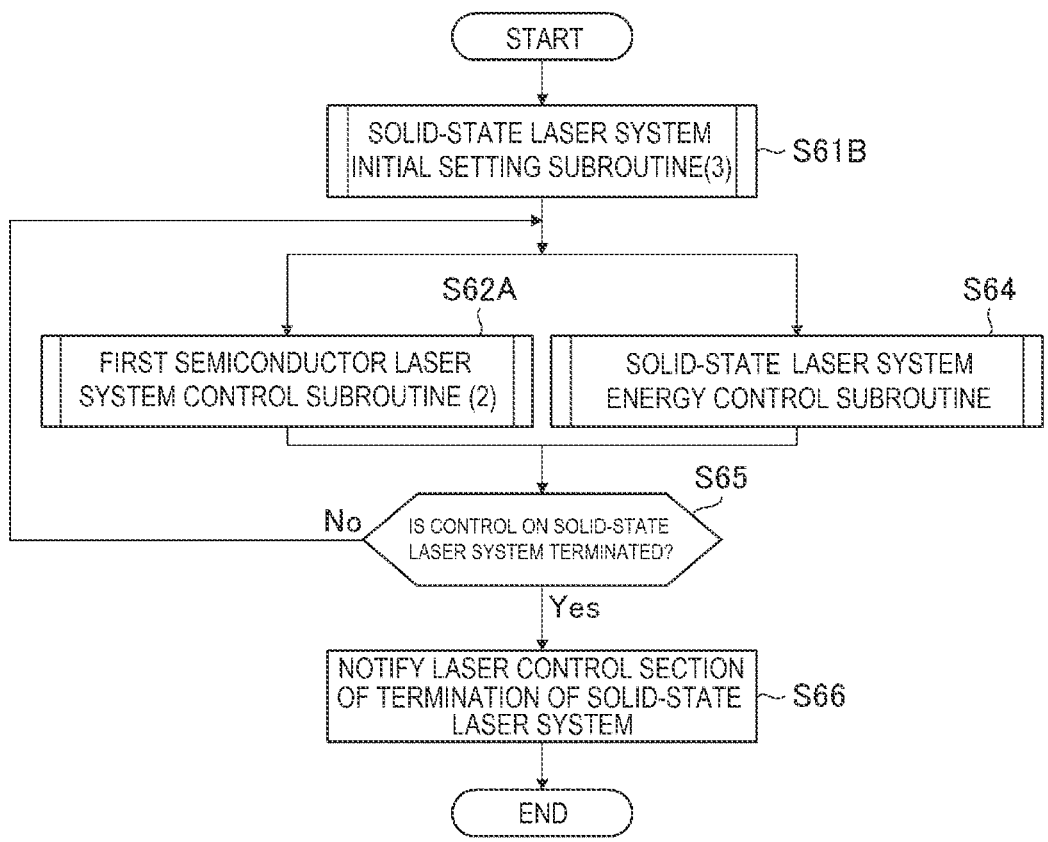
FIG. 51 is a flowchart showing an example of the content of processes carried out by the solid-state laser system control section.

5.2.1 Example of Processes Carried Out by Solid-State Laser System Control Section FIG. 51 is a flowchart showing an example of the content of processes carried out by the solid-state laser system control section 350. The flowchart of FIG. 51 is applicable in place of the flowchart of FIG. 29. Differences from FIG. 29 will be described.

The flowchart shown in FIG. 51 includes step S61B in place of step S61A in FIG. 29.

In step S61B in FIG. 51, the solid-state laser system control section 350 carries out processes in a subroutine (3) of the initial setting of the solid-state laser system.

Figure 52:
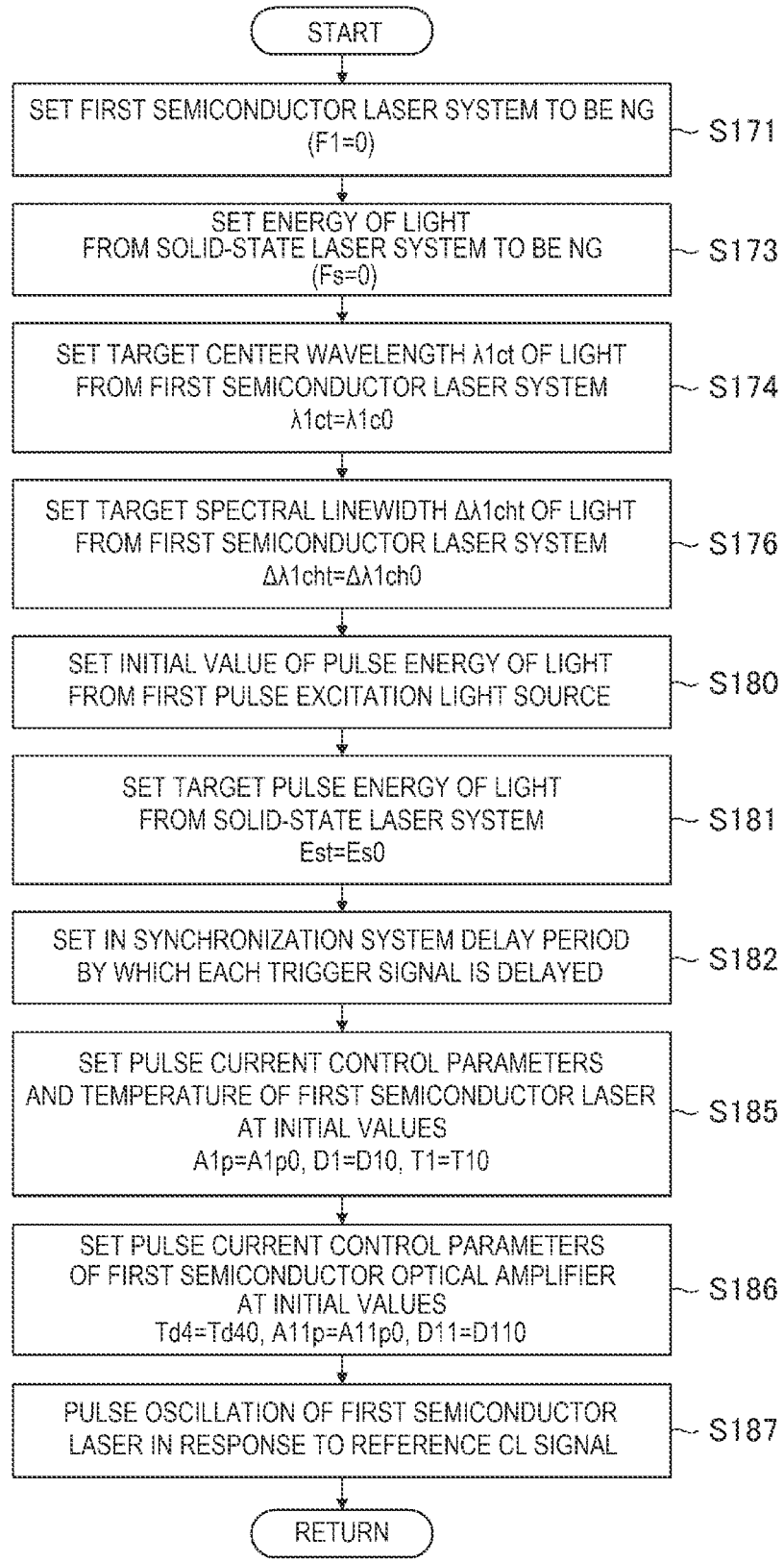
FIG. 52 is a flowchart showing an example of a subroutine (3) of the initial setting of the solid-state laser system.

FIG. 52 is a flowchart showing an example of the subroutine (3) of the initial setting of the solid-state laser system. The flowchart shown in FIG. 52 is applied to step S61B in FIG. 51.

In FIG. 52, the same step as the step in the flowchart of FIG. 30 has the same step number, and no duplicated description will be made. Differences from FIG. 30 will be described.

The flowchart shown in FIG. 52 includes steps S185 to S187 in place of steps S183 and S184 in FIG. 30.

In step S185, the solid-state laser system control section 350 sets the pulse current control parameters of the pulse current caused to flow through the first semiconductor laser 111 and the temperature thereof at respective initial values. That is, the solid-state laser system control section 350 sets the values of the pulse current value A$1p$ and the pulse width D1, which are the pulse current control parameters of the first semiconductor laser 111, and the value of the temperature T1 thereof at respective initial values, A$1p$=A$1p$0, D1=D10, and T1=T10.

The initial values are values of the pulse current control parameters and the value of the temperature that allow the center wavelength and the spectral linewidth of the laser light outputted from the first semiconductor laser 111 to be values close to λ$1c$0 and ΔΔ$1ch$0, respectively.

In step S186, the solid-state laser system control section 350 sets the pulse current control parameters of the pulse current caused to flow through the semiconductor element of the first semiconductor optical amplifier 120 at initial values. That is, the solid-state laser system control section 350 sets the values of the delay period Td4, the pulse current value A$11p$, and the pulse width D11, which are pulse current control parameters of the first semiconductor optical amplifier 120, at respective initial values, Td4=Td40, A$11p$=A$11p$0, and D11=D110.

In the following step S187, where the reference clock (CL) signal is inputted to the function generator 122 via the first semiconductor laser control section 114, the pulse current flows through the first semiconductor laser 111. As a result, in synchronization with the reference clock signal, the pulsed laser light is outputted from the first semiconductor laser 111 that operates in pulse oscillation.

After step S187, the solid-state laser system control section 350 terminates the flowchart of FIG. 52 and returns to the flowchart of FIG. 51.

Figure 53:
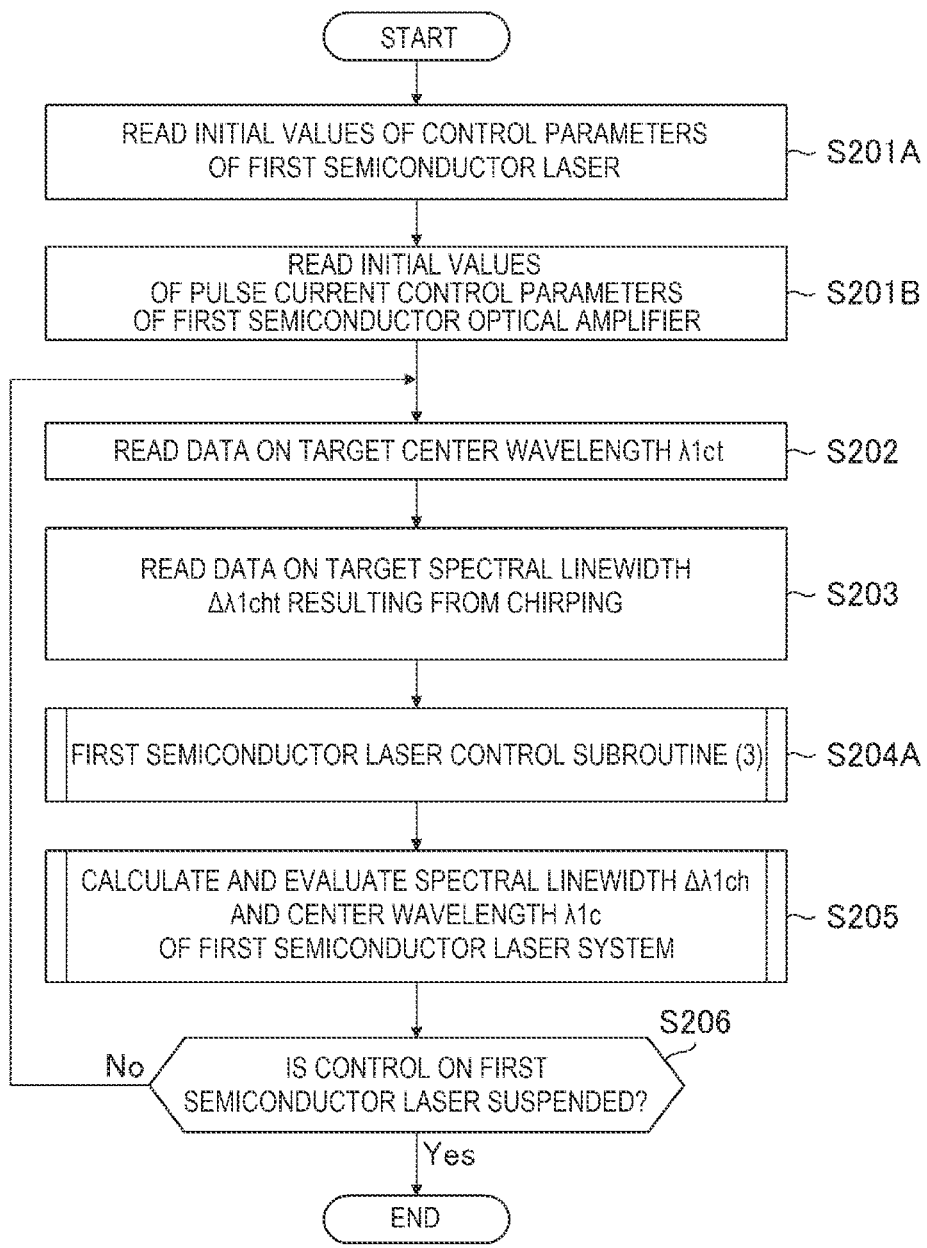
FIG. 53 is a flowchart showing an example of the content of processes carried out by a first semiconductor laser control section of the laser system according to the second embodiment.

5.2.2 Example of Processes Carried Out by First Semiconductor Laser Control Section FIG. 53 is a flowchart showing an example of the content of processes carried out by the first semiconductor laser control section 114 of the laser system 1B according to the second embodiment. Differences from the flowchart of FIG. 32 will be described.

The flowchart shown in FIG. 53 includes steps S201A and S201B in place of step S201 in FIG. 32. The flowchart shown in FIG. 53 includes step S204A in place of step S204 in FIG. 32.

In step S201A in FIG. 53, the first semiconductor laser control section 114 reads the initial values of the control parameters of the first semiconductor laser 111. The control parameters of the first semiconductor laser 111 include the pulse current value Ap1 and the pulse width D1, which are the pulse current control parameters, and the temperature T1, which is the set temperature. The first semiconductor laser control section 114 sets the pulse current value Ap1, the pulse width D1, and the temperature T1 at the respective initial values, A$1p$=A$1p$0, D1=D10, and T1=T10.

In step S201B, the first semiconductor laser control section 114 reads the initial values of the pulse current control parameters of the first semiconductor optical amplifier 120. The first semiconductor laser control section 114 sets the values of the delay period Td4, the pulse current value A$11p$, and the pulse width D11, which are the pulse current control parameters of the first semiconductor optical amplifier 120, at the respective initial values, Td4=Td40, A$11p$=A$11p$0, and D11=D110.

In step S204A, the first semiconductor laser control section 114 carries out processes in a control subroutine (3) of controlling the first semiconductor laser.

Figure 54:
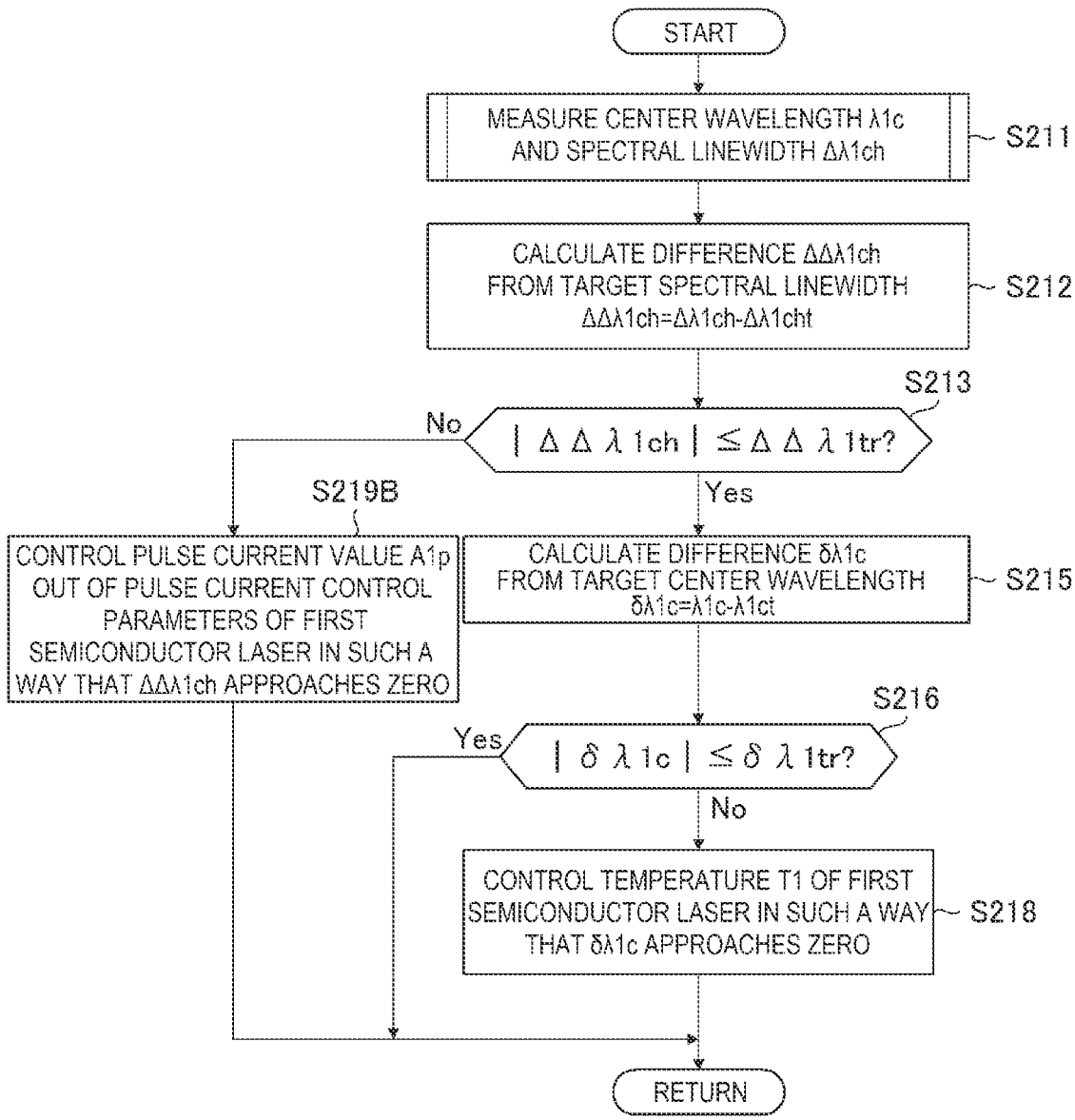
FIG. 54 is a flowchart showing Example 1 of a control subroutine (3) of controlling the first semiconductor laser.

5.2.3 Example 1 of Control Subroutine (3) of Controlling First Semiconductor Laser FIG. 54 is a flowchart showing Example 1 of the control subroutine (3) of controlling the first semiconductor laser. The flowchart of FIG. 54 is applied to step S204A in FIG. 53. The flowchart of FIG. 54 is an example in which the pulse current value A$1p$ out of the pulse current control parameters is controlled when the spectral linewidth is changed and the temperature T1 is controlled when the center wavelength is changed. Differences in the flowchart between FIG. 54 and FIG. 34 will be described.

The flowchart of FIG. 54 includes step S219B in place of step S219 in FIG. 34.

When the result of the evaluation in step S213 in FIG. 54 is No, the first semiconductor laser control section 114 proceeds to step S219B.

In step S219B, the first semiconductor laser control section 114 controls the pulse current value A$1p$, which is one of the pulse current control parameters of the first semiconductor laser 111, in such away that ΔΔλ$1ch$ approaches zero. After step S219B, the first semiconductor laser control section 114 terminates the flowchart of FIG. 54 and returns to the flowchart of FIG. 53.

Figure 55:
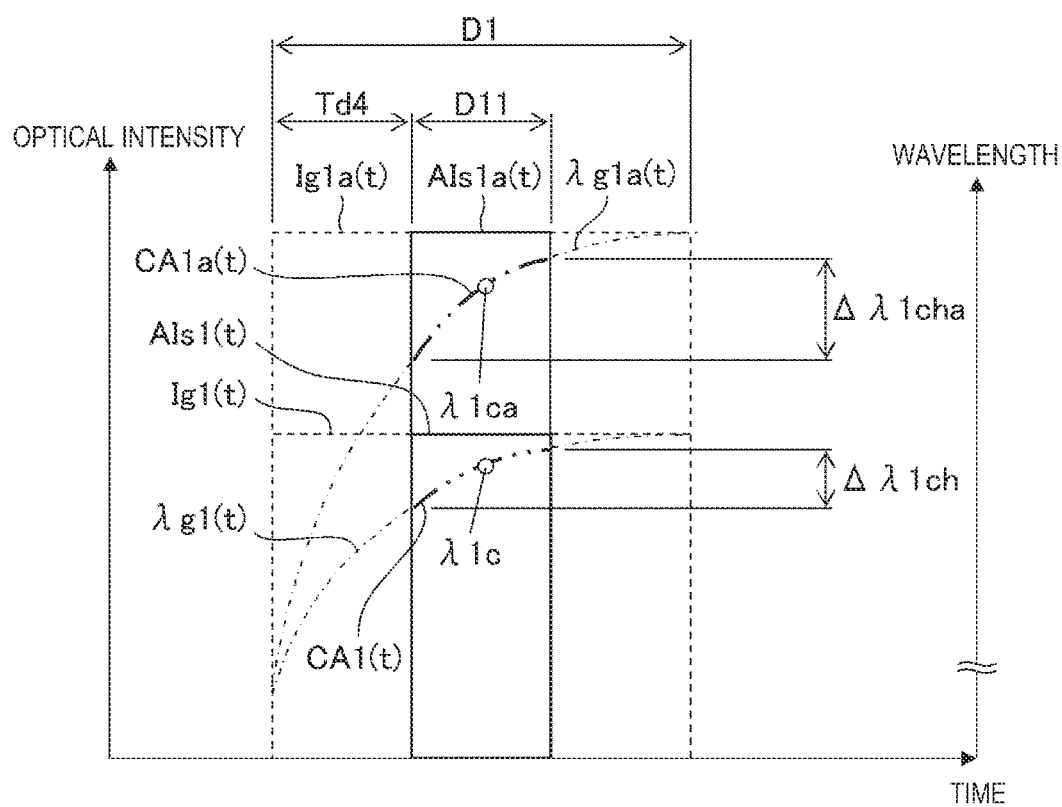
FIG. 55 is a graph showing the relationship between the chirping performed on the pulsed laser light outputted from the first semiconductor laser and the amplification performed by the first semiconductor optical amplifier.

FIG. 55 is a graph showing the relationship between the chirping performed on the pulsed laser light outputted from the first semiconductor laser 111 and the amplification performed by the first semiconductor optical amplifier 120 and shows a change in the relationship before and after the current value of the pulse current (pulse current value Ap1) flowing through the first semiconductor laser 111 is changed. That is, FIG. 55 shows a graph of the relationship before the pulse current value Ap1 is increased and a graph of the relationship after the pulse current value is increased to Ap1$a$. The graph of the relationship before the pulse current value Ap1 is increased is the same as the graph shown in FIG. 50.

In FIG. 55, a rectangular graph Ig1$a$(t) drawn with the broken line and having the pulse width D1 represents the optical intensity of the pulsed laser light LP01 outputted from the first semiconductor laser 111 after the pulse current value Ap1 is increased.

In FIG. 55, a curved graph λg1$a$(t) drawn with the chain line represents a chirping-induced change in the wavelength of the pulsed laser light outputted from the first semiconductor laser 111 after the pulse current value Ap1 is increased.

In FIG. 55, a rectangular region AIs1$a$(t) drawn with the solid line and having the pulse width D11 is a region of the pulses amplified by the first semiconductor optical amplifier 120 after the pulse current value Ap1 is increased.

In FIG. 55, a curved portion CA1$a$(t) drawn with the two-dot chain line is a chirping region where the first semiconductor optical amplifier 120 performs the amplification after the pulse current value Ap1 is increased. The change in the pulse current value A1p changes the spectral linewidth from $\Delta\lambda 1ch$ to $\Delta\lambda 1cha$, and the center wavelength changes from $\lambda 1c$ to $\lambda 1ca$.

5.3 Effects and Advantages

The laser system 1B according to the second embodiment allows the spectral linewidth and the wavelength to be precisely stabilized at high speed because the first semiconductor laser 111 and the first semiconductor optical amplifier 120 can always undergo pulse operation in synchronization with the reference clock (CL) signal, which has a high repetitive frequency, based on the target center wavelength $\lambda ct$ and the target spectral linewidth $\Delta\lambda ct$ to perform feedback control on the oscillation wavelength and the spectral linewidth of the light from the first semiconductor laser 111 even when the light emission trigger signal Tr is not inputted.

The laser system 1B according to the second embodiment further allows stabilization of the pulse energy of the pulsed laser light having undergone the excimer amplification because the laser system 1B outputs the trigger signal Tr11shut, which controls the open/close timing of the optical shutter 169, the trigger signal Tr11amp, which controls the light emission timing of the first pulse excitation light source 132, and the trigger signal Trex, which controls the discharge timing of the excimer amplifier 14, in synchronization with the trigger signal Trsoa #1 from the first semiconductor optical amplifier 120 to achieve precise synchronization. The trigger signal Trsoa #1 is a trigger signal configured to control the timing when current is caused to flow through the first semiconductor optical amplifier 120 and is an example of the "current trigger signal" in the present disclosure.

5.4 Variations 5.4.1 Example 2 of Control Subroutine (3) of Controlling First Semiconductor Laser The second embodiment has been described with reference to the case where the pulse current value Ap1 of the pulse current caused to flow through the first semiconductor laser 111 is controlled to control the spectral linewidth, and the spectral linewidth may instead be controlled by changing the delay period Td4, by which the timing when the pulse current is caused to flow through the first semiconductor optical amplifier 120 is delayed. The delay period Td4 specifies the timing when the first semiconductor optical amplifier 120 starts performing the amplification.

Figure 56:
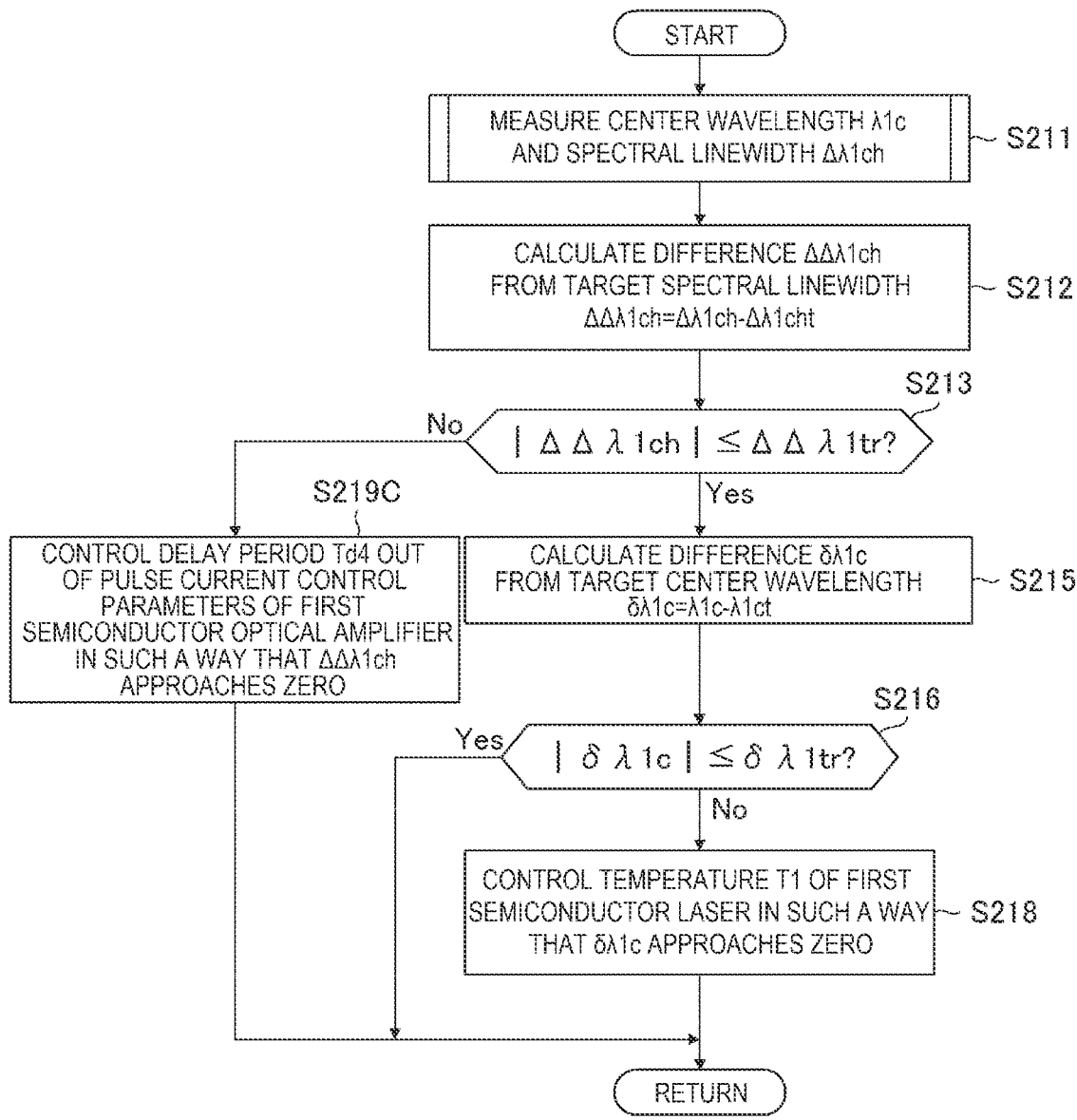
FIG. 56 is a flowchart showing Example 2 of the control subroutine (3) of controlling the first semiconductor laser.

FIG. 56 is a flowchart showing Example 2 of the control subroutine (3) of controlling the first semiconductor laser. The flowchart of FIG. 56 is applied to step S204A in FIG. 53. The flowchart of FIG. 56 is an example in which the delay period Td4 out of the pulse current control parameters of the first semiconductor optical amplifier 120 is controlled when the spectral linewidth is changed and the temperature T1 is controlled when the center wavelength is changed. The flowchart of FIG. 56 may be employed in place of the flowchart of FIG. 54. Differences in the flowchart between FIG. 56 and FIG. 54 will be described.

The flowchart shown in FIG. 56 includes step S219C in place of step S219B in FIG. 54. When the result of the evaluation in step S213 in FIG. 56 is No, the first semiconductor laser control section 114 proceeds to step S219C.

In step S219C, the first semiconductor laser control section 114 controls the delay period Td4, which is one of the pulse current control parameters of the first semiconductor optical amplifier 120, in such away that $\Delta\Delta\lambda 1ch$ approaches zero. After step S219C, the first semiconductor laser control section 114 terminates the flowchart of FIG. 56 and returns to the flowchart of FIG. 53.

Figure 57:
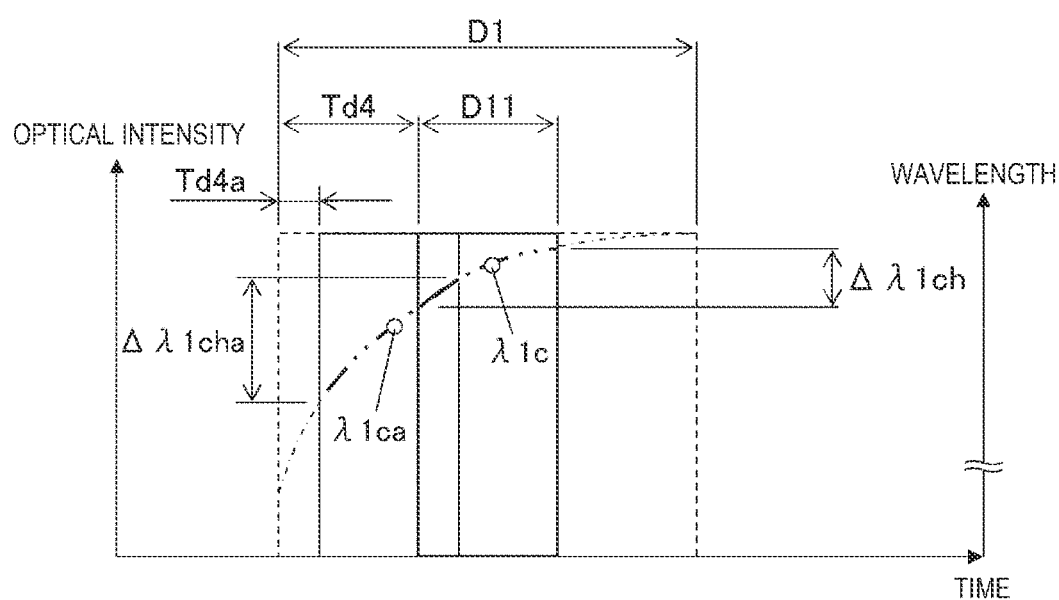
FIG. 57 is a graph showing the relationship between the chirping performed on the pulsed laser light outputted from the first semiconductor laser and the amplification performed by the first semiconductor optical amplifier.

FIG. 57 is a graph showing the relationship between the chirping performed on the pulsed laser light outputted from the first semiconductor laser 111 and the amplification performed by the first semiconductor optical amplifier 120 and shows a change in the relationship before and after the delay period Td4, by which the timing when the pulse current is caused to flow through the first semiconductor optical amplifier 120 is delayed, is changed. That is, FIG. 57 shows a graph of the relationship before the delay period Td4 is changed and a graph of the relationship after the delay period is changed to Td4a. The graph of the relationship before the delay period Td4 is changed is the same as the graph shown in FIG. 50. FIG. 57 shows a case where Td4a<Td4 is satisfied.

When the delay period is changed to Td4a, the region of the pulses amplified by the first semiconductor optical amplifier 120 is changed, as shown in FIG. 57. The chirping region where the first semiconductor optical amplifier 120 performs the amplification is changed, so that the spectral linewidth changes from $\Delta\lambda 1ch$ to $\Delta\lambda 1cha$, and the center wavelength changes from $\lambda 1c$ to $\lambda 1ca$.

Controlling the value of the delay period Td4 in accordance with the operation principle shown in FIG. 57 allows a target spectral linewidth to be achieved.

5.4.2 Example 3 of Control Subroutine (3) of Controlling First Semiconductor Laser The spectral linewidth is not necessarily controlled by controlling the delay period Td4 and may be controlled by changing the pulse width D11 of the pulse current caused to flow through the first semiconductor optical amplifier 120.

Figure 58:
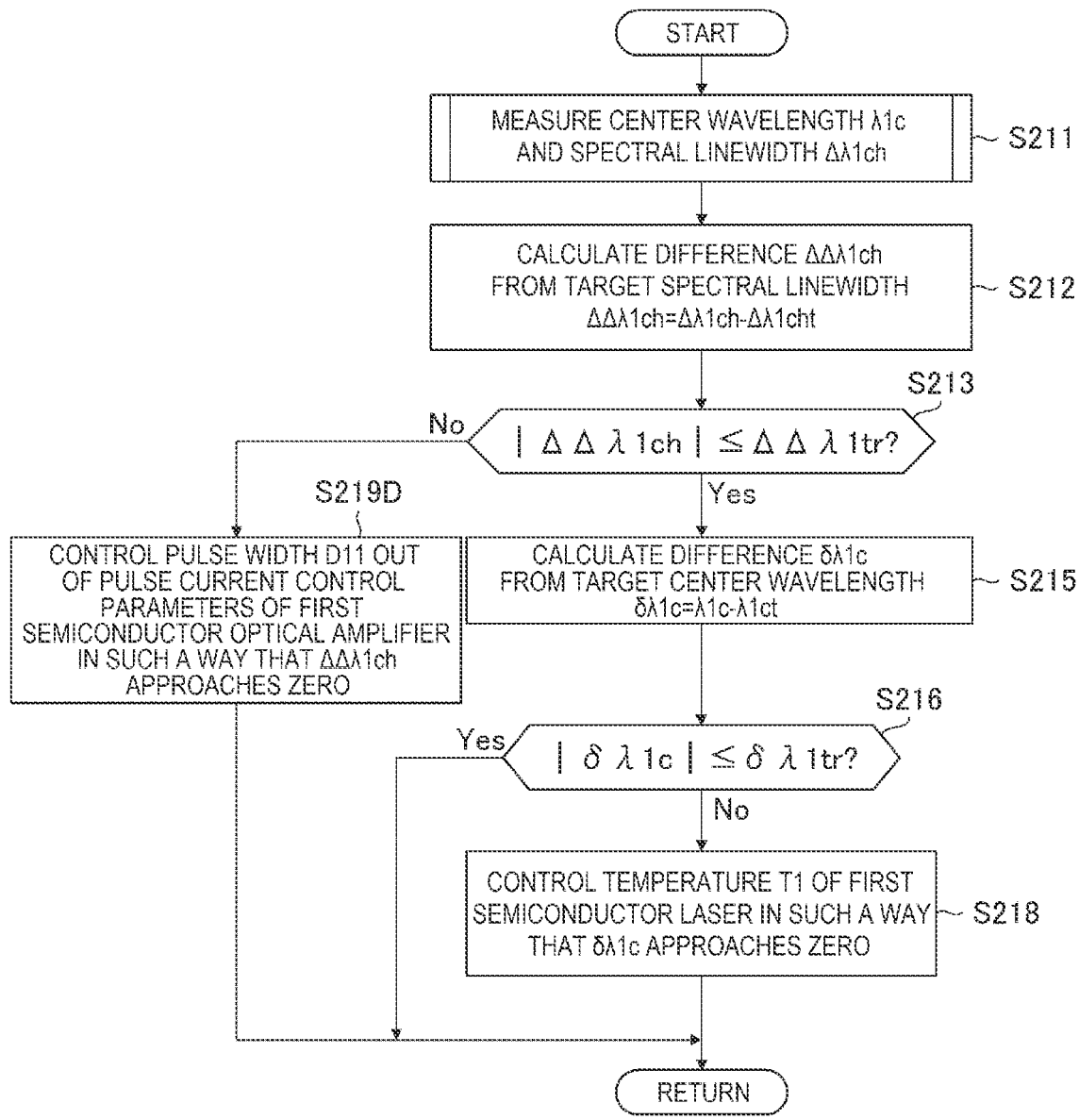
FIG. 58 is a flowchart showing Example 3 of the control subroutine (3) of controlling the first semiconductor laser.

FIG. 58 is a flowchart showing Example 3 of the control subroutine (3) of controlling the first semiconductor laser. The flowchart of FIG. 58 is applied to step S204A in FIG. 53. The flowchart of FIG. 58 is an example in which the pulse width D11 out of the pulse current control parameters of the first semiconductor optical amplifier 120 is controlled when the spectral linewidth is changed and the temperature T1 is controlled when the center wavelength is changed. The flowchart of FIG. 58 may be employed in place of the flowchart of FIG. 54. Differences in the flowchart between FIG. 58 and FIG. 54 will be described.

The flowchart of FIG. 58 includes step S219D in place of step S219B in FIG. 54. When the result of the evaluation in step S213 in FIG. 58 is No, the first semiconductor laser control section 114 proceeds to step S219D.

In step S219D, the first semiconductor laser control section 114 controls the pulse width D11, which is one of the pulse current control parameters of the first semiconductor optical amplifier 120, in such away that $\Delta\Delta\lambda 1ch$ approaches zero. After step S219D, the first semiconductor laser control section 114 terminates the flowchart of FIG. 58 and returns to the flowchart of FIG. 53.

Figure 59:
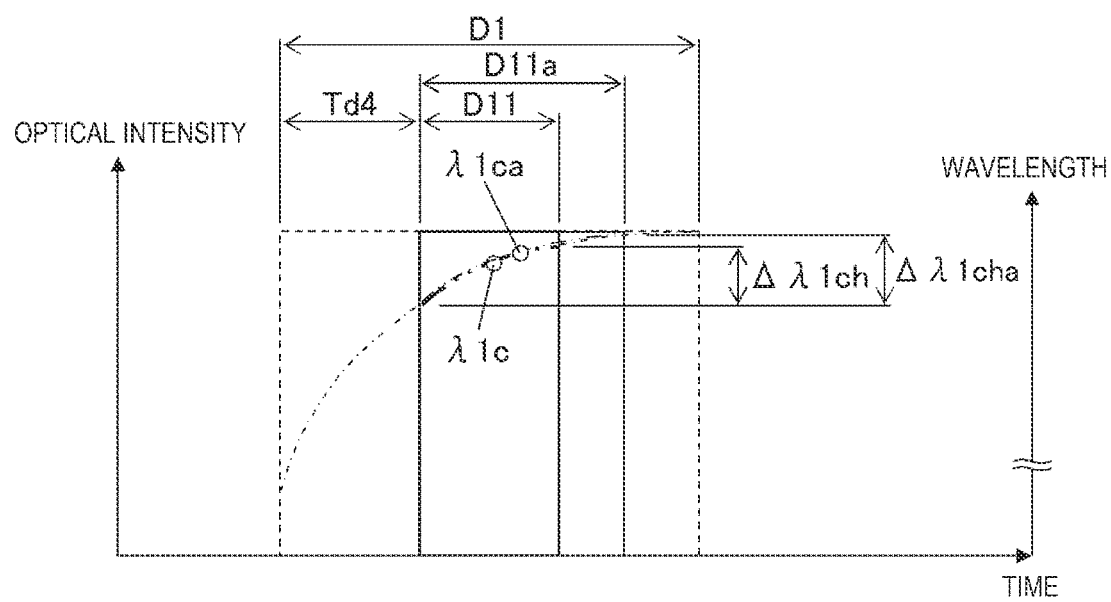
FIG. 59 is a graph showing the relationship between the chirping performed on the pulsed laser light outputted from the first semiconductor laser and the amplification performed by the first semiconductor optical amplifier.

FIG. 59 is a graph showing the relationship between the chirping performed on the pulsed laser light outputted from the first semiconductor laser 111 and the amplification performed by the first semiconductor optical amplifier 120 and shows a change in the relationship before and after the pulse width D11 of the pulse current caused to flow through the first semiconductor optical amplifier 120 is changed. That is, FIG. 59 shows a graph of the relationship before the pulse width D11 is changed and a graph of the relationship after the pulse width is changed to D11a. The graph of the relationship before the pulse width D11 is changed is the same as the graph shown in FIG. 50. FIG. 59 shows a case where D11<D11a is satisfied.

When the pulse width is changed from D11 to D11a, the region of the pulses amplified by the first semiconductor optical amplifier 120 is changed, as shown in FIG. 59. The chirping region where the first semiconductor optical amplifier 120 performs the amplification is therefore changed, so that the spectral linewidth changes from $\Delta\lambda 1ch$ to $\Delta\lambda 1cha$, and the center wavelength changes from $\lambda 1c$ to $\lambda 1ca$.

Controlling the value of the pulse width D11 in accordance with the operation principle described above allows a target spectral linewidth to be achieved.

5.4.3 Example 4 of Control Subroutine (3) of Controlling First Semiconductor Laser The spectral linewidth and the center wavelength may be controlled by changing both the delay period Td4, by which the timing when the pulse current is caused to flow through the first semiconductor optical amplifier 120 is delayed, and the pulse width D11 of the pulse current.

Figure 60:
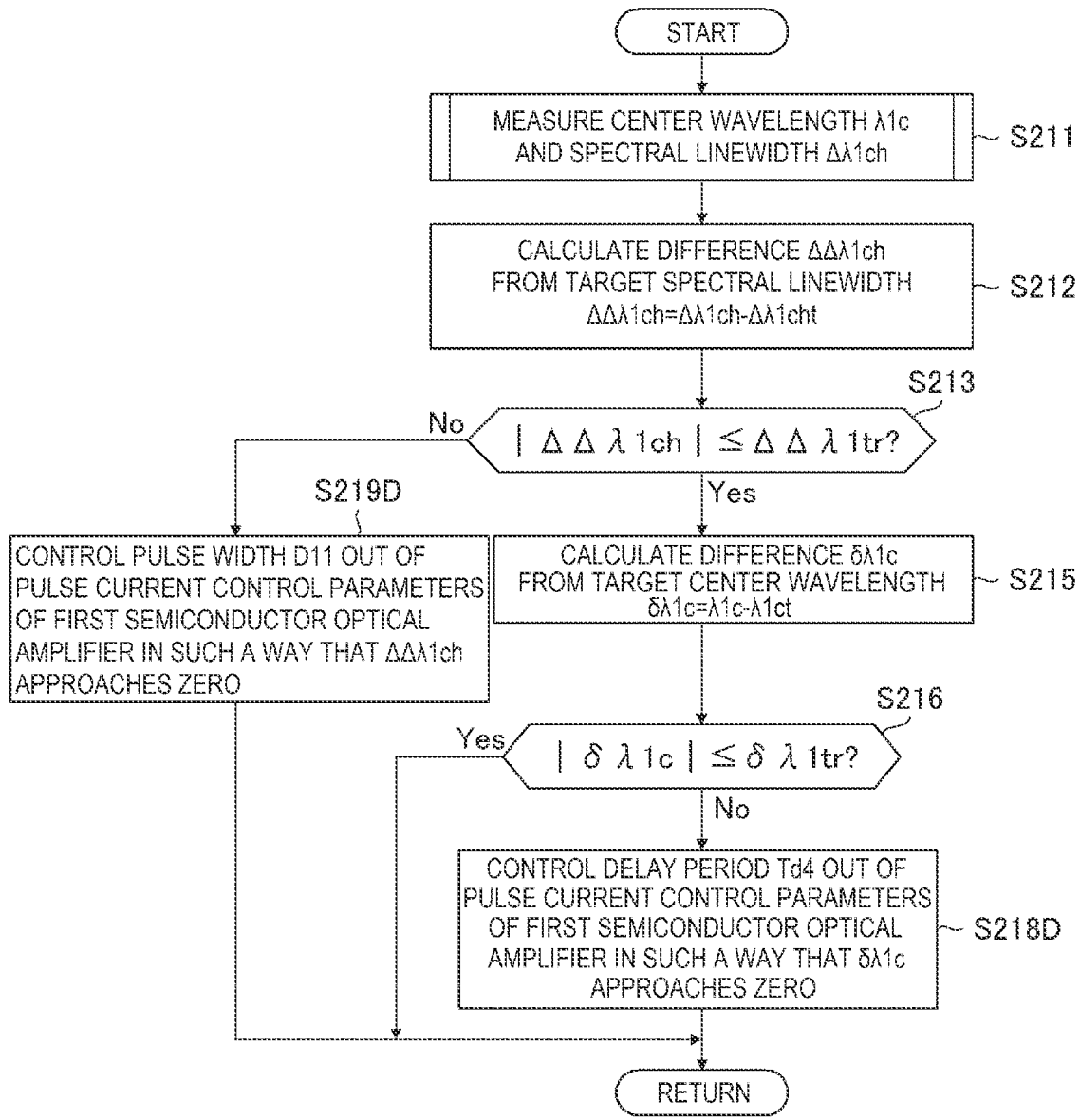
FIG. 60 is a flowchart showing Example 4 of the control subroutine (3) of controlling the first semiconductor laser.

FIG. 60 is a flowchart showing Example 4 of the control subroutine (3) of controlling the first semiconductor laser. The flowchart of FIG. 60 is applied to step S204A in FIG. 53. The flowchart of FIG. 60 is an example in which the pulse width D11 out of the pulse current control parameters of the first semiconductor optical amplifier 120 is controlled when the spectral linewidth is changed and the delay period Td4 is controlled when the center wavelength is changed. The flowchart of FIG. 60 may be employed in place of the flowchart of FIG. 58. Differences in the flowchart between FIG. 60 and FIG. 58 will be described.

The flowchart of FIG. 60 includes step S218D in place of step S218 in FIG. 58. When the result of the evaluation in step S216 in FIG. 59 is No, the first semiconductor laser control section 114 proceeds to step S218D.

In step S218D, the first semiconductor laser control section 114 controls the delay period Td4, which is one of the current control parameters of the first semiconductor optical amplifier 120, in such a way that $\delta\lambda 1c$ approaches zero. After step S218D, the first semiconductor laser control section 114 terminates the flowchart of FIG. 60 and returns to the flowchart of FIG. 53.

Figure 61:
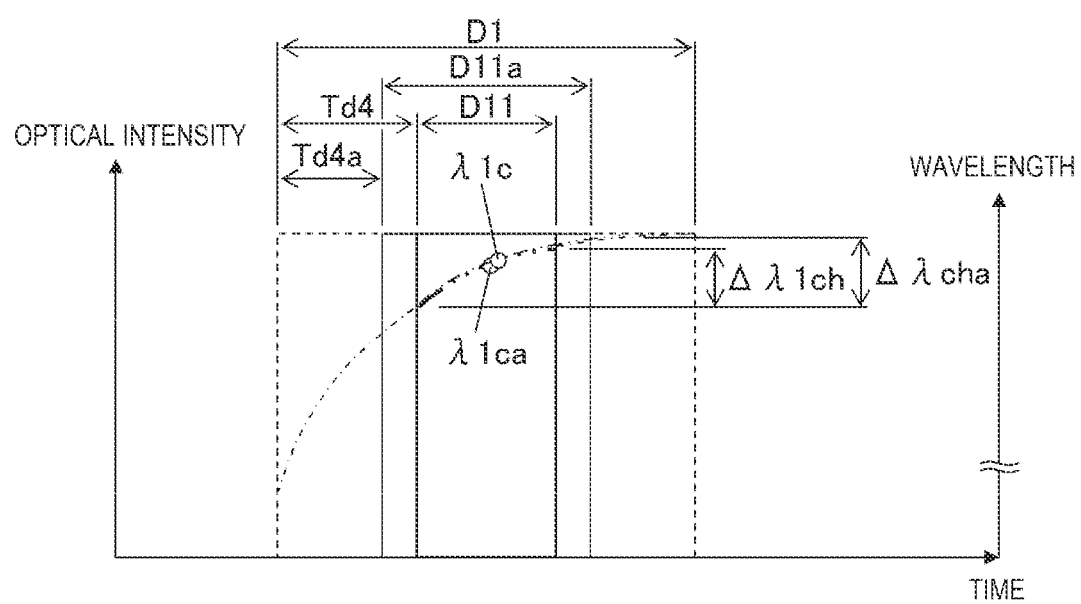
FIG. 61 is a graph showing the relationship between the chirping performed on the pulsed laser light outputted from the first semiconductor laser and the amplification performed by the first semiconductor optical amplifier.

FIG. 61 is a graph showing the relationship between the chirping performed on the pulsed laser light outputted from the first semiconductor laser 111 and the amplification performed by the first semiconductor optical amplifier 120 and shows a change in the relationship before and after both the delay period Td4, by which the timing when the pulse current is caused to flow through the first semiconductor optical amplifier 120 is delayed, and the pulse width D11 of the pulse current are changed. That is, FIG. 61 shows a graph of the relationship before the delay period Td4 and the pulse width D11 are changed and a graph of the relationship after the delay period and the pulse width are changed to Td4a and D11a, respectively. The graph of the relationship before the delay period Td4 and the pulse width D11 are changed is the same as the graph shown in FIG. 50. FIG. 61 shows a case where Td4a<Td4 and D1<D11a are satisfied.

When the delay period is changed from Td4 to Td4a and the pulse width is changed from D11 to D11a, the region of the pulses amplified by the first semiconductor optical amplifier 120 is changed, as shown in FIG. 60. The chirping region where the first semiconductor optical amplifier 120 performs the amplification is therefore changed, so that the spectral linewidth changes from $\Delta\lambda 1ch$ to $\Delta\lambda 1cha$, and the center wavelength changes from $\lambda 1c$ to $\lambda 1ca$.

Controlling the values of the delay period Td4 and the pulse width D11 in accordance with the operation principle described above allows a target spectral linewidth and a target center wavelength to be achieved. In the method described above, in which the control parameters of the first semiconductor laser 111 are not changed but the pulse current control parameters of the first semiconductor optical amplifier 120 are changed, the control speed is further increased.

6. Third Embodiment 6.1 Configuration

Figure 62:
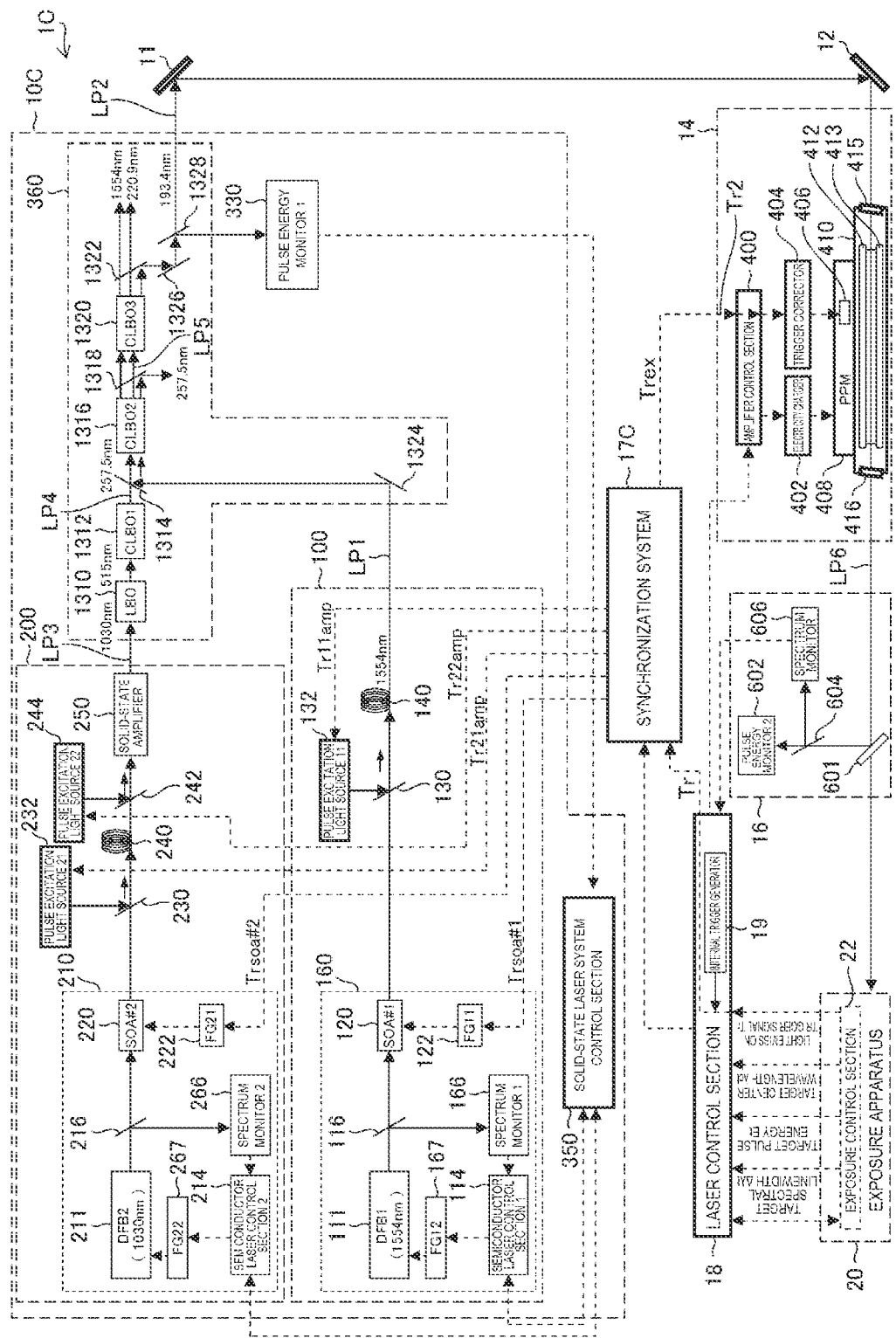
FIG. 62 schematically shows the configuration of a laser system according to a third embodiment.

FIG. 62 schematically shows the configuration of a laser system 1C according to a third embodiment. Differences from FIG. 20 will be described. The laser system 1C shown in FIG. 62 includes a solid-state laser system 10C and a synchronization system 17C in place of the solid-state laser system 10 and the synchronization system 17 in FIG. 20.

The solid-state laser system 10C includes the first solid-state laser apparatus 100, a second solid-state laser apparatus 200, and a wavelength conversion system 360. The configuration of the first solid-state laser apparatus 100 is the same as the configuration described with reference to FIG. 20. It is, however, noted that the solid-state laser apparatus 100 in FIG. 20 differs from the solid-state laser apparatus 100 shown in FIG. 62 in that the oscillation wavelength is about 1547.2 nm in the former case and the oscillation wavelength is about 1554.0 nm in the latter case.

The second solid-state laser apparatus 200 includes a second semiconductor laser system 210, which outputs laser light having a wavelength of about 1030 nm, a second dichroic mirror 230, a second pulse excitation light source 232, a Yb fiber amplifier 240, a third dichroic mirror 242, a third pulse excitation light source 244, and a solid-state amplifier 250.

The second semiconductor laser system 210 has the same configuration as that of the first semiconductor laser system 160 and includes a second semiconductor laser 211, which operates in a single longitudinal mode in CW oscillation and outputs laser light having the wavelength of about 1030 nm, a second beam splitter 216, a second semiconductor optical amplifier 220, a second spectrum monitor 266, a function generator 222, a function generator 267, and a second semiconductor laser control section 214.

The second semiconductor laser 211 may, for example, be a DFB laser and can change the oscillation wavelength to a value around the wavelength of 1030 nm by using current control and/or temperature control. The configuration of the second semiconductor laser 211 may be the same as the configuration shown in FIG. 21.

The second beam splitter 216 is so disposed as to reflect part of the laser light outputted from the second semiconductor laser 211 and cause the reflected laser light to be incident on the second spectrum monitor 266. The second spectrum monitor 266 is configured to monitor the spectrum of the incident laser light and detect the oscillation wavelength and the spectral linewidth of the light from the second semiconductor laser 211.

The second semiconductor laser control section 214 is connected to the second spectrum monitor 266 and the solid-state laser system control section 350 and is configured to control the operation of the second semiconductor laser 211.

The second semiconductor optical amplifier 220 is disposed in the optical path of the laser light having passed through the second beam splitter 216. The second semiconductor optical amplifier 220 is configured to amplify the laser light outputted from the second semiconductor laser 211 into pulsed laser light.

The second dichroic mirror 230 is a mirror coated with a film configured to transmit at high transmittance the laser light outputted from the second semiconductor optical amplifier 220 and reflect at high reflectance excitation light outputted from the second pulse excitation light source 232. The second dichroic mirror 230 is so disposed as to cause the pulsed laser light outputted from the second semiconductor optical amplifier 220 and the excitation light outputted from the second pulse excitation light source 232 to enter the Yb fiber amplifier 240.

The Yb fiber amplifier 240 is an optical fiber amplifier using an optical fiber to which Yb (Ytterbium) has been doped. The third dichroic mirror 242 is a mirror coated with a film configured to transmit at high transmittance the laser light outputted from the Yb fiber amplifier 240 and reflect at high reflectance excitation light outputted from the third pulse excitation light source 244. The third dichroic mirror 242 is so disposed as to cause the pulsed laser light outputted from the Yb fiber amplifier 240 and the excitation light outputted from the third pulse excitation light source 244 to enter the solid-state amplifier 250.

The solid-state amplifier 250 may contain, for example, a crystal or ceramic material to which Yb has been doped. The pulsed laser light amplified by the solid-state amplifier 250 enters the wavelength conversion system 360. Pulsed laser light LP3 outputted from the second solid-state laser apparatus 200 may be the pulsed laser light amplified by the solid-state amplifier 250.

The wavelength conversion system 360 is a system configured to convert in terms of wavelength into the wavelength of about 193.4 nm through generating pulsed laser light LP5 (having wavelength of about 220.9 nm) corresponding to the sum frequency of the fourth harmonic light (having wavelength of about 267.5 nm) of the pulsed laser light LP3 outputted from the second solid-state laser apparatus 200 and the pulsed laser light LP1 (having wavelength of about 1554 nm) outputted from the first solid-state laser apparatus 100 and obtaining the sum frequency of the pulsed laser light LP5 having the summed frequency (wavelength of about 220.9 nm) and the pulsed laser light LP1 (having wavelength of about 1554 nm).

The wavelength conversion system 360 includes an LBO (LiB$_3$O$_5$) crystal 1310 and a first CLBO (CsLiB$_6$O$_{10}$) crystal 1312, which are each a nonlinear crystal, a fourth dichroic mirror 1314, a second CLBO crystal 1316, a fifth dichroic mirror 1318, a third CLBO crystal 1320, a sixth dichroic mirror 1322, a third high reflectance mirror 1324, a fourth high reflectance mirror 1326, and a beam splitter 1328.

The LBO crystal 1310 and the first CLBO crystal 1312 are disposed in the optical path of the pulsed laser light LP3 having the wavelength of about 1030 nm and are so disposed as to convert the pulsed laser light LP3 in terms of wavelength into pulsed laser light LP4 (having wavelength of about 257.5 nm), which is the fourth harmonics.

The third high reflectance mirror 1324 is so disposed as to reflect at high reflectance the pulsed laser light LP1 (having wavelength of about 1554 nm) outputted from the first solid-state laser apparatus 100 and cause the reflected light to be incident on the fourth dichroic mirror 1314.

The fourth dichroic mirror 1314 is coated with a film configured to transmit at high transmittance the pulsed laser light LP4 outputted from the first CLBO crystal 1312 and reflect at high reflectance the pulsed laser light LP1 outputted from the first solid-state laser apparatus 100. The fourth dichroic mirror 1314 is disposed in the optical path between the first CLBO crystal 1312 and the second CLBO crystal 1316 and is so disposed as to cause the pulsed laser light LP1 and the pulsed laser light LP4 to enter the second CLBO crystal 1316 with the optical path axes thereof coinciding with each other.

The second CLBO crystal 1316, the fifth dichroic mirror 1318, the third CLBO crystal 1320, and the sixth dichroic mirror 1322 are arranged in this order along the optical path of the pulsed laser light containing the pulsed laser light LP4.

The second CLBO crystal 1316 is configured to generate the pulsed laser light LP5 (having wavelength of about 220.9 nm) corresponding to the sum frequency of the pulsed laser light LP3 and the pulsed laser light LP4. The fifth dichroic mirror 1318 is coated with a film configured to reflect at high reflectance the pulsed laser light LP4 (having wavelength of about 257.5 nm) having passed through the second CLBO crystal 1316 and transmit at high transmittance the pulsed laser light LP1 (having wavelength of about 1554 nm) and the pulsed laser light LP5 (having wavelength of about 220.9 nm).

The third CLBO crystal 1320 is configured to generate pulsed laser light (having wavelength of about 193.4 nm) corresponding to the sum frequency of the pulsed laser light LP1 and the pulsed laser light LP5. The pulsed laser light outputted from the third CLBO crystal 1320 and having the wavelength of about 193.4 nm forms the pulsed laser light LP2 to be outputted from the solid-state laser system 10C.

The sixth dichroic mirror 1322 is coated with a film configured to transmit at high transmittance the pulsed laser light LP1 (having wavelength of about 1554 nm) and the pulsed laser light LP5 (having wavelength of about 220.9 nm) having passed through the third CLBO crystal 1320 and reflect at high reflectance the pulsed laser light LP2 having the wavelength of about 193.4 nm.

The fourth high reflectance mirror 1326 is so disposed as to cause the pulsed laser light LP2 having the wavelength of about 193.4 nm to be outputted from the wavelength conversion system 300.

The beam splitter 1328 is so disposed in the optical path of the light reflected off the fourth high reflectance mirror 1326 as to cause part of the reflected laser light to enter the first pulse energy monitor 330.

To synchronize the second solid-state laser apparatus 200 added to the solid-state laser system 10C, the synchronization system 17C has an additional configuration.

Figure 63:
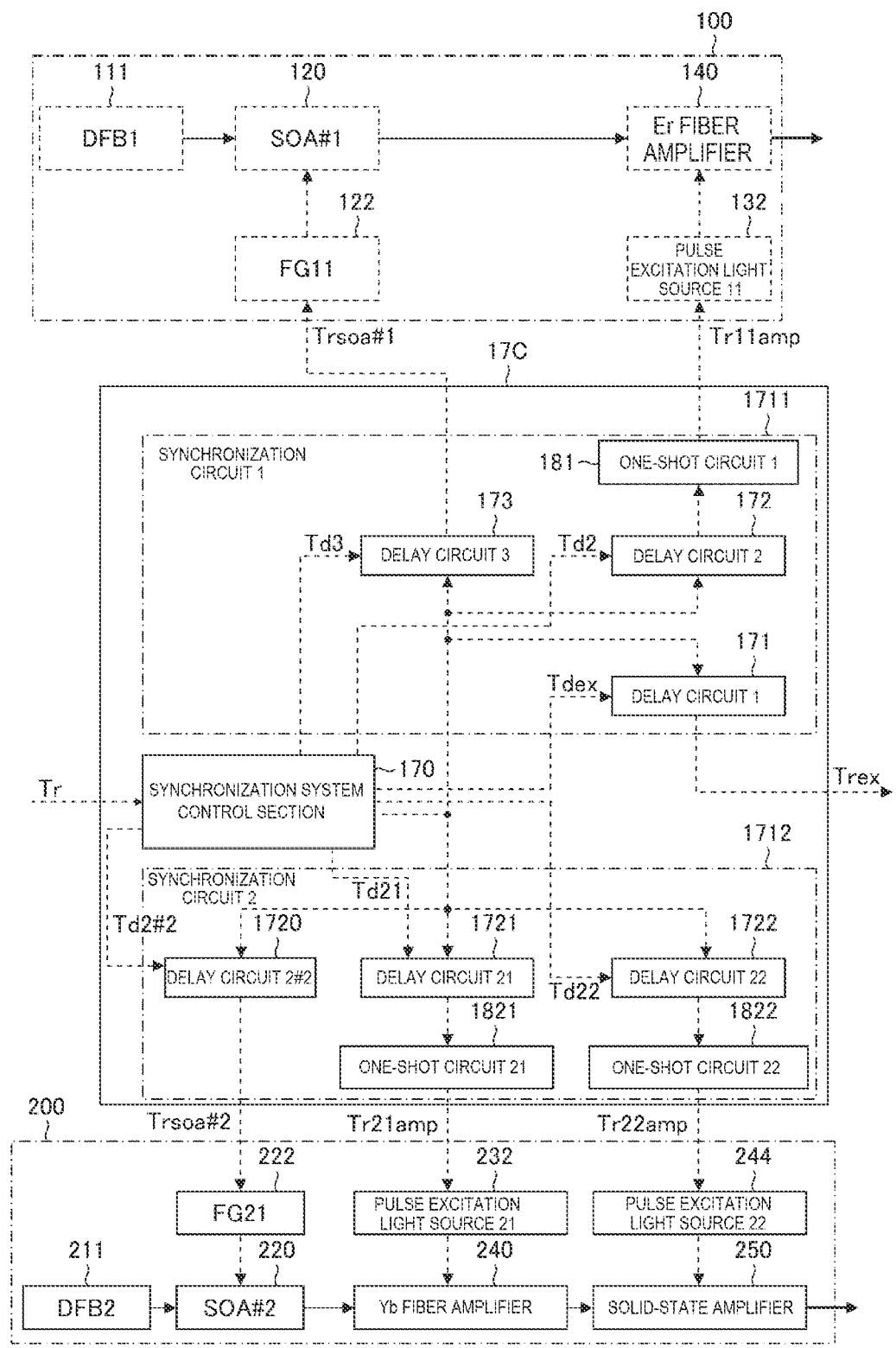
FIG. 63 is a block diagram schematically showing the configuration of a synchronization system in the third embodiment.

FIG. 63 is a block diagram schematically showing the configuration of the synchronization system 17C. The synchronization system 17C includes a first synchronization circuit 1711, a second synchronization circuit 1712, and a synchronization system control section 170. In FIG. 63, the notations of "synchronization circuit 1" and "synchronization circuit 2" represent the first synchronization circuit 1711 and the second synchronization circuit 1712, respectively. The configuration of the first synchronization circuit 1711 is the same as the configuration described with reference to FIG. 6.

The second synchronization circuit 1712 is a circuit configured to generate trigger signals Trsoa #2, Tr21amp, and Tr22amp, which cause the second solid-state laser apparatus 200 to operate. The trigger signal Trsoa #2 is a signal configured to control the timing when the second semiconductor optical amplifier 220 performs the amplification. The trigger signal Tr21amp is a signal configured to control the timing when the second pulse excitation light source 232 emits light. The trigger signal Tr22amp is a signal configured to control the timing when the third pulse excitation light source 244 emits light.

The second synchronization circuit 1712 includes a fourth delay circuit 1720, a fifth delay circuit 1721, a sixth delay circuit 1722, a second one-shot circuit 1821, and a third one-shot circuit 1822.

The fourth delay circuit 1720 is configured to output the trigger signal Trsoa #2, which is delayed by a delay period Td2 #2 with respect to the light emission trigger signal Tr. The trigger signal Trsoa #2 is inputted to the function generator 222.

The fifth delay circuit 1721 is configured to output a pulse signal delayed by a delay period Td21 with respect to the light emission trigger signal Tr. The second one-shot circuit 1821 is configured to output the trigger signal Tr21amp, which synchronizes with the pulse signal from the fifth delay circuit 1721. The trigger signal Tr21amp is inputted to the second pulse excitation light source 232.

The sixth delay circuit 1722 is configured to output a pulse signal delayed by a delay period Td22 with respect to the light emission trigger signal Tr. The third one-shot circuit 1822 is configured to output the trigger signal Tr22amp, which synchronizes with the pulse signal from the sixth delay circuit 1722. The trigger signal Tr22amp is inputted to the third pulse excitation light source 244.

The delay periods Td2 #2, Td21, and Td22 are so set that the pulsed laser light amplified by the second semiconductor optical amplifier 220 is amplified by the Yb fiber amplifier 240 and the solid-state amplifier 250. Further, in the wavelength conversion system 360, the fourth harmonic light (257.5 nm) and the pulsed laser light (1554 nm) outputted from the first solid-state laser apparatus 100 are so adjusted as to temporally coincide with each other.

The synchronization system control section 170 is configured to set the delay periods Td2 #2, Td21, and Td22 in the fourth delay circuit 1720, the fifth delay circuit 1721, and the sixth delay circuit 1722, respectively.

6.2 Operation

The laser control section 18 is configured to transmit data on a target center wavelength $\lambda 2ct$ and a target spectral linewidth $\Delta\lambda 2cht$ to the second semiconductor laser control section 214 of the second solid-state laser apparatus 200 via the solid-state laser system control section 350. The target center wavelength $\lambda 2ct$ is, for example, 1030 nm. The target spectral linewidth $\Delta\lambda 2cht$ may, for example, be a spectral linewidth $\Delta\lambda 2ch0$, which suppresses occurrence of SBS in the Yb fiber amplifier 240.

The second semiconductor laser control section 214 is configured to control, based on the values of the center wavelength and the spectral linewidth detected by the second spectrum monitor 266, the values of current control parameters to be sent to the function generator 222 in such a way that both the center wavelength and the spectral linewidth are target values.

When the solid-state laser system control section 350 receives the data on the target center wavelength $\lambda ct$ from the exposure control section 22 via the laser control section 18, the solid-state laser system control section 350 calculates the target center wavelength $\lambda 1ct$ of the light from the first semiconductor laser system 160 by using the following calculation formula in such a way that the calculated target center wavelength $\lambda 1ct$ is equal to the target center wavelength $\lambda ct$.

$$ft = 4 \cdot f2t + 2 \cdot f1t \quad (10)$$

ft: Frequency of laser light having wavelength converted by sum frequency
f1t: Frequency of laser light from first solid-state laser apparatus
f2t: Frequency of laser light from second solid-state laser apparatus Expression (10) is deformed into Expression (11) below.

$$f1t = (ft - 4 \cdot f2t)/2 \quad (11)$$

The members $f1t = C/\lambda 1ct$ and $ft = C/\lambda ct$ are substituted into Expression (11) to calculate f1t, and the resultant f1t is converted into a wavelength. A target center wavelength of the light from the first solid-state laser apparatus 100 can thus be calculated. The conversion from the frequency into the wavelength is expressed by Expression (12) below.

$$\lambda 1ct = C/f1t \quad (12)$$

The constant C in Expression (12) represents the speed of light.

The laser control section 18 is configured to transmit data on the target center wavelength $\lambda 1ct$ to the solid-state laser system control section 350.

When the laser control section 18 receives data on the target spectral linewidth $\Delta\lambda ct$ from the exposure control section 22, the laser control section 18 calculates the target spectral linewidth $\Delta\lambda 1cht$ of the first semiconductor laser system 160 in such a way that the calculated target spectral linewidth $\Delta\lambda 1cht$ is equal to the target spectral linewidth $\Delta\lambda ct$ and transmit data on the target spectral linewidth $\Delta\lambda 1cht$ of the first solid-state laser apparatus 100 to the solid-state laser system control section 350. The correlation between $\Delta\lambda t$ and $\Delta\lambda ch$ may be saved in advance in the form of table data or a function.

When the first semiconductor laser control section 114 receives data on the target spectral linewidth $\Delta\lambda 1cht$ and the target center wavelength $\lambda 1ct$, the first semiconductor laser control section 114 measures the spectral linewidth $\Delta\lambda 1ch$ and the center wavelength $\lambda 1c$ detected by the first spectrum monitor 166 and calculates the difference $\Delta\Delta\lambda 1ch$ ($=\Delta\lambda 1ch - \Delta\lambda cht$) and the difference $\delta\lambda 1c$ ($=\lambda 1c - \lambda 1ct$) from the respective target values.

The first semiconductor laser control section 114 then controls the AC component value A1ac, which represents the amount of variation in the AC component, which is one of the current control parameters of the current caused to flow through the first semiconductor laser 111, in such a way that $\Delta\Delta\lambda 1ch$ approaches zero.

The first semiconductor laser control section 114 further controls the DC component value A1dc, which is one of the current control parameters of the current caused to flow through the first semiconductor laser 111, in such a way that $\delta\lambda 1c$ approaches zero (see FIG. 33). The first semiconductor laser control section 114 alternatively controls the temperature T1 of the first semiconductor laser 111 in such a way that $\delta\zeta 1c$ approaches zero (see FIG. 34).

6.3 Effects and Advantages

The laser system 1C according to the third embodiment provides the following effects.

[1] The laser light outputted from the first semiconductor laser 111 in the first semiconductor laser system 160 is caused to chirp, whereby the spectral linewidth of the excimer laser light after the pulse amplification can be precisely controlled.

[2] When the laser system 1C receives data on the target spectral linewidth from the exposure control section 22, the first semiconductor laser system 160 can perform the feedback control before the pulse amplification is performed, whereby the spectral linewidth control speed is improved.

[3] The laser system 1C, in which the first semiconductor laser 111 in the first semiconductor laser system 160 and the second semiconductor laser 211 in the second semiconductor laser system 210 are each caused to undergo chirping, suppresses occurrence of SBS in each of the Er fiber amplifier 140 and the Yb fiber amplifier 240. Breakage of the Er fiber amplifier 140, the Yb fiber amplifier 240, the first semiconductor laser system 160, and the second semiconductor laser system 210 can therefore be suppressed.

In the third embodiment, the laser light outputted from the second semiconductor laser 211 is an example of the "second laser light" in the present disclosure. The pulsed laser light outputted from the second semiconductor optical amplifier 220 is an example of the "fourth pulsed laser light" in the present disclosure. The Yb fiber amplifier 240 is an example of the "second amplifier" in the present disclosure. The pulsed laser light outputted from the Yb fiber amplifier 240 is an example of the "fifth pulsed laser light" in the present disclosure. The pulsed laser light outputted from the solid-state amplifier 250 is an example of the "sixth pulsed laser light" in the present disclosure. The combination of the current control section 54 and the function generator 267 used in the second semiconductor laser 211 is an example of the "second current controller" in the present disclosure.

6.4 Variations 6.4.1 Use of Semiconductor Laser Configured to Oscillate in Multiple Longitudinal Modes In the third embodiment, the second semiconductor laser 211 of the second solid-state laser apparatus 200 is caused to undergo chirping to suppress SBS, but not necessarily, and the second semiconductor laser may be a CW-oscillation semiconductor laser configured to oscillate in multiple longitudinal modes and capable of suppressing SBS.

6.4.2 Combination with Configuration Described in Second Embodiment

The third embodiment has been described with reference to the case where the AC component value A1$ac$ and the DC component value A1$dc$, which form the current control parameters of the first semiconductor laser 111, are controlled to control the chirping, but not necessarily, and the values of the pulse current control parameters of the first semiconductor laser 111 and the values of the pulse current control parameters of the first semiconductor optical amplifier 120 may be controlled to control the chirping as described in the second embodiment. The configuration described with reference to FIGS. 45 and 46 may be applied to the configuration of the third embodiment.

6.4.3 Chirping Control Using Second Solid-State Laser Apparatus

In the third embodiment, the center wavelength and the spectral linewidth of the pulsed laser light outputted from the first solid-state laser apparatus 100 are changed to control the center wavelength and the spectral linewidth of the pulsed laser light converted in terms of wavelength by the wavelength conversion system 360, but not necessarily, and the chirping performed on the pulsed laser light outputted from at least one of the first solid-state laser apparatus 100 and the second solid-state laser apparatus 200 is controlled to control the center wavelength and the spectral linewidth. The spectral linewidth of the pulsed laser light after the excimer amplification can thus be precisely controlled.

Figure 64:
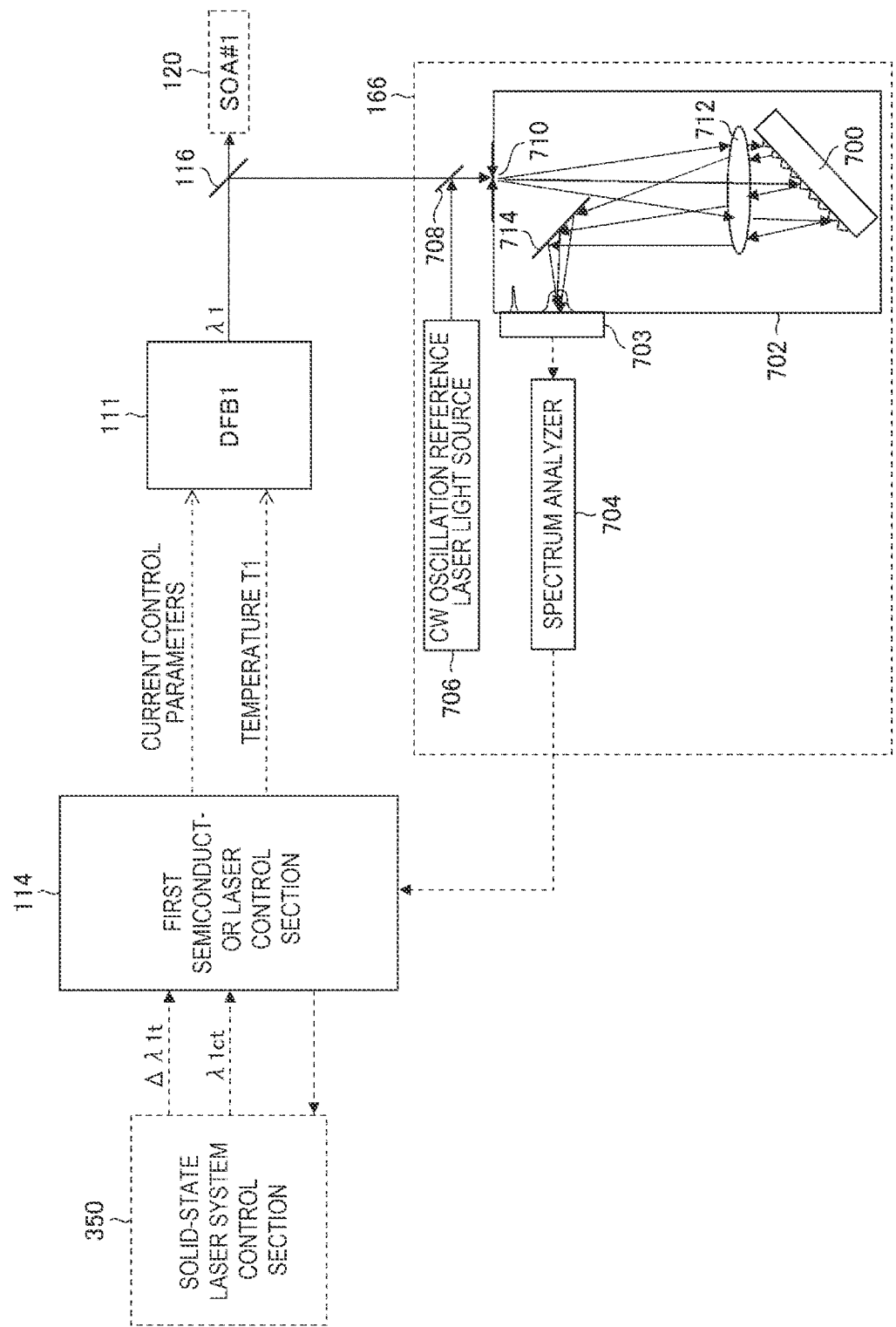
FIG. 64 schematically shows an example of the configuration of any of the spectrum monitors.

7. Specific Example of Spectrum Monitors 7.1 Example of Spectrum Monitor Using Spectrometer and Reference Laser Light Source 7.1.1 Configuration FIG. 64 schematically shows an example of the configuration of any of the spectrum monitors. FIG. 64 shows an example of the first spectrum monitor 166, and the same configuration as that shown in FIG. 64 may be applied to the configuration of the second spectrum monitor 266.

The first spectrum monitor 166 shown in FIG. 64 includes a spectrometer 702 including a grating 700, a linear sensor 703, a spectrum analyzer 704, a CW oscillation reference laser light source 706, and a beam splitter 708.

The spectrometer 702 includes a light incident slit 710, a collimator lens 712, and a high reflectance mirror 714. The CW oscillation reference laser light source 706 is a reference light source configured to output laser light resulting from CW oscillation and having a reference wavelength. In the description, the laser light outputted from the CW oscillation reference laser light source 706 and having the reference wavelength is called "reference laser light." The laser light outputted from the first semiconductor laser 111 is called "first semiconductor laser light." In FIG. 64, "$\lambda 1$" represents the wavelength of the first semiconductor laser light.

7.1.2 Operation

In FIG. 64, part of the laser light outputted from the first semiconductor laser 111 (first semiconductor laser light) is reflected off the first beam splitter 116. The laser light reflected off the first beam splitter 116 passes through the beam splitter 708. The reference laser light outputted from the CW oscillation reference laser light source 706 is reflected off the beam splitter 708 and superimposed on the first semiconductor laser light having passed through the beam splitter 708.

The laser light superimposed by the beam splitter 708 on the reference laser light enters the spectrometer 702 via the light incident slit 710. The laser light having passed through the light incident slit 710 is incident on the grating 700 via the collimator lens 712 and is spectrally separated by the grating 700. Measuring slit images of the first semiconductor laser light and the reference laser light brought into focus on the linear sensor 703 via the collimator lens 712 and the high reflectance mirror 714 allows measurement of the center wavelength and the spectral linewidth of the light from the first semiconductor laser 111.

FIG. 64 shows the spectrometer 702 including the grating 700 by way of example, and an etalon spectrometer shown in FIG. 68, which will be described later, may instead be used.

Figure 65:
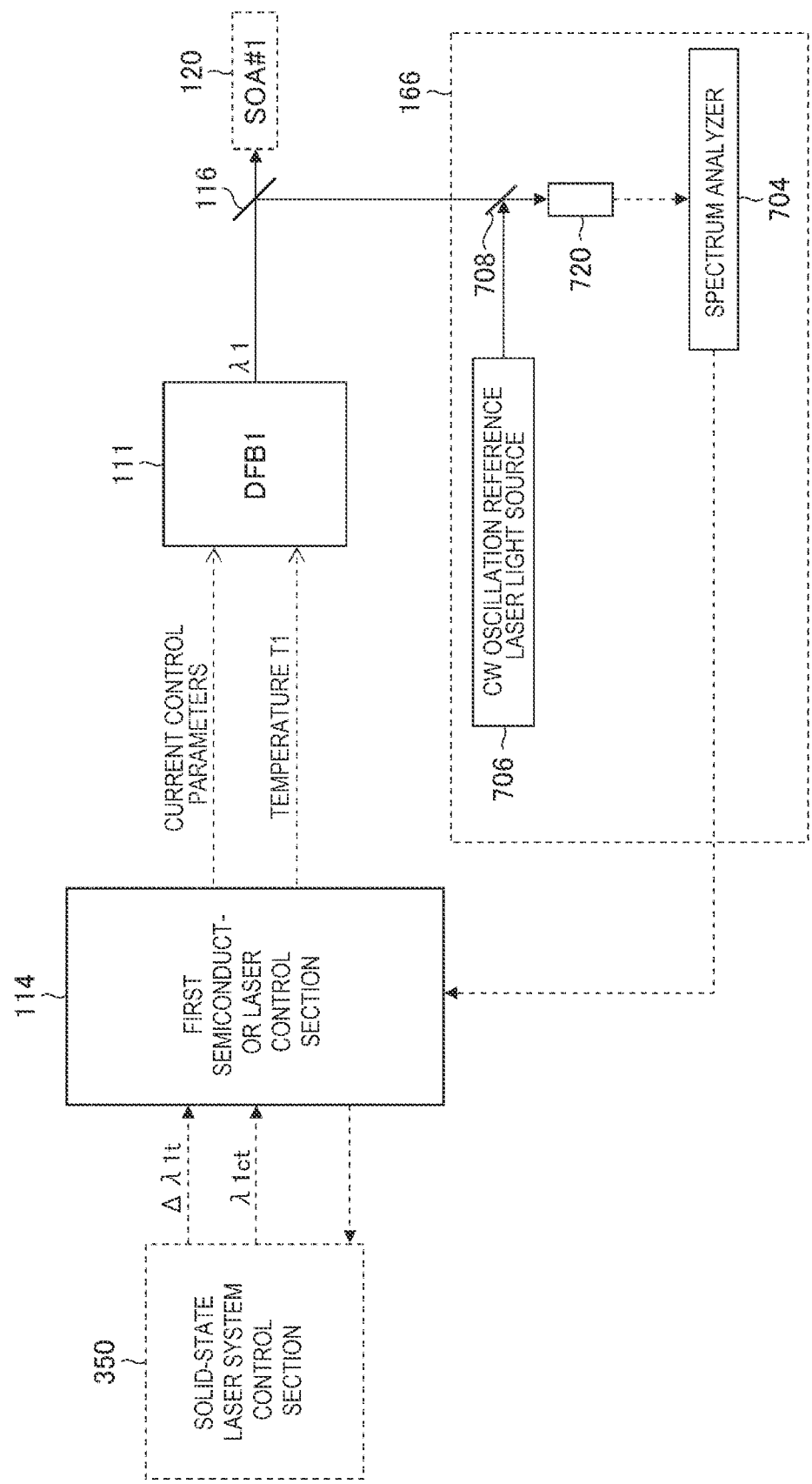
FIG. 65 schematically shows another example of the configuration of any of the spectrum monitors.

7.2 Example of Spectrum Monitor Using Heterodyne Interferometer 7.2.1 Configuration FIG. 65 schematically shows another example of the configuration of any of the spectrum monitors. FIG. 65 shows an example of the first spectrum monitor 166. As the first spectrum monitor 166, a configuration including a heterodyne interferometer may be employed, as shown in FIG. 65. The first spectrum monitor 166 shown in FIG. 65 includes the CW oscillation reference laser light source 706, the beam splitter 708, an optical intensity sensor 720, and the spectrum analyzer 704.

The beam splitter 708 is disposed in the optical path between the first beam splitter 116 and the optical intensity sensor 720, as shown in FIG. 65. The beam splitter 708 is so disposed as to cause light that is a result of superposition of the reference laser light from the CW oscillation reference laser light source 706 and part of the first semiconductor laser light outputted from the first semiconductor laser 111 to be incident on the optical intensity sensor 720.

7.2.2 Operation

The first spectrum monitor 166 shown in FIG. 65, specifically, the optical intensity sensor 720 is configured to measure a change in the optical intensity of the light that is a result of superposition of the reference laser light outputted from the CW oscillation reference laser light source 706 and part of the laser light outputted from the first semiconductor laser 111.

The spectrum analyzer 704 is configured to analyze a beat signal detected with the optical intensity sensor 720 to allow measurement of the difference in frequency between the laser light from the first semiconductor laser 111 and the reference laser light and the optical intensities thereof. The frequency difference allows determination of the wavelength difference.

The beat signal is expressed by Expression (13) below.

[Expression 13]

$$I_{PD} = R \cdot [P_C + P_Q + 2\sqrt{P_C \cdot P_Q} \cdot \cos\{2\pi(f_c - f_q)t\}] \quad (13)$$

$I_{PD}$: Sensor output signal (beat signal)
R: Reception sensitivity
t: Time
$P_C$: Optical intensity of light from reference light source
$P_Q$: Optical intensity of detected light
$f_c$: Frequency of light from reference light source
$f_q$: Frequency of detected light To measure the spectral linewidth resulting from the chirping, fast Fourier transform (FFT) may be performed on the beam signal to determine the spectral linewidth $\Delta\lambda 1ch$.

In addition to the first spectrum monitor 166, the same configuration as that shown in FIG. 65 may be applied to the configuration of the second spectrum monitor 266 (see FIG. 20).

8. Example of Excimer Amplifier

8.1 Multi-Path Amplification Form

Figure 66:
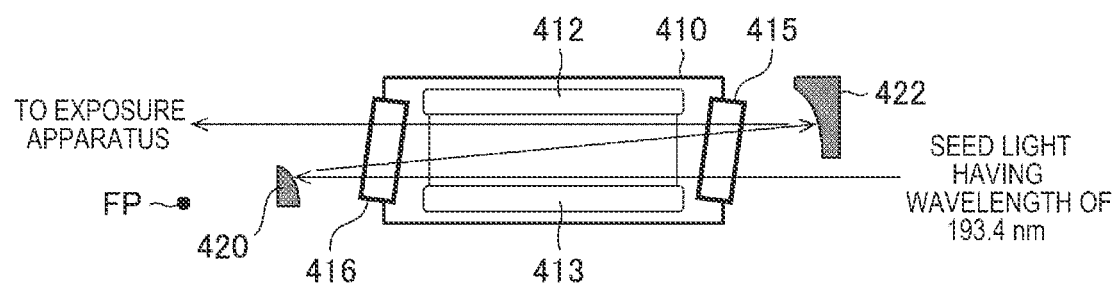
FIG. 66 schematically shows an example of the configuration of an excimer amplifier.

FIG. 66 schematically shows an example of the configuration of the excimer amplifier 14. The excimer amplifier 14 shown in FIG. 66 is an example of the amplification performed by causing seed light having the wavelength of 193.4 nm to pass three times through the discharge space between a pair of discharge electrodes 412 and 413. The seed light having the wavelength of 193.4 nm is the pulsed laser light LP2 outputted from the solid-state laser system 10.

In FIG. 66, the excimer amplifier 14 includes a convex mirror 420 and a concave mirror 422 disposed in the optical path of the seed light outside the chamber 410. The convex mirror 420 and the concave mirror 422 are so disposed that focal point positions FP thereof substantially coincide with each other.

The seed light having entered the excimer amplifier 14 and having the wavelength of 193.4 nm is reflected off the convex mirror 420 and the concave mirror 422 and passes three times through the discharge space between the pair of discharge electrodes 412 and 413. The beam of the seed light is therefore enlarged and amplified, and the resultant seed light is outputted toward the exposure apparatus 20.

8.2 Ring Resonator Amplification Form

Figure 67:
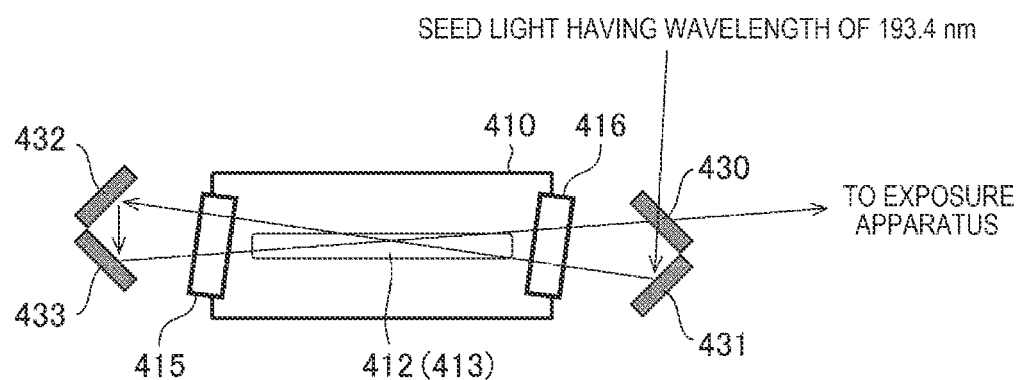
FIG. 67 schematically shows an example of the configuration of the excimer amplifier employing a ring resonator.

FIG. 67 shows an example in which a ring resonator is employed as the excimer amplifier 14. The ring resonator includes an output coupling mirror 430 and high reflectance mirrors 431 to 433. The excimer amplifier 14 may further include a high reflectance mirror that is not shown but is configured to guide the seed light having the wavelength of 193.4 nm to the ring resonator or may further include a high reflectance mirror that is not shown but is configured to guide the pulsed laser light outputted from the ring resonator to the exposure apparatus 20.

The chamber 410 is provided with the windows 415 and 416. The pair of discharge electrodes 412 and 413 are disposed in the chamber 410. The pair of discharge electrodes 412 and 413 are so disposed as to face each other in the direction perpendicular to the plane of sheet in FIG. 67. The discharge direction is the direction perpendicular to the plane of sheet.

In the excimer amplifier 14, the seed light repeatedly travels in the order of the output coupling mirror 430, the high reflectance mirror 431, the discharge space between the pair of discharge electrodes 412 and 413, the high reflection mirror 432, the high reflection mirror 433, and the discharge space between the pair of discharge electrodes 412 and 413. The seed light is thus amplified.

9. Example of Spectrum Monitor Using Etalon Spectrometer

Figure 68:
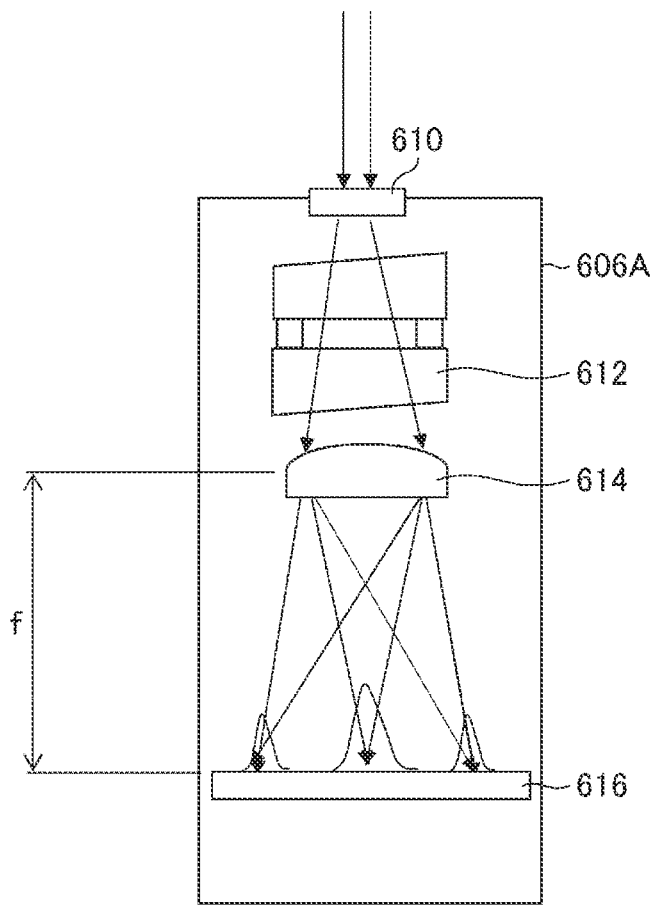
FIG. 68 schematically shows an example of the configuration of a spectrum monitor using an etalon spectrometer.

FIG. 68 schematically shows an example of the configuration of a spectrum monitor using an etalon spectrometer. An etalon spectrometer 606A shown in FIG. 68 can be used in the spectrum monitor 606 (see FIG. 20) configured to measure the spectrum of the excimer laser light.

The etalon spectrometer 606A includes a diffuser 610, an etalon 612, a light collection lens 614, and an image sensor 616, as shown in FIG. 68. The image sensor 616 may, for example, be a one-dimensional or two-dimensional photodiode array.

The laser light first enters the diffuser 610. The diffuser 610 may be a transmissive optical element having a large number of irregularities on the surface. The diffuser 610 is configured to diffuse the laser light having entered the diffuser 610 and transmit the laser light in the form of scattered light. The scattered light enters the etalon 612. The etalon 612 may be an air-gap etalon including two partially reflective mirrors each having predetermined reflectance. The air-gap etalon has a configuration in which the two partially reflective mirrors face each other with an air gap having a predetermined distance therebetween and are bonded to each other via a spacer.

Light that does not travel back and forth between the two partially reflective mirrors but passes through the etalon 612 and light that travels back and forth once between the two partially reflective mirrors and then passes through the etalon 612 differ from each other in terms of optical path difference in accordance with an angle of incidence θ of the light incident on the etalon 612. When the optical path difference is an integer multiple of the wavelength, the light incident on the etalon 612 passes through the etalon 612 at high transmittance.

The light having passed through the etalon 612 enters the light collection lens 614. The laser light having passed through the light collection lens 614 is incident on the image sensor 616 disposed in a position separate from the light collection lens 614 and corresponding to a focal length f of the light collection lens 614. That is, the light having passed through and having therefore been collected by the light collection lens 614 forms interference fringes in the focal plane of the light collection lens 614.

The image sensor 616 is disposed in the focal plane of the light collection lens 614. The image sensor 616 is configured to receive the light having passed through the light collection lens 614 and detect the interference fringes. The square of the radius of each of the interference fringes can be proportional to the wavelength of the laser light. The spectral linewidth (spectrum profile) and the center wavelength of the entire laser light are therefore detected from the detected interference fringes.

The spectral linewidth and the center wavelength may be determined by an information processing apparatus that is not shown or the laser control section 18 from the detected interference fringes.

Figure 69:
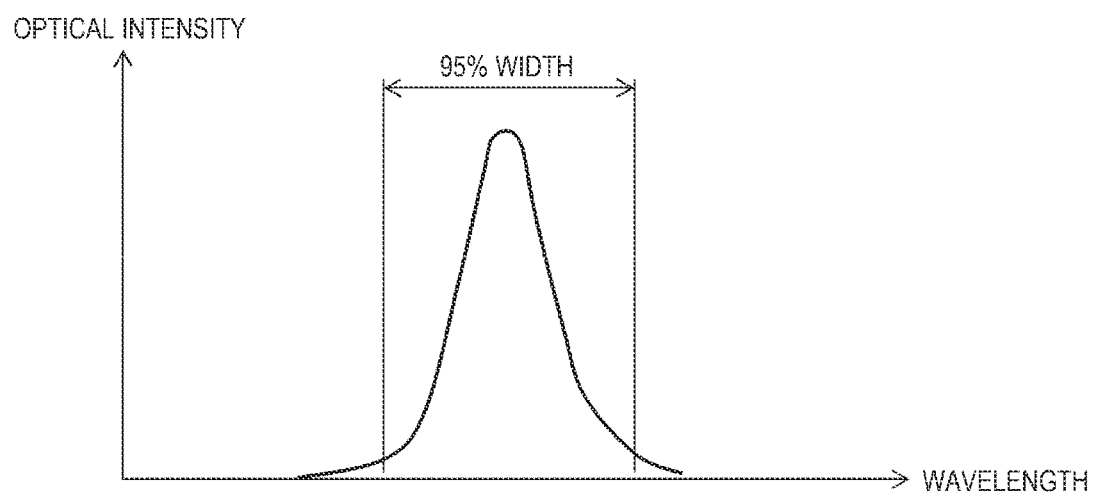
FIG. 69 shows an example of the spectrum of laser light.

An approximate relationship between a radius r of any of the interference fringes and a wavelength λ is expressed by Expression (14) below.

$$\text{Wavelength } \lambda = \lambda c + \alpha \cdot r^2 \quad (14)$$

α: Proportional constant r: Radius of interference fringe

λc: Wavelength in a case where optical intensity at center of interference fringes is maximized After conversion into a spectrum waveform showing the relationship between the optical intensity and the wavelength by using Expression (14), the spectral linewidth Δλ may be calculated, as shown in FIG. 69. The spectral linewidth Δλ may be a width containing 95% of the entire energy (E95).

10. Example of CW Oscillation Reference Laser Light Source

Figure 70:
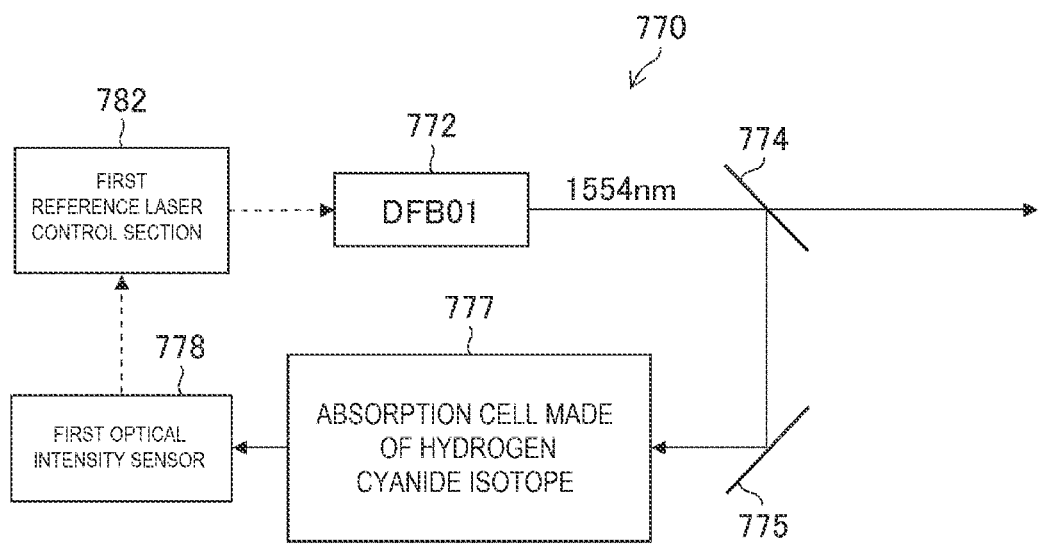
FIG. 70 is a block diagram showing an example of a CW oscillation reference laser light source.

10.1 CW Oscillation Reference Laser Light Source Configured to Emit Light that Belongs to 1547.2-Nm Wavelength Region or 1554-Nm Wavelength Region FIG. 70 is a block diagram showing an example of the CW oscillation reference laser light source. A CW oscillation reference laser light source 770 includes a first reference semiconductor laser 772, a beam splitter 774, a high reflectance mirror 775, an absorption cell 777 made of a hydrogen cyanide isotope, a first optical intensity sensor 778, and a first reference laser control section 782.

The first reference semiconductor laser 772 operates in CW oscillation and emits laser light that belongs to a 1554-nm wavelength region. The laser light reflected off the beam splitter 774 enters the absorption cell 777 made of a hydrogen cyanide isotope via the high reflectance mirror 775.

The absorption cell 777 contains an isotopic hydrogen cyanide gas. A specific absorption line of the hydrogen cyanide isotope may, for example, be a 1553.756-nm absorption line.

An acetylene isotopic absorption cell may instead be used as the absorption cell configured to absorb light that belongs to the wavelength region. That is, an absorption cell containing an isotopic acetylene gas may be employed in place of the absorption cell 777 made of a hydrogen cyanide isotope.

The laser light having passed through the absorption cell 777 made of a hydrogen cyanide isotope is received by the first optical intensity sensor 778.

The first reference laser control section 782 is configured to control the oscillation wavelength of the first reference semiconductor laser 772 based on a detected signal from the first optical intensity sensor 778 in such a way that the absorption line of the absorption cell 777 made of a hydrogen cyanide isotope coincides with the wavelength of the laser light from the first reference semiconductor laser 772.

The CW oscillation reference laser light source 770 can be used as the CW oscillation reference laser light source 706 for the first spectrum monitor 166 shown in FIGS. 20, 47, and 62.

Figure 71:
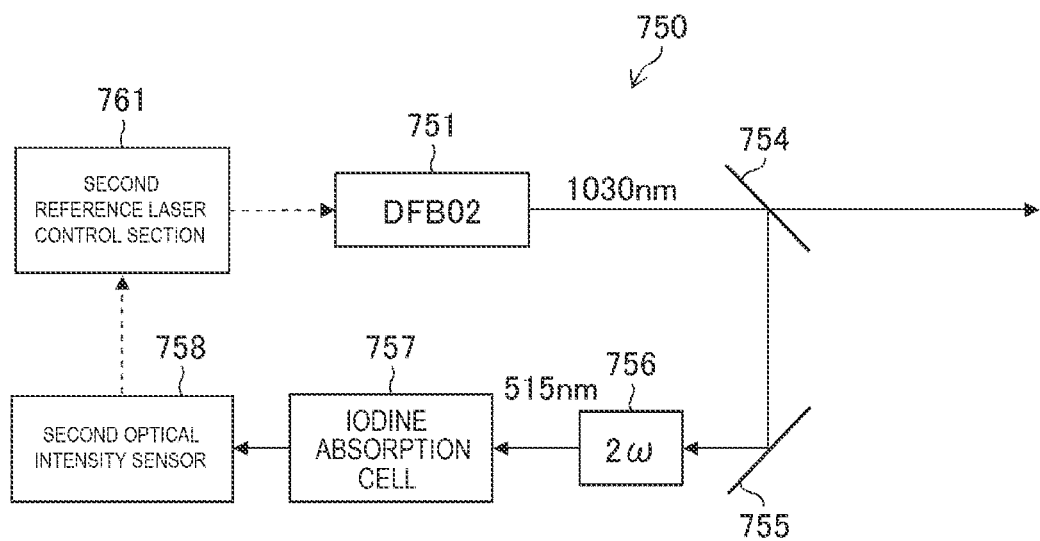
FIG. 71 is a block diagram showing another example of the CW oscillation reference laser light source.

10.2 CW Oscillation Reference Laser Light Source Configured to Emit Light that Belongs to 1030-Nm Wavelength Region FIG. 71 is a block diagram showing another example of the CW oscillation reference laser light source. A CW oscillation reference laser light source 750 includes a second reference semiconductor laser 751, a beam splitter 754, a high reflectance mirror 755, a nonlinear crystal 756, an iodine absorption cell 757, a second optical intensity sensor 758, and a second reference laser control section 761.

The second reference semiconductor laser 751 operates in CW oscillation and emits laser light that belongs to a 1030-nm wavelength region. The laser light reflected off the beam splitter 754 enters the nonlinear crystal 756 via the high reflectance mirror 755. The nonlinear crystal 756 produces second harmonic light that forms laser light having a wavelength of about 515 nm. The laser light having the wavelength of about 515 nm enters the iodine absorption cell 757.

The iodine absorption cell 757 contains an iodine gas. A specific iodine absorption line of the iodine absorption cell 757 may, for example, be a 514.581-nm absorption line. The laser light having passed through the iodine absorption cell 757 is received by the second optical intensity sensor 758.

The second reference laser control section 761 is configured to control the oscillation wavelength of the second reference semiconductor laser 751 based on a detected signal from the second optical intensity sensor 758 in such a way that the absorption line of the iodine absorption cell 757 coincides with the wavelength of the second harmonic light.

The CW oscillation reference laser light source 750 can be used as the CW oscillation reference laser light source for the second spectrum monitor 266 shown in FIG. 62.

11. Example of Semiconductor Optical Amplifiers

11.1 Configuration

Figure 72:
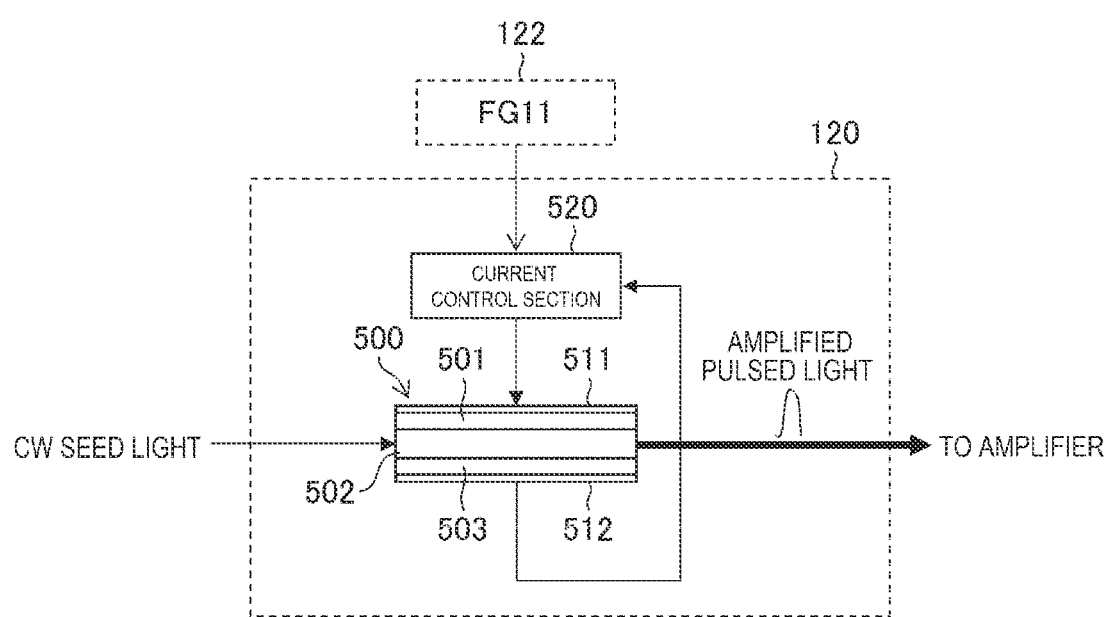
FIG. 72 schematically shows an example of the configuration of a semiconductor optical amplifier.

FIG. 72 schematically shows an example of the configuration of any of the semiconductor optical amplifiers. The description will be made with reference to the first semiconductor optical amplifier 120, and the same configuration in FIG. 72 is applicable also to other semiconductor optical amplifiers, such as the semiconductor optical amplifier 124 in FIG. 45 and the second semiconductor optical amplifier 220 in FIG. 62.

The first semiconductor optical amplifier 120 includes a semiconductor element 500 and a current control section 520. The semiconductor element 500 includes a P-type semiconductor electrode 501, an active layer 502, an N-type semiconductor element 503, a first electrode 511, and a second electrode 512. The current control section 520 is connected to the first electrode 511 and the second electrode 512.

11.2 Operation

When current is caused to flow from the first electrode 511 to the second electrode 512, the active layer 502 is excited. When the seed light enters the excited active layer 502 and passes therethrough, the seed light is amplified.

When pulse current is caused to flow through the active layer 502 in the state in which the CW seed light has entered the active layer 502, the seed light having passed through the active layer 502 is outputted as pulsed laser light.

As a result, when, for example, the current control section 520 controls based on an electric signal from the function generator 122 the value of the current flowing through the semiconductor element 500, the optical intensity of the seed light is amplified to a value according to the current value.

The first semiconductor optical amplifier 120 in FIG. 20 and the second semiconductor optical amplifier 220 in FIG. 62, when pulse current flows therethrough, each amplify the CW seed light into pulsed light.

The seed light may instead be amplified by performing modulation control on the current, as in the case of the semiconductor optical amplifier 124 shown in FIG. 45.

12. Fourth Embodiment

12.1 Configuration

Figure 73:
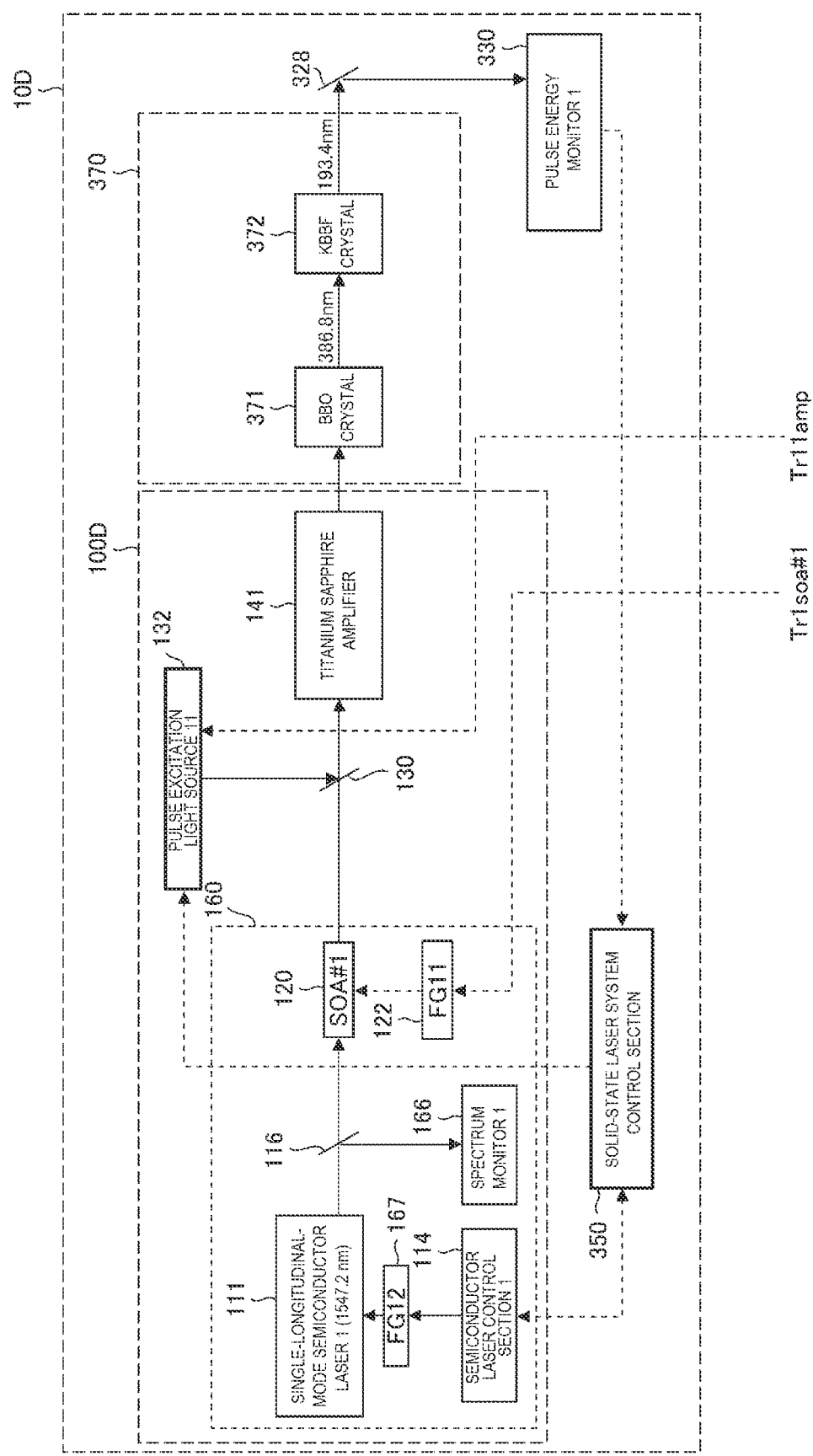
FIG. 73 schematically shows an example of a laser system according to a fourth embodiment.

FIG. 73 schematically shows an example of a laser system according to a fourth embodiment. FIG. 73 shows only part of a solid-state laser system 10D. In place of the solid-state laser system 10 according to the first and second embodiments described with reference to FIG. 20, the solid-state laser system 10D shown in FIG. 73 may be used. Differences from FIG. 20 will be described.

The solid-state laser system 10D shown in FIG. 73 includes a first solid-state laser apparatus 100D and a wavelength conversion system 370 in place of the first solid-state laser apparatus 100 and the wavelength conversion system 300 in FIG. 20.

The solid-state laser system 10D is configured to output pulsed laser light having a wavelength of about 773.6 nm from the first solid-state laser apparatus 100D, and the wavelength conversion system 370 is configured to convert the pulsed laser light into fourth harmonic light (fourfold harmonic light) to produce pulsed laser light having the wavelength of about 193.4 nm.

The configuration of the first solid-state laser apparatus 100D is the same as that of the first solid-state laser apparatus 100 in FIG. 20. It is, however, noted that the solid-state laser apparatus 100 in FIG. 20 differs from the solid-state laser apparatus 100D shown in FIG. 73 in that the oscillation wavelength is about 1547.2 nm in the former case and the oscillation wavelength is about 773.6 nm in the latter case.

Further, in the first solid-state laser apparatus 100D, the Er fiber amplifier 140 in FIG. 20 is changed to a titanium sapphire amplifier 141, and a laser apparatus configured to output pulsed laser light that is second harmonic light from a YFL laser is used as the first pulse excitation light source 132. The titanium sapphire amplifier 141 includes a titanium sapphire crystal as a gain medium. YFL (yttrium lithium fluoride) is a solid-state laser crystal expressed by a chemical formula $LiYF_4$.

The wavelength conversion system 370 contains a plurality of nonlinear crystals and is configured to convert the wavelength of the incident pulsed laser light and output fourth harmonic pulsed laser light. For example, the wavelength conversion system 370 contains a BBO crystal 371 and a KBBF crystal 372. "BBO" is expressed by a chemical formula $beta\text{-}BaB_2O_4$. "KBBF" is expressed by a chemical formula $KBe_2BO_3F_2$.

12.2 Operation

The pulsed laser light outputted from the first solid-state laser apparatus 100D enters the BBO crystal 371 in the wavelength conversion system 370. The BBO crystal 371 is configured to convert the pulsed laser light having the wavelength of about 773.6 nm into pulsed laser light having a wavelength of about 386.8 nm, which is second harmonic light.

The KBBF crystal 372 is configured to convert the pulsed laser light outputted from the BBO crystal 371 and having the wavelength of about 386.8 nm into pulsed laser light having the wavelength of about 193.4 nm, which is second harmonic light.

The pulsed laser light outputted from the wavelength conversion system 370 is outputted from the solid-state laser system 10D via the beam splitter 328. Methods for controlling the center wavelength and the spectral linewidth can be any of the methods described in the first and third embodiments.

When the range over which the wavelength of the pulsed laser light outputted from the laser system including the solid-state laser system 10D can be changed ranges, for example, from 193.2 nm to 193.5 nm, the wavelength of the light from the first semiconductor laser 111 can be changed over a range from 772.8 nm to 774.0 nm.

In the fourth embodiment, the titanium sapphire amplifier 141 is an example of the "first amplifier" in the present disclosure.

13. Fifth Embodiment

13.1 Configuration

The configuration of a laser system according to a fifth embodiment may be the same as that in the first embodiment shown in FIG. 20.

13.2 Operation

A laser system 1 according to the fifth embodiment is configured to further perform, in addition to the operation described in the first embodiment, detection of the excimer light amplified by the excimer amplifier 14 with the spectrum monitor 606 and perform feedback control on the solid-state laser system 10 based on the spectral linewidth of the excimer light.

Figure 74:
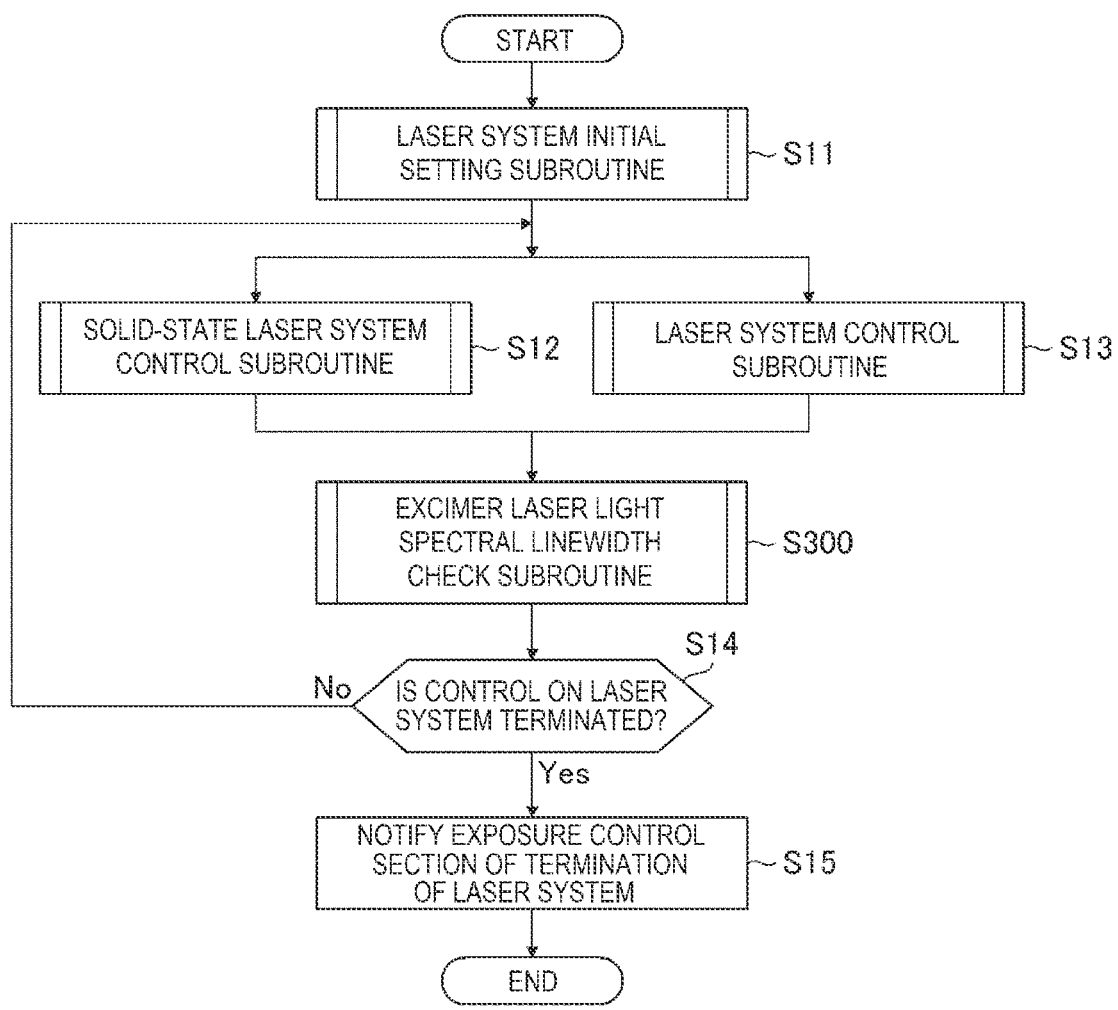
FIG. 74 is a flowchart showing an example of processes carried out by a laser control section in a fifth embodiment.

FIG. 74 is a flowchart showing an example of processes carried out by the laser control section 18. Differences in the flowchart between FIG. 74 and FIG. 8 will be described.

The flowchart of FIG. 74 includes step S300 after steps S12 and S13. In step S300, the laser control section 18 carries out an excimer laser light spectral linewidth check subroutine and proceeds to step S14 after step S300.

Figure 75:
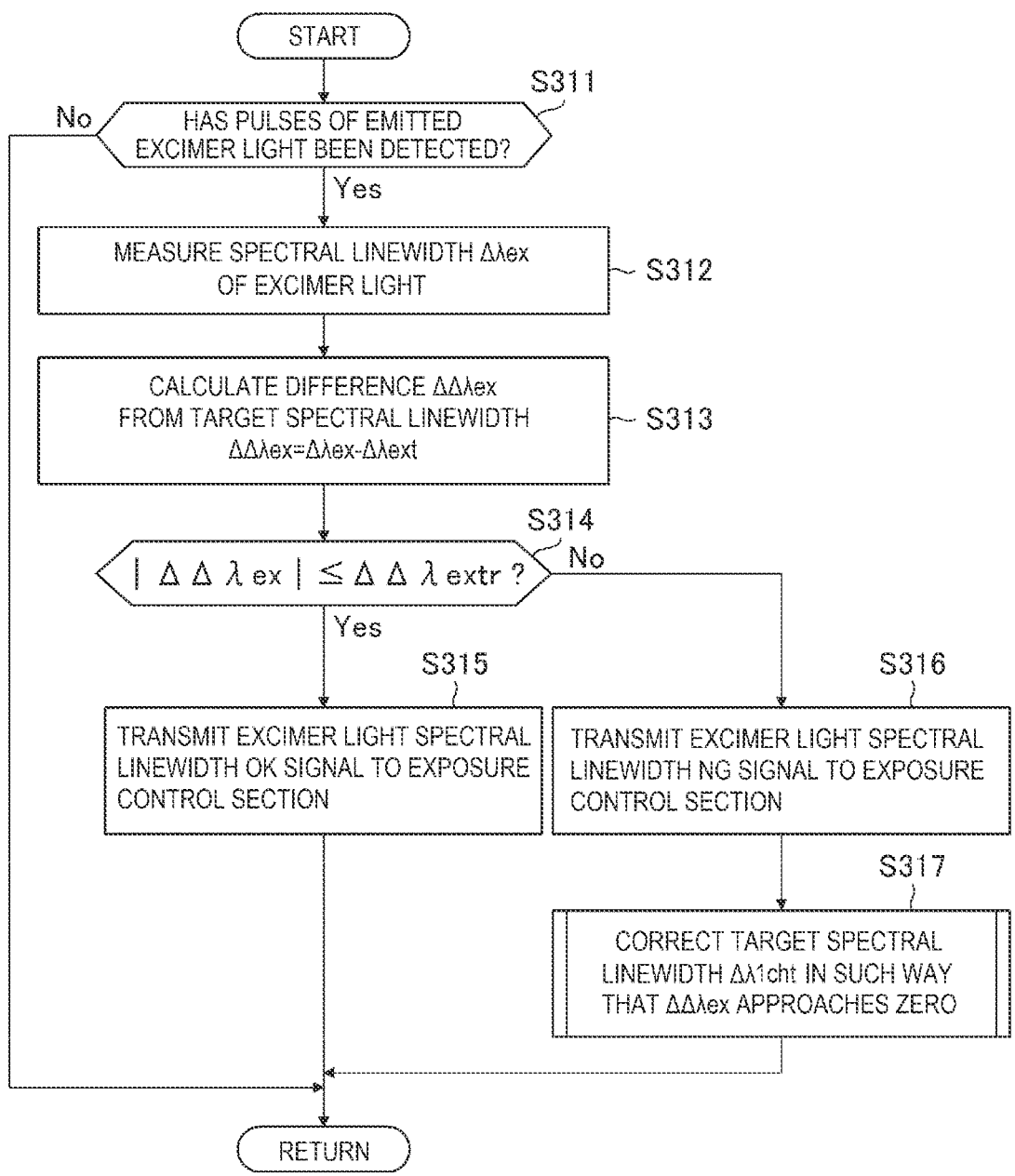
FIG. 75 is a flowchart showing an example of an excimer laser light spectral linewidth check subroutine.

FIG. 75 is a flowchart showing an example of the excimer laser light spectral linewidth check subroutine. The flowchart of FIG. 75 is applied to step S300 in FIG. 74.

In step S311 in FIG. 75, the laser control section 18 evaluates whether or not the pulses of the emitted excimer light have been detected by the spectrum monitor 606.

When the result of the evaluation in step S311 is Yes, the laser control section 18 proceeds to step S312, where the spectrum monitor 606 measures a spectral linewidth $\Delta\lambda ex$ of the excimer light. For example, the laser control section 18 measures as the spectral linewidth $\Delta\lambda ex$ the 95%-width of the entire energy from the spectrum shape detected by the spectrum monitor 606.

In step S313, the laser control section 18 calculates a difference $\Delta\Delta\lambda ex$ between the measured spectral linewidth $\Delta\lambda ex$ and a target spectral linewidth $\Delta\lambda ext$.

$$\Delta\Delta\lambda ex = \Delta\lambda ex - \Delta\lambda ext \qquad (15)$$

The target spectral linewidth $\Delta\lambda ext$ may be the target spectral linewidth $\Delta\lambda t$ instructed by the exposure control section 22.

Thereafter, in step S314, the laser control section 18 evaluates whether or not the absolute value of $\Delta\Delta\lambda ex$ is smaller than or equal to an acceptable upper limit $\Delta\Delta\lambda extr$ representing an acceptable range. When the result of the evaluation in step S314 is Yes, the laser control section 18 proceeds to step S315.

In step S315, the laser control section 18 transmits an excimer light spectral linewidth OK signal to the exposure control section 22.

On the other hand, when the result of the evaluation in step S314 is No, the laser control section 18 proceeds to step S316. In step S316, the laser control section 18 transmits an excimer light spectral linewidth NG signal to the exposure control section 22.

After step S316, the laser control section 18 proceeds to step S317 and carries out the process of correcting the target spectral linewidth $\Delta\lambda 1cht$ in such a way that $\Delta\lambda ex$ approaches zero.

Figure 76:
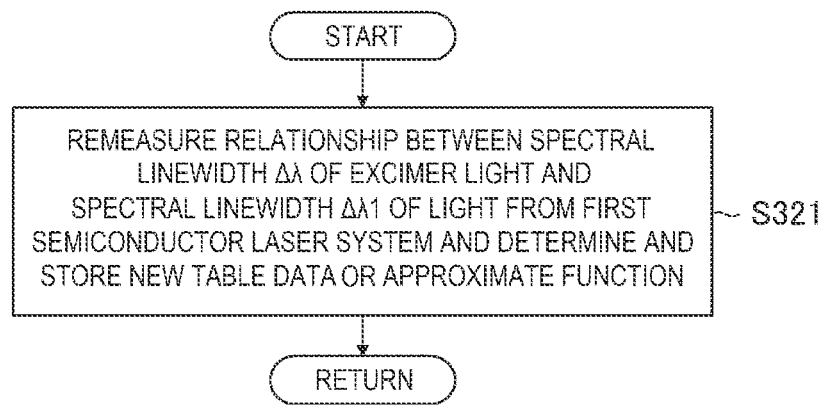
FIG. 76 is a flowchart showing an example of the process of correcting the target spectral linewidth $\Delta\lambda 1cht$ in such a way that $\Delta\Delta\lambda ex$ approaches zero.

FIG. 76 is a flowchart showing an example of the process of correcting the target spectral linewidth $\Delta\lambda 1cht$ in such a way that $\Delta\Delta\lambda ex$ approaches zero. The flowchart of FIG. 76 is applied to step S317 in FIG. 75.

In step S321 in FIG. 76, the laser control section 18 remeasures the relationship between a spectral linewidth $\Delta\lambda$ of the excimer light and a spectral linewidth $\Delta\lambda 1$ of the light from the first semiconductor laser system 160, determines new table data or an approximate function, and stores data on the correlation. This means that the relationship data described with reference to FIG. 27 is corrected into updated new relationship data.

When $\Delta\Delta\lambda ex$ exceeds the acceptable range, it is believed that the spectral linewidth $\Delta\lambda$ of the excimer light deviate from the spectral linewidth $\Delta\lambda 1$ of the light from the first semiconductor laser system 160. Therefore, the laser control section 18 is configured to change the spectral linewidth $\Delta\lambda cht$ of the light from the first semiconductor laser 111 at predetermined intervals to update the table data or approximate curve representing the relationship between the spectral linewidth $\Delta\lambda$ of the excimer light and the spectral linewidth $\Delta\lambda 1$ of the light from the first semiconductor laser system 160 based on the excimer light spectral linewidths $\Delta\lambda ex$ measured by the spectrum monitor 606.

After step S321, the laser control section 18 terminates the flowchart of FIG. 76 and returns to the flowchart of FIG. 75.

After step S315 or S117 in FIG. 75, the laser control section 18 terminates the flowchart of FIG. 75 and returns to the flowchart of FIG. 74. When the result of the evaluation in step S311 in FIG. 75 is No, the laser control section 18 skips steps S312 to S317, terminates the flowchart of FIG. 75, and returns to the flowchart of FIG. 74.

13.3 Effects and Advantages

According to the fifth embodiment, the spectral linewidth of the excimer light can be further precisely controlled in addition to the same effects as those provided in the first embodiment.

14. Method for Manufacturing Electronic Device

Figure 77:
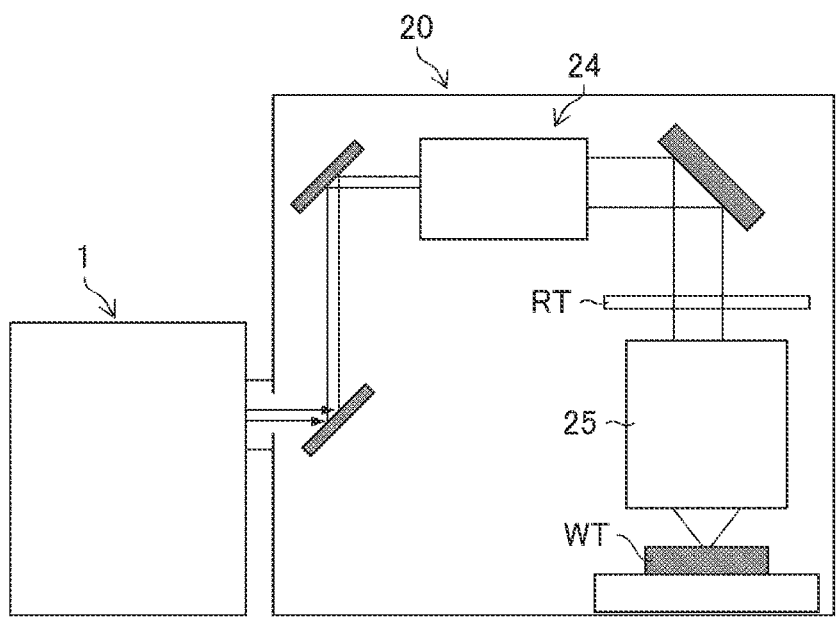
FIG. 77 schematically shows an example of the configuration of an exposure apparatus.

FIG. 77 schematically shows an example of the configuration of the exposure apparatus 20. In FIG. 77, the exposure apparatus 20 includes an illumination optical system 24 and a projection optical system 25. The illumination optical system 24 is configured to illuminate a reticle pattern on a reticle stage RT with the laser light incident from the laser system 1. The projection optical system 25 is configured to perform reduction projection on the laser light having passed through the reticle to cause the laser light to be brought into focus on a workpiece that is not shown but is placed on a workpiece table WT. The workpiece is a light sensitive substrate onto which a photoresist has been applied, such as a semiconductor wafer. The exposure apparatus 20 is configured to translate the reticle stage RT and the workpiece table WT in synchronization with each other to expose the workpiece to the laser light having reflected the reticle pattern. A semiconductor device can be manufactured by transferring a device pattern onto the semiconductor wafer in the exposure step described above. The laser system 1 may be any of the laser systems 1A to 1C described in the embodiments.

15. Other Examples of External Apparatus

The exposure apparatus 20 used for semiconductor manufacture has been described as an embodiment of the external apparatus, but not necessarily, and the following external apparatuses, for example, are conceivable.

[1] A laser processing apparatus configured to irradiate a processing receiving material with laser light to process the material.

[2] A laser annealing apparatus configured to irradiate a semiconductor material with pulsed laser light to perform laser annealing.

[3] A laser doping apparatus configured to irradiate a semiconductor material with pulsed laser light to perform laser doping.

[4] A laser irradiation processing apparatus configured to irradiate a process receiving material with laser light to process the surface of the material.

16. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims.

Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser system comprising:
   a first semiconductor laser system configured to output first pulsed laser light and including,
      a first semiconductor laser configured to oscillate in a single longitudinal mode,
      a first current controller configured to control current caused to flow through the first semiconductor laser in such a way that first laser light outputted from the first semiconductor laser is caused to undergo chirping, and
      a first semiconductor optical amplifier configured to amplify the first laser light into first pulsed laser light;
   a first amplifier configured to amplify the first pulsed laser light amplified by the first semiconductor optical amplifier and outputted from the first semiconductor laser system;

a wavelength conversion system configured to convert in terms of a wavelength second pulsed laser light amplified by the first amplifier into third pulsed laser light of ultraviolet light;
an excimer amplifier configured to amplify the third pulsed laser light; and
a control section configured to control an amount of chirping performed on the first pulsed laser light outputted from the first semiconductor laser system in such a way that excimer laser light having a target spectral linewidth instructed by an external apparatus is achieved.

2. The laser system according to claim 1,
wherein the first semiconductor laser is a distributed feedback semiconductor laser.

3. The laser system according to claim 2,
wherein the first current controller is so configured to control an AC component and a DC component of the current caused to flow through the first semiconductor laser, and
the control section is configured to control the AC component of the current caused to flow through the first semiconductor laser via the first current controller in such a way that the excimer laser light having the target spectral linewidth instructed by the external apparatus is achieved.

4. The laser system according to claim 3,
further comprising a first spectrum monitor configured receive part of the first laser light to detect a spectral linewidth of the first laser light,
wherein the control section is configured to control a value of a current control parameter that is the AC component based on the spectral linewidth detected by the first spectrum monitor.

5. The laser system according to claim 4,
further comprising a spectrum monitor configured to receive part of the excimer laser light, which is pulsed laser light amplified by the excimer amplifier, to detect a spectral linewidth of the excimer laser light,
wherein the control section is configured to control the value of the current control parameter that is the AC component based on the spectral linewidth of the excimer laser light detected by the spectrum monitor.

6. The laser system according to claim 3,
wherein a pulse width of current caused to flow through the first semiconductor optical amplifier is an integer multiple of a cycle of the AC component of the current caused to flow through the first semiconductor laser, the integer being greater than or equal to one.

7. The laser system according to claim 3, further comprising
a synchronization system configured to cause discharge in the excimer amplifier at a timing when the third pulsed laser light outputted from the wavelength conversion system enters the excimer amplifier in accordance with a light emission trigger signal inputted from the external apparatus.

8. The laser system according to claim 7,
wherein the synchronization system is configured to control a discharge timing of the excimer amplifier in synchronization with not only the light emission trigger signal but a timing of pulse current flowing through the first semiconductor optical amplifier.

9. The laser system according to claim 2,
wherein the first current controller is configured to control the pulse current caused to flow through the first semiconductor laser, and the control section is configured to control a pulse current value of the pulse current caused to flow through the first semiconductor laser via the first current controller in such a way that the excimer laser light having the target spectral linewidth instructed by the external apparatus is achieved.

10. The laser system according to claim 9,
wherein the first semiconductor optical amplifier is configured to amplify part of the first laser light, which is the pulsed laser light outputted from the first semiconductor laser, into pulsed laser light, and
the control section is configured to control at least one of a start timing of amplification performed by the first semiconductor optical amplifier and a temporal width of the amplified pulses.

11. The laser system according to claim 9, further comprising
an optical shutter configured to control passage of the first pulsed laser light amplified by the first semiconductor optical amplifier; and
a reference clock generator configured to operate both the first semiconductor laser and the first semiconductor optical amplifier.

12. The laser system according to claim 11,
wherein the first semiconductor laser and the first semiconductor optical amplifier are configured to allow pulse current to flow therethrough in synchronization with a reference clock signal outputted from the reference clock generator.

13. The laser system according to claim 11,
further comprising a synchronization system configured to cause discharge in the excimer amplifier at a timing when the third pulsed laser light outputted from the wavelength conversion system enters the excimer amplifier in accordance with a light emission trigger signal inputted from the external apparatus,
wherein the synchronization system is configured to control an open/close timing of the optical shutter and a discharge timing of the excimer amplifier in synchronization with a timing when a current trigger signal is inputted to the first semiconductor optical amplifier after the light emission trigger signal is inputted.

14. The laser system according to claim 13,
wherein a frequency of a reference clock signal used in the synchronization system is higher than or equal to a maximum frequency of the light emission trigger signal.

15. The laser system according to claim 13,
wherein a frequency of a reference clock signal used in the synchronization system is higher than or equal to ten times a maximum frequency of the light emission trigger signal.

16. The laser system according to claim 13,
wherein a frequency of a reference clock signal used in the synchronization system is higher than or equal to one hundred times a maximum frequency of the light emission trigger signal.

17. The laser system according to claim 1, further comprising:
a second semiconductor laser system including,
a second semiconductor laser configured to oscillate in a single longitudinal mode,
a second current controller configured to control current caused to flow through the second semiconductor laser in such a way that second laser light outputted from the second semiconductor laser is caused to undergo chirping, and a second semiconductor optical amplifier configured to amplify the second laser light into fourth pulsed laser light;

a second amplifier configured to amplify the fourth pulsed laser light outputted from the second semiconductor laser system; and a solid-state amplifier configured to amplify fifth pulsed laser light amplified by the second amplifier, wherein sixth pulsed laser light amplified by the solid-state amplifier enters the wavelength conversion system.

18. The laser system according to claim 17, wherein the wavelength conversion system includes a nonlinear crystal and is configured to generate the third pulsed laser light from the second pulsed laser light and the sixth pulsed laser light.

19. The laser system according to claim 1, wherein the first semiconductor laser system further includes a third semiconductor optical amplifier disposed in an optical path between the first semiconductor laser and the first semiconductor optical amplifier, and the control section is configured to control current caused to flow through the third semiconductor optical amplifier in such a way that a spectrum shape of the laser light that enters the first semiconductor optical amplifier is symmetric with respect to a center wavelength.

20. A method for manufacturing an electronic device, the method comprising:

causing a laser system to generate excimer laser light, the laser system including a first semiconductor laser system including a first semiconductor laser configured to oscillate in a single longitudinal mode, a first current controller configured to control current caused to flow through the first semiconductor laser in such a way that first laser light outputted from the first semiconductor laser is caused to undergo chirping, and a first semiconductor optical amplifier configured to amplify the first laser light into first pulsed laser light, a first amplifier configured to amplify the first pulsed laser light amplified by the first semiconductor optical amplifier and outputted from the first semiconductor laser system, a wavelength conversion system configured to convert in terms of a wavelength second pulsed laser light amplified by the first amplifier into third pulsed laser light of ultraviolet light, an excimer amplifier configured to amplify the third pulsed laser light, and a control section configured to control an amount of chirping performed on the first pulsed laser light outputted from the first semiconductor laser system in such a way that excimer laser light having a target spectral linewidth instructed by an external apparatus is achieved;

outputting the excimer laser light to an exposure apparatus; and exposing a light sensitive substrate to the excimer laser light in the exposure apparatus to manufacture the electronic device.

* * * * *